United States Patent [19]

Nakamura et al.

[11] Patent Number: 5,706,241
[45] Date of Patent: Jan. 6, 1998

[54] EEPROM SEMICONDUCTOR MEMORY DEVICE INCLUDING CIRCUIT FOR GENERATING A VOLTAGE HIGHER THAN A POWER SUPPLY VOLTAGE

[75] Inventors: Hiroshi Nakamura, Kawasaki; Toru Tanzawa, Ebina, both of Japan

[73] Assignee: Kabushiki Kaisha Toshiba, Kawasaki, Japan

[21] Appl. No.: 616,428

[22] Filed: Mar. 15, 1996

[30] Foreign Application Priority Data

Mar. 15, 1995 [JP] Japan .................................. 7-056218

[51] Int. Cl.⁶ ........................................................ G11C 8/00
[52] U.S. Cl. .................... 365/226; 365/227; 365/185.01; 365/185.17
[58] Field of Search ........................... 365/226, 227, 365/185.01, 185.17

[56] References Cited

FOREIGN PATENT DOCUMENTS

| | | |
|---|---|---|
| 59-229792 | 12/1984 | Japan . |
| 60-117498 | 6/1985 | Japan . |
| 2-228714 | 9/1990 | Japan . |

OTHER PUBLICATIONS

"On–Chip High–Voltage Generation in MNOS Integrated Circuits Using an Improved Voltage Multiplier Technique", IEEE Journal of Solid–State Circuits, vol. SC-11, No. 3, John F. Dickson, pp. 374, 376, 378, Jun. 1976.

Primary Examiner—David C. Nelms
Assistant Examiner—F. Niranjan
Attorney, Agent, or Firm—Oblon, Spivak, McClelland, Maier & Neustadt, P.C.

[57] ABSTRACT

A semiconductor memory device comprising a memory cell array of a plurality of memory cells formed and arranged on either a semiconductor substrate or a well of a first conductivity type formed on said semiconductor substrate, a plurality of voltage generating circuits for applying said memory cells voltages that are higher than the power supply voltage and different from each other and a switching circuit for selectively connecting the output nodes of said plurality of voltage generating circuits.

70 Claims, 44 Drawing Sheets

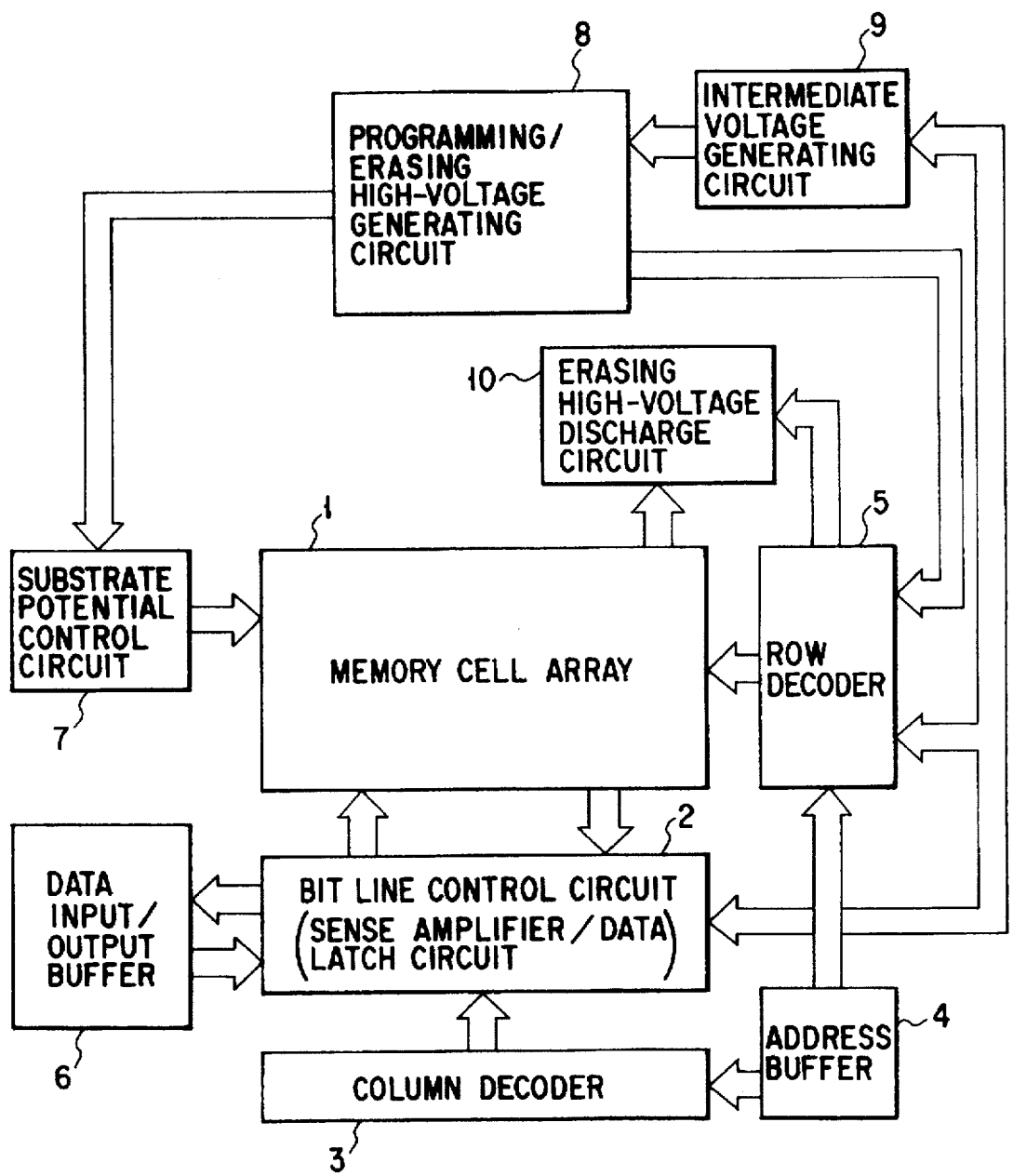
F I G. 3

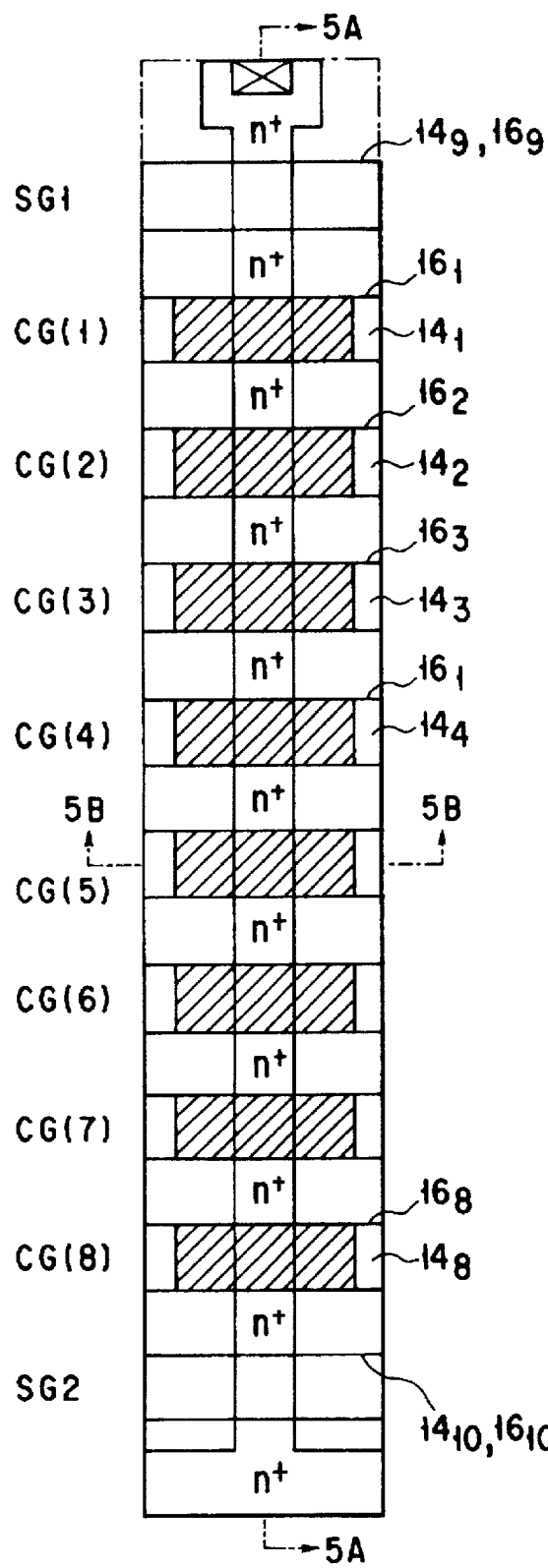 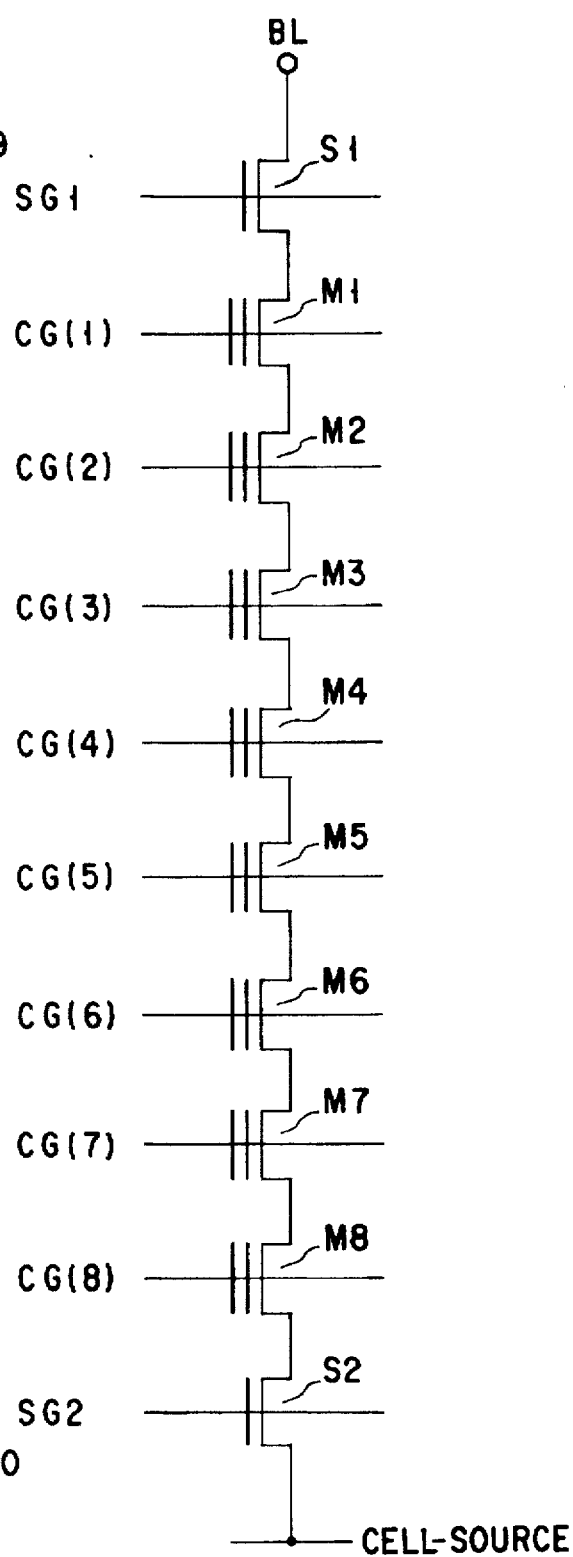
F I G. 4A    F I G. 4B

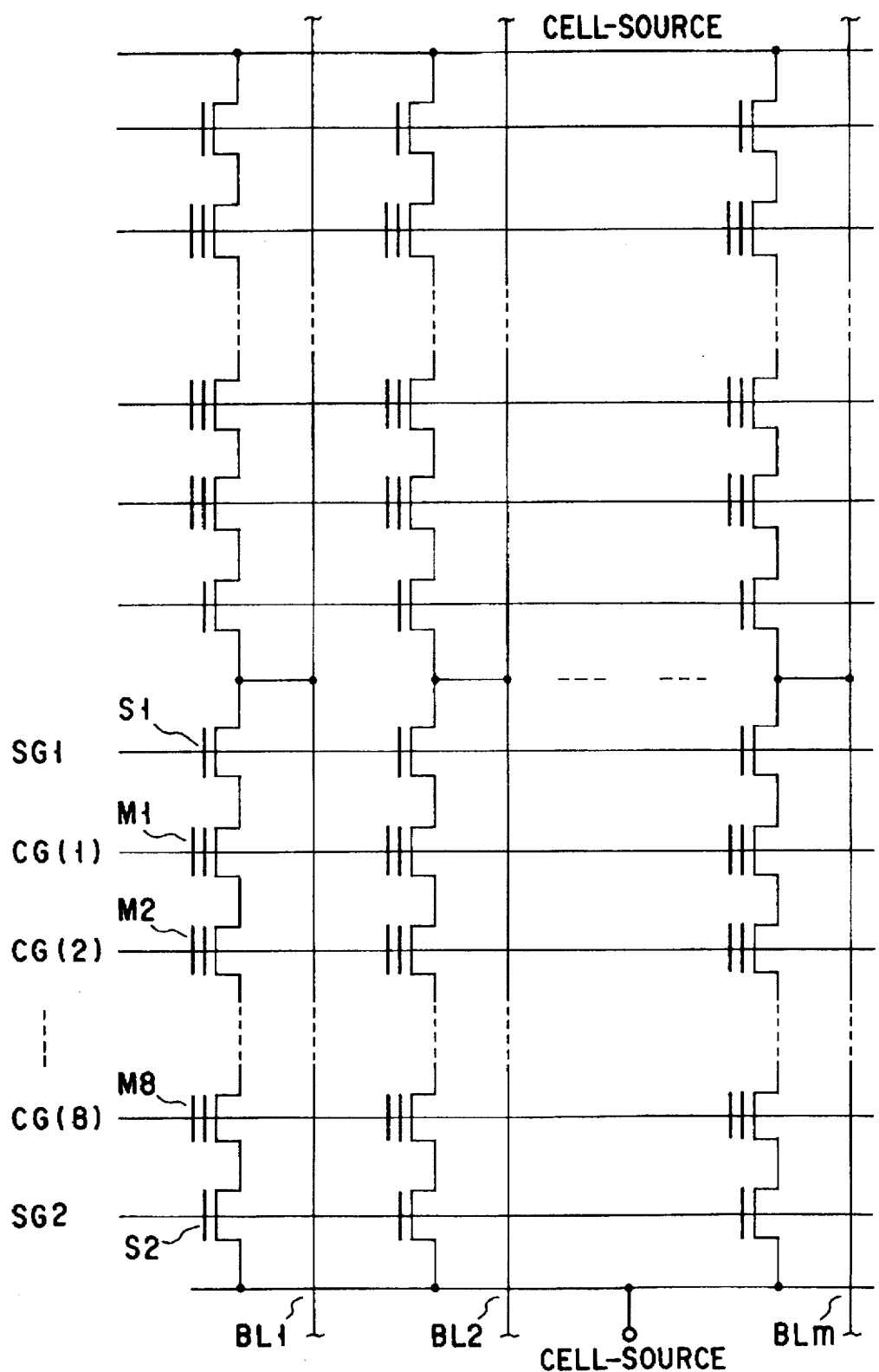
F I G. 6

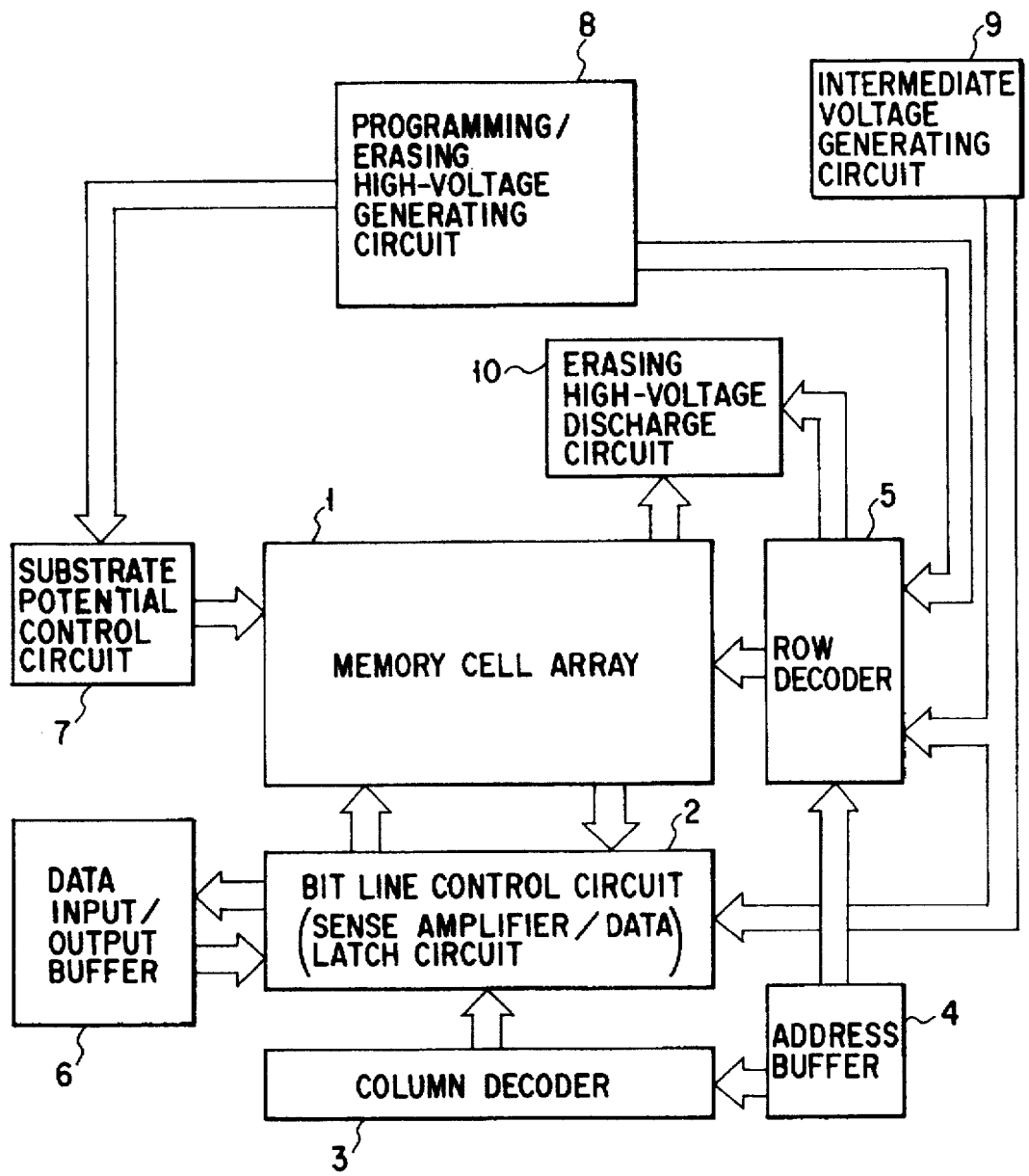
F I G. 9

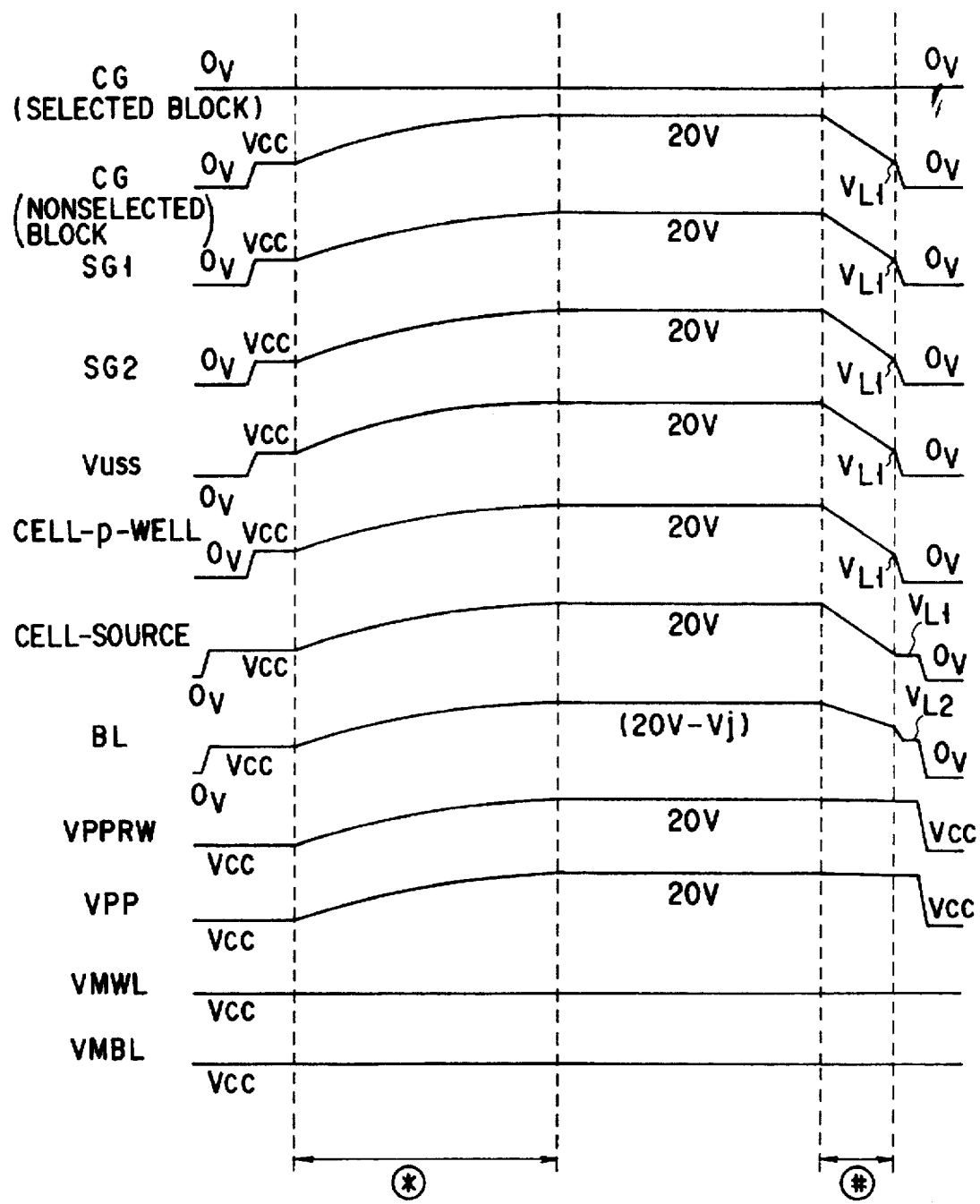
F I G. 10

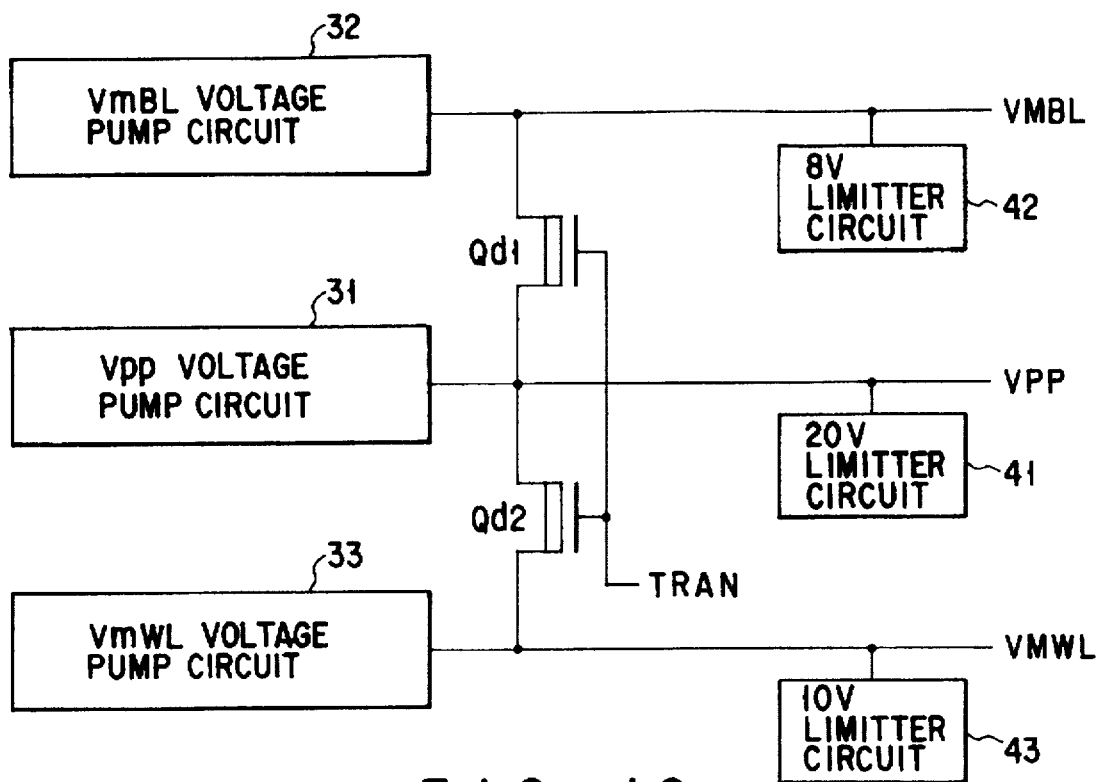
F I G. 12
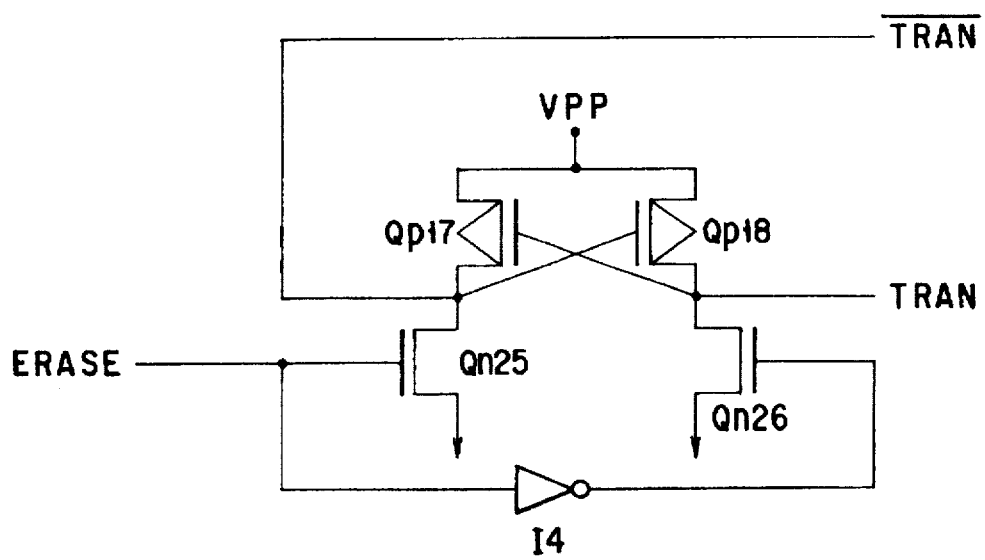
F I G. 13

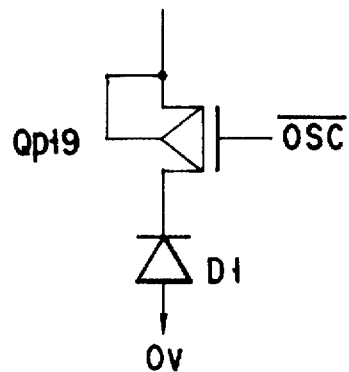
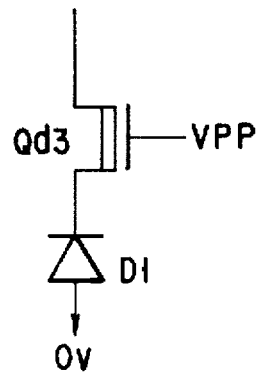
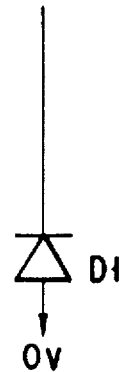
FIG. 14A     FIG. 14B     FIG. 14C
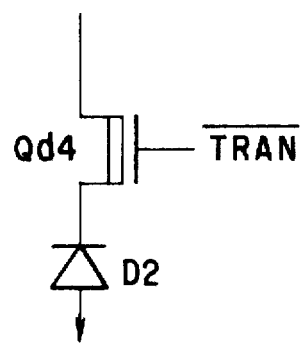
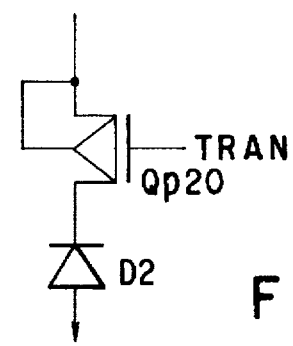
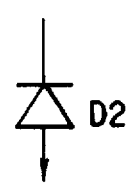
FIG. 14F
FIG. 14D     FIG. 14E
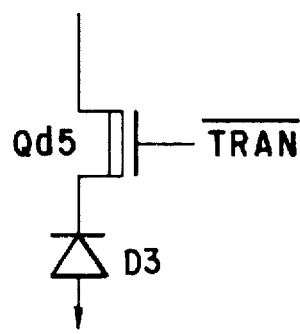
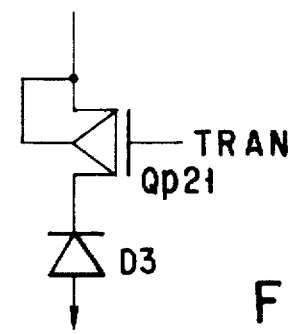
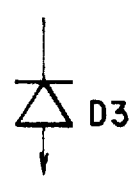
FIG. 14I
FIG. 14G     FIG. 14H

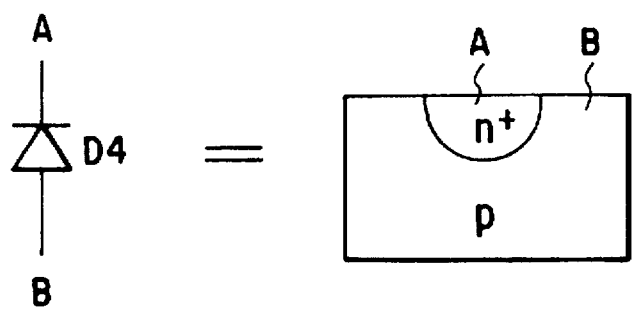
F I G. 15A
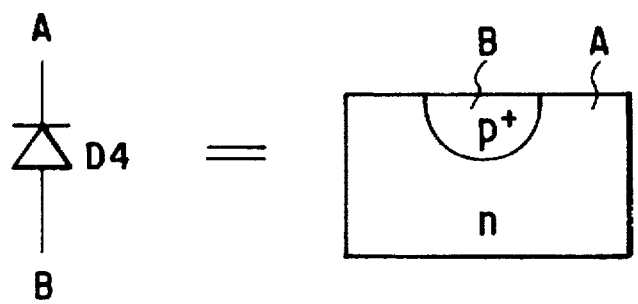
F I G. 15B
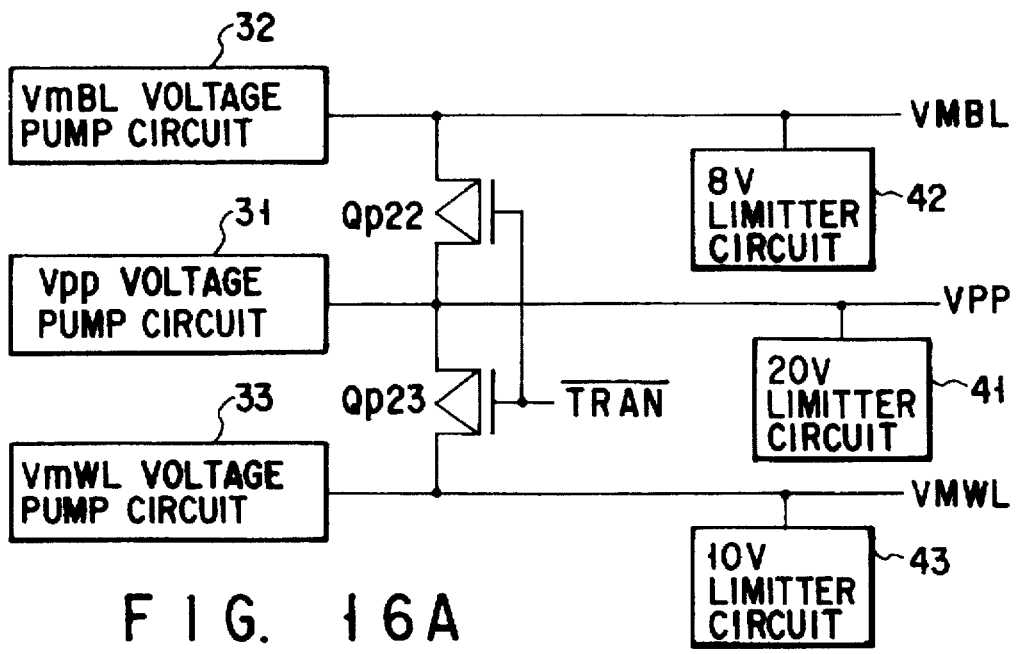
F I G. 16A

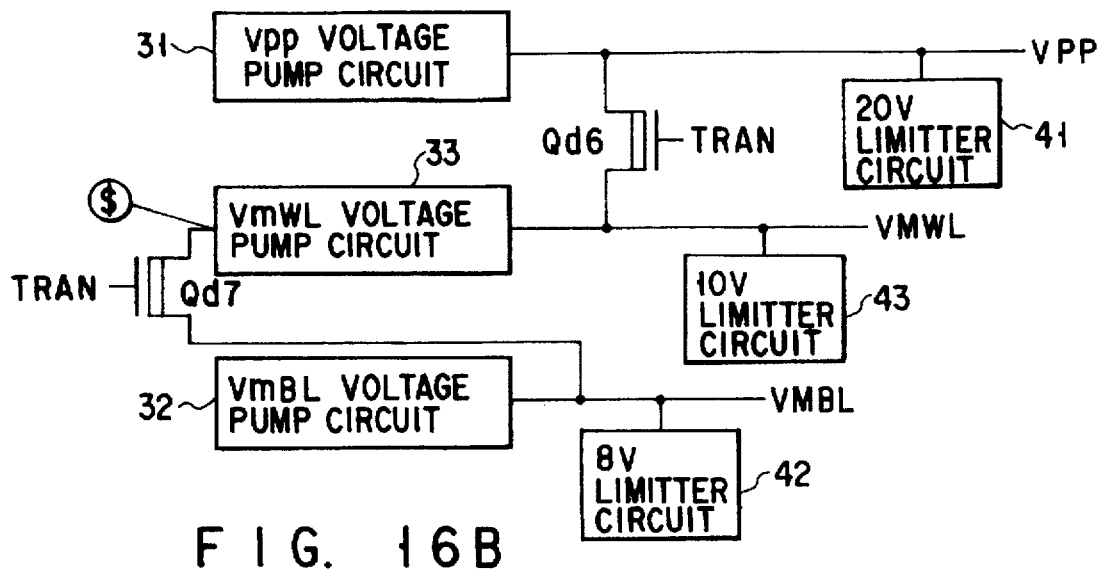
F I G. 16B
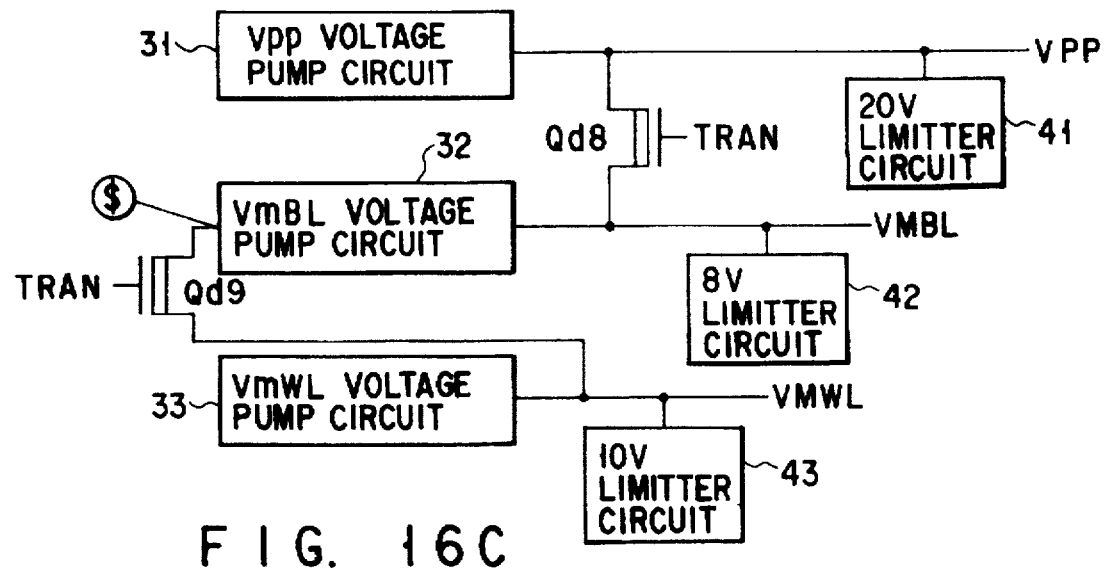
F I G. 16C

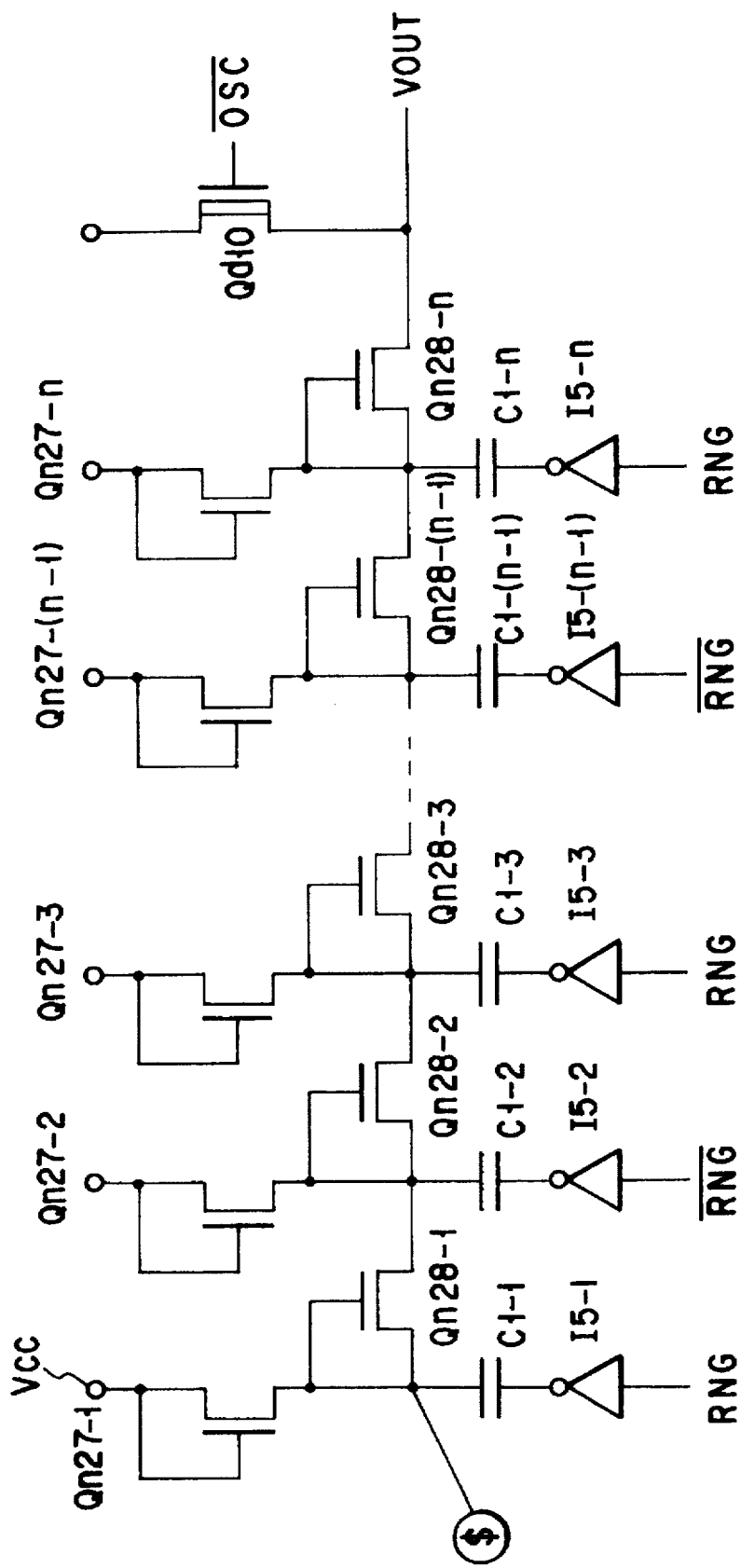
F I G. 17

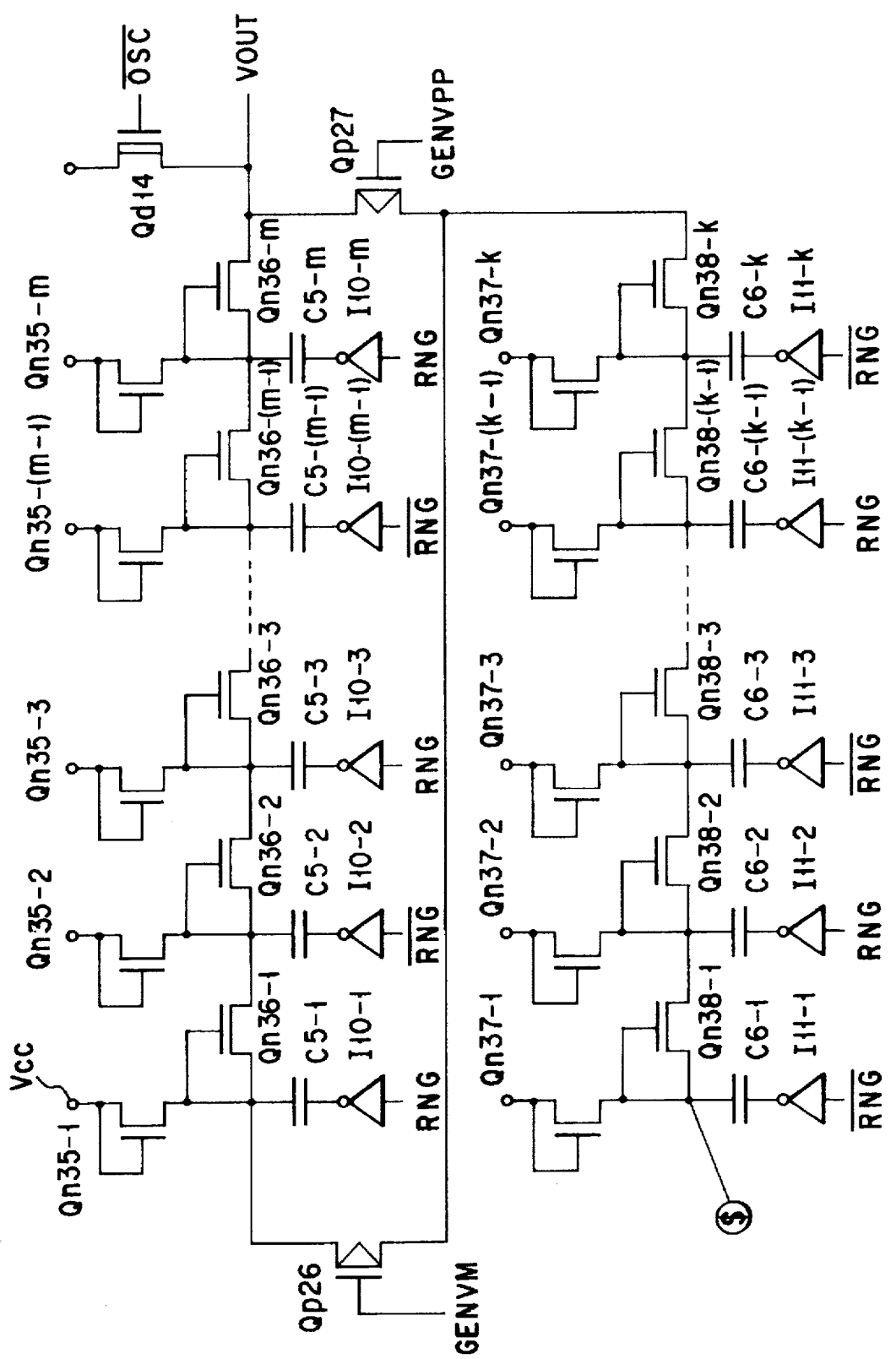
F I G. 19

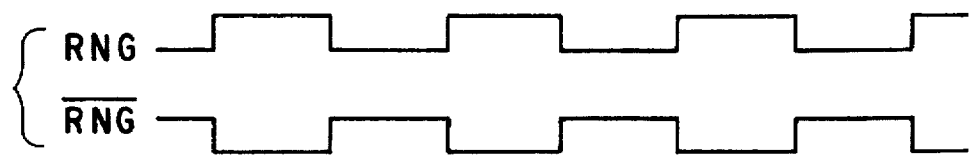
FIG. 20
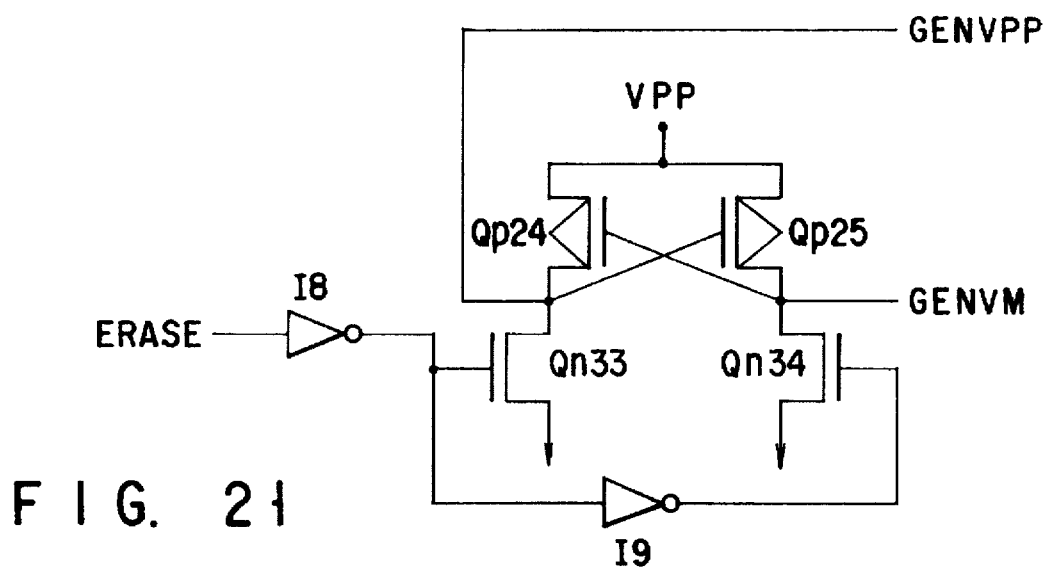
FIG. 21
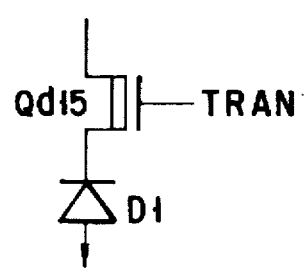 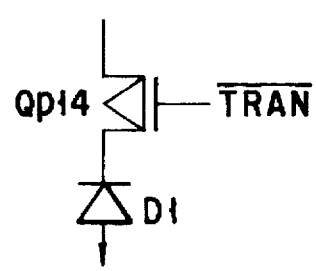
FIG. 24A    FIG. 24B

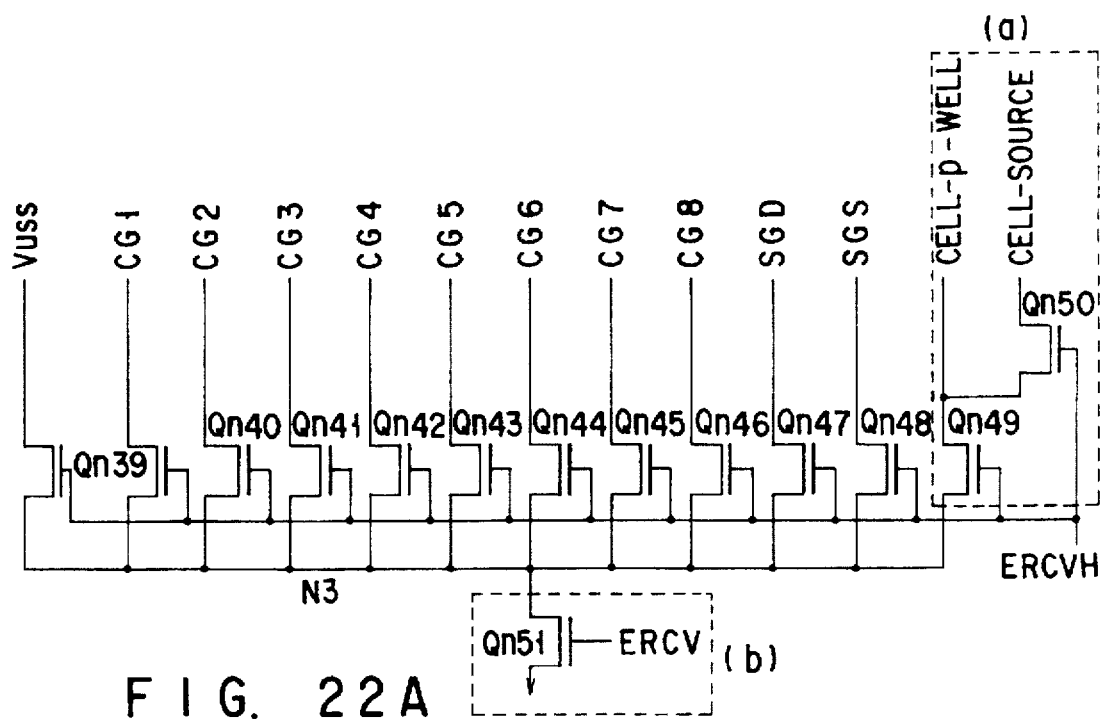
F I G. 22A
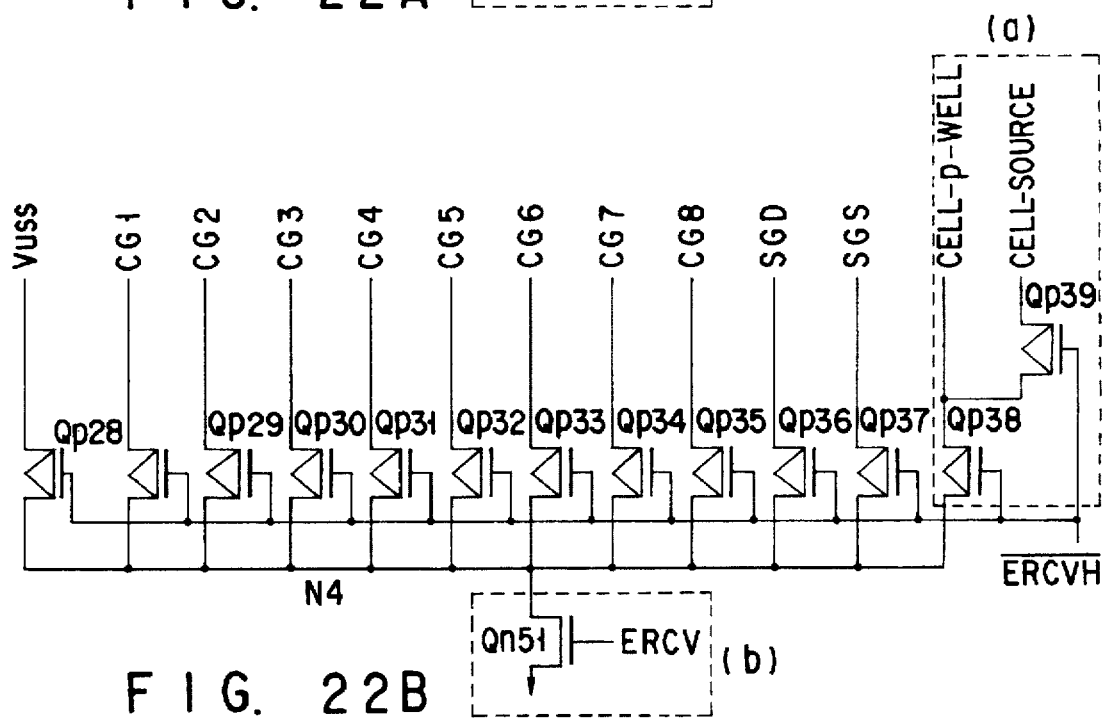
F I G. 22B
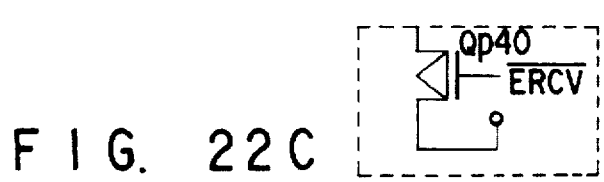
F I G. 22C

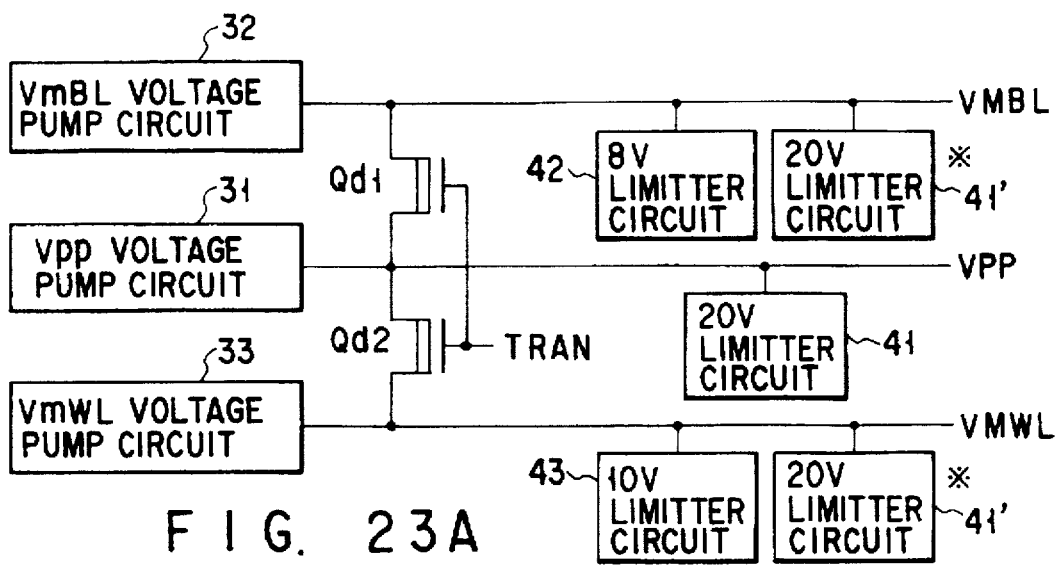
F I G. 23A
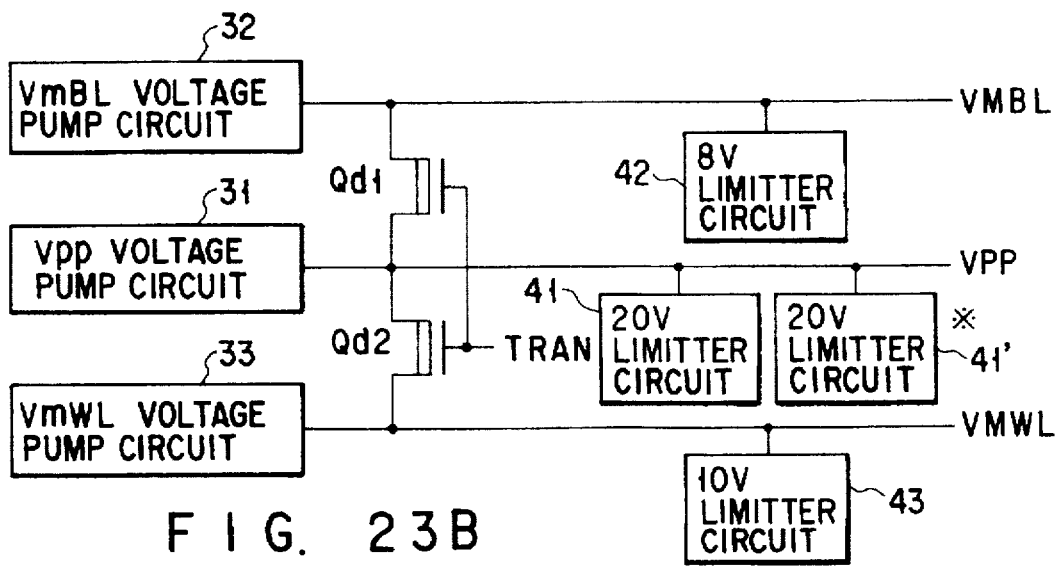
F I G. 23B
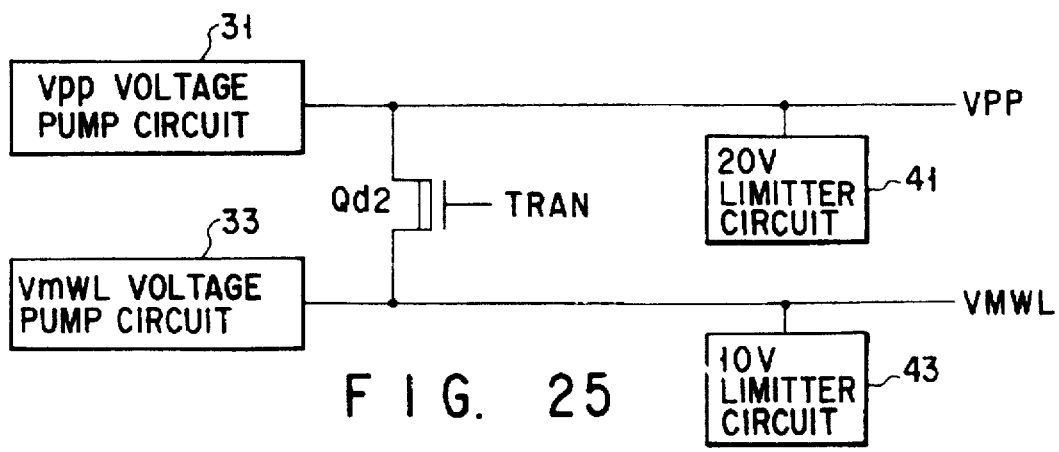
F I G. 25

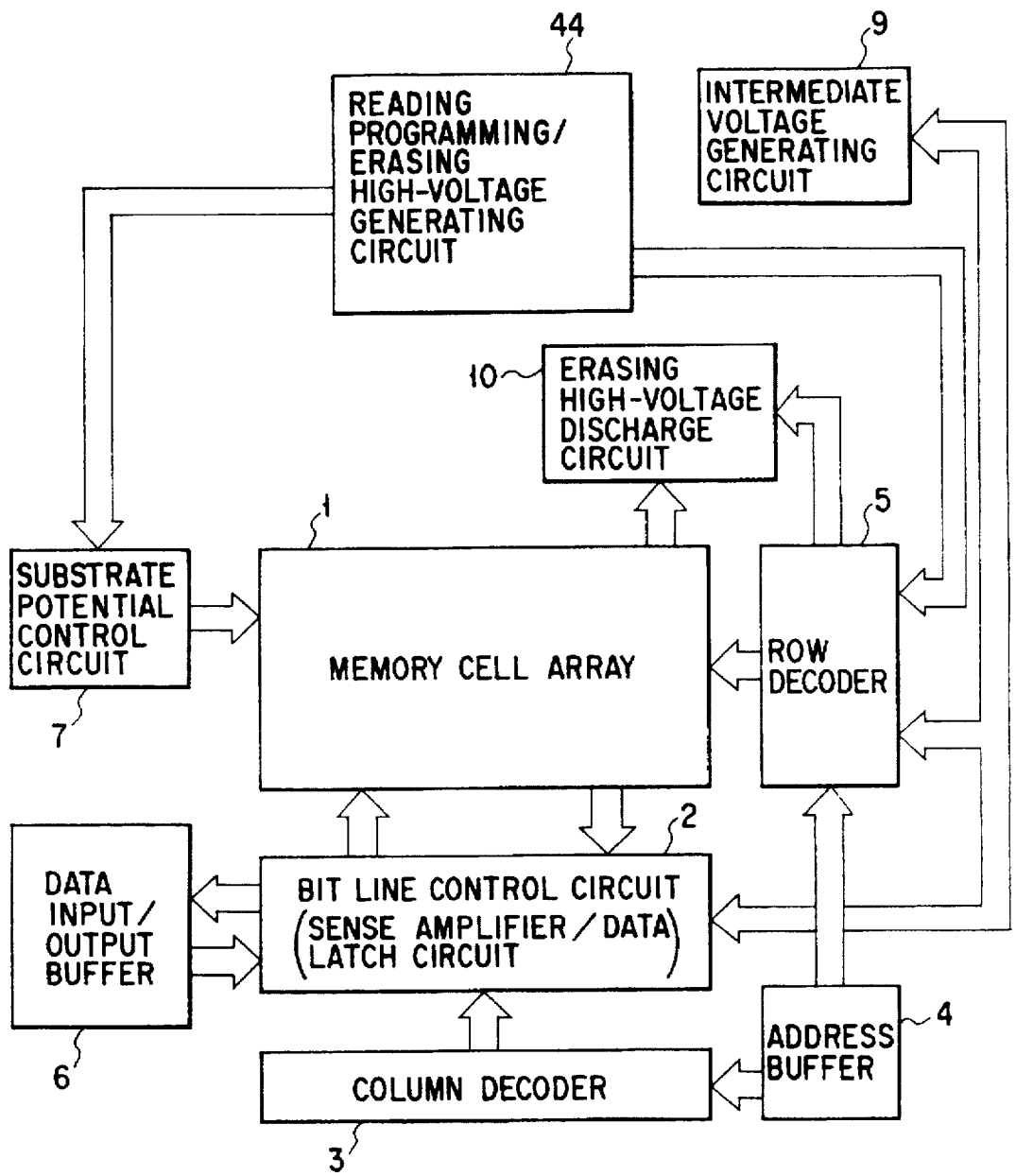
F I G. 27A

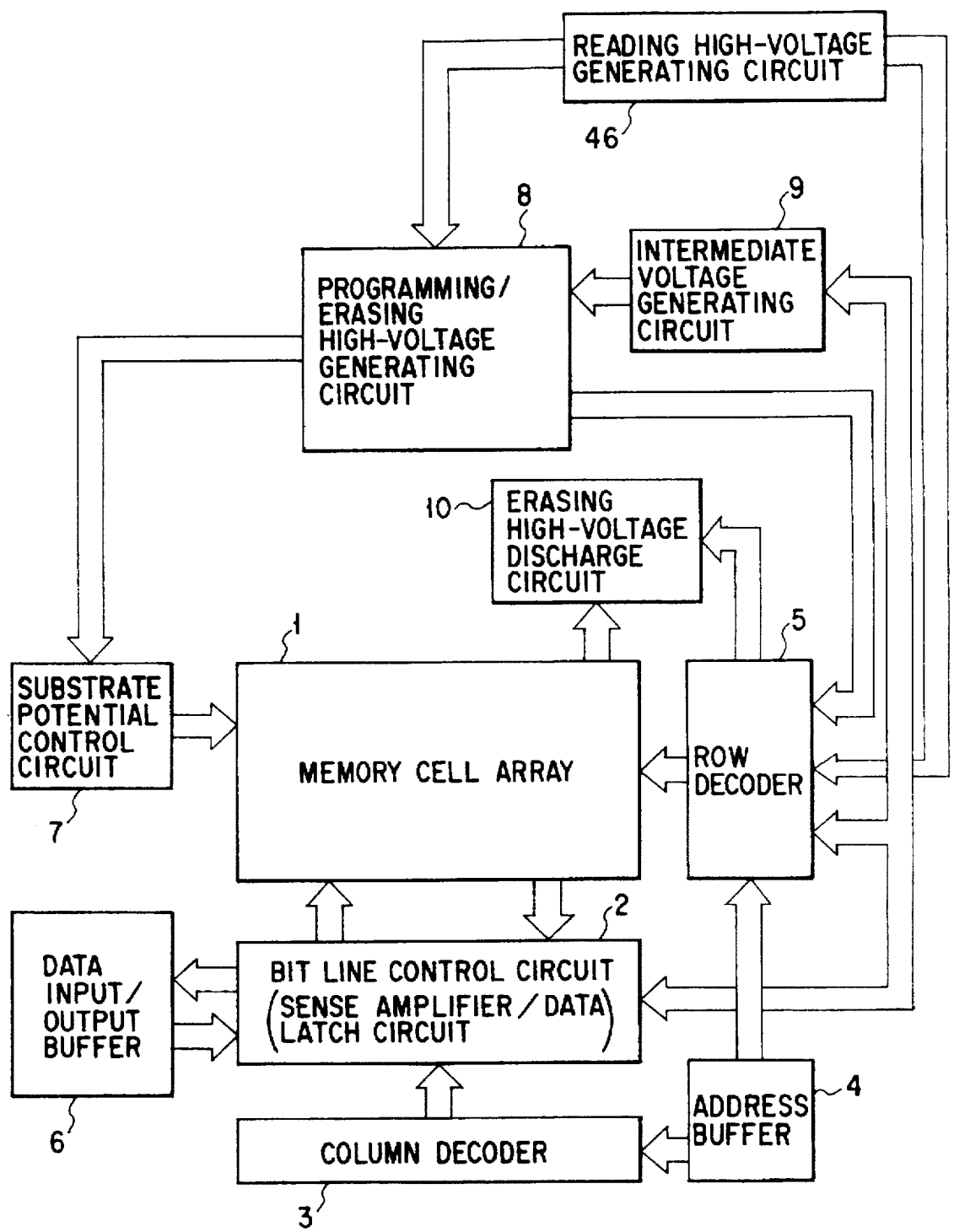
F I G. 27E

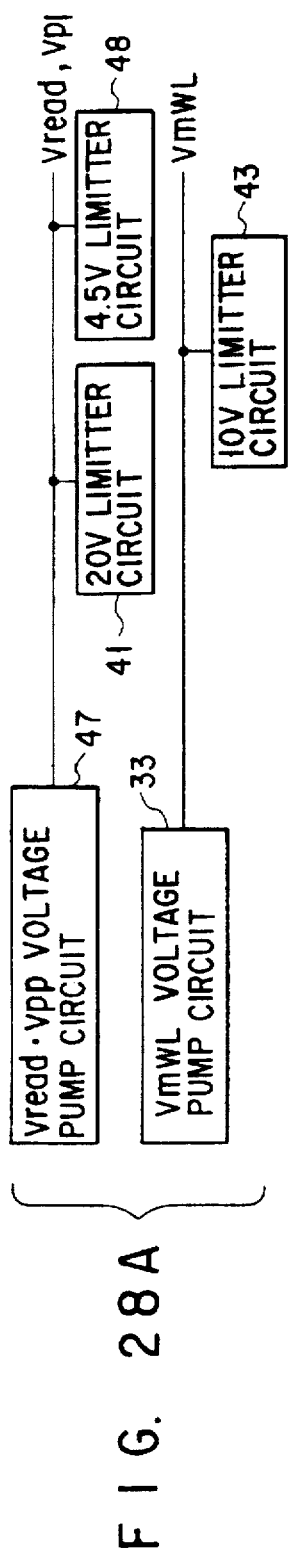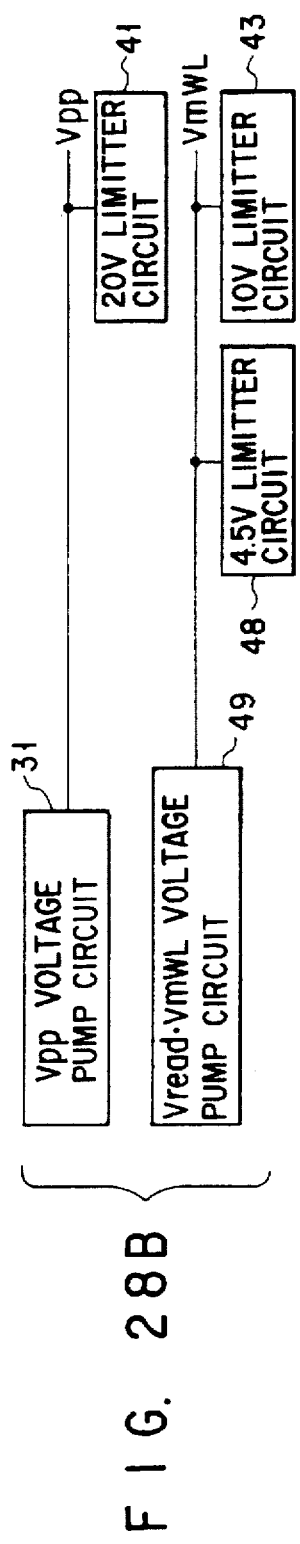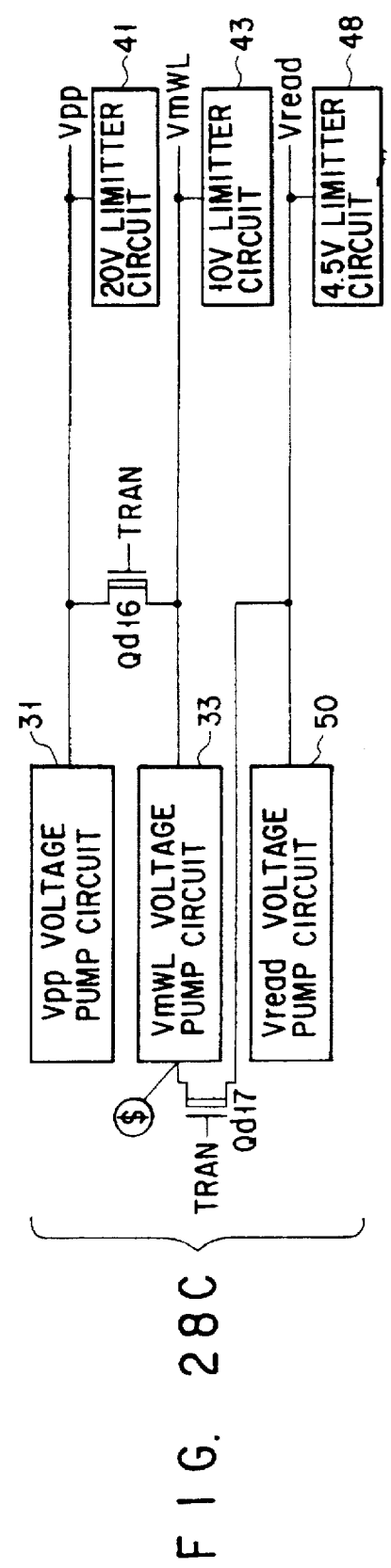
F I G. 28A  F I G. 28B  F I G. 28C

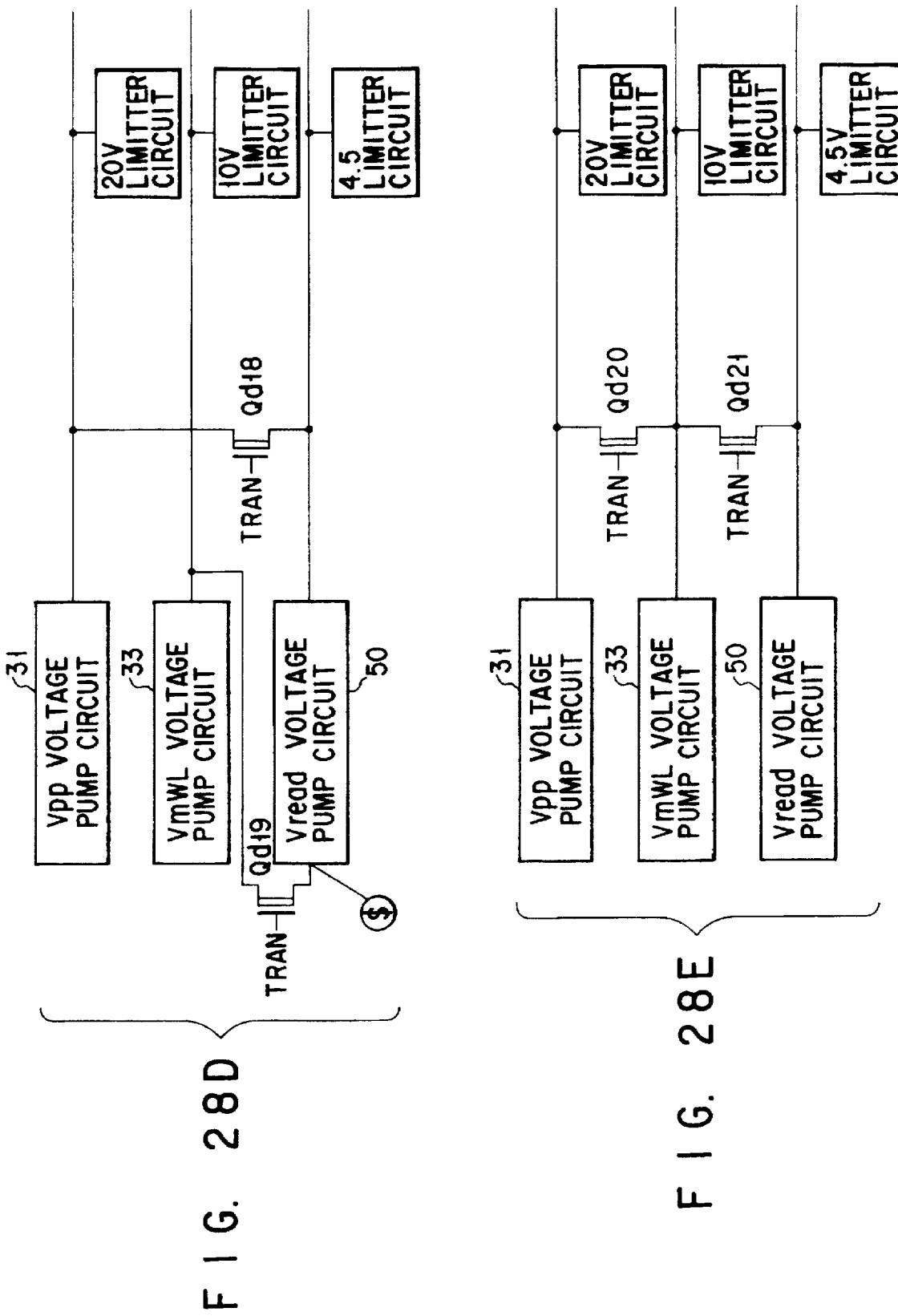

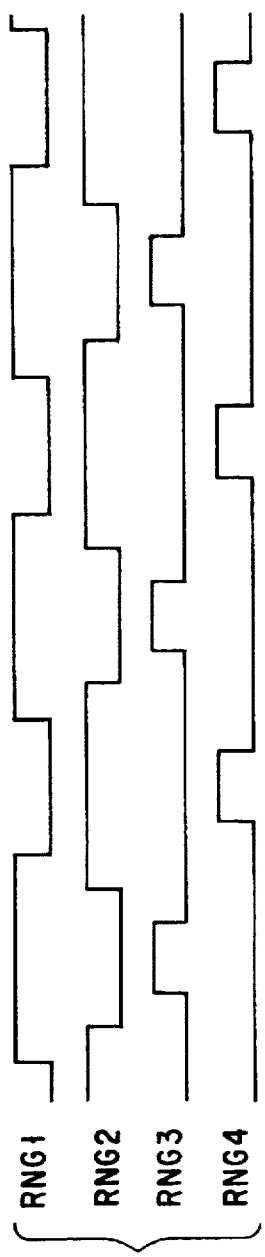
F I G. 30
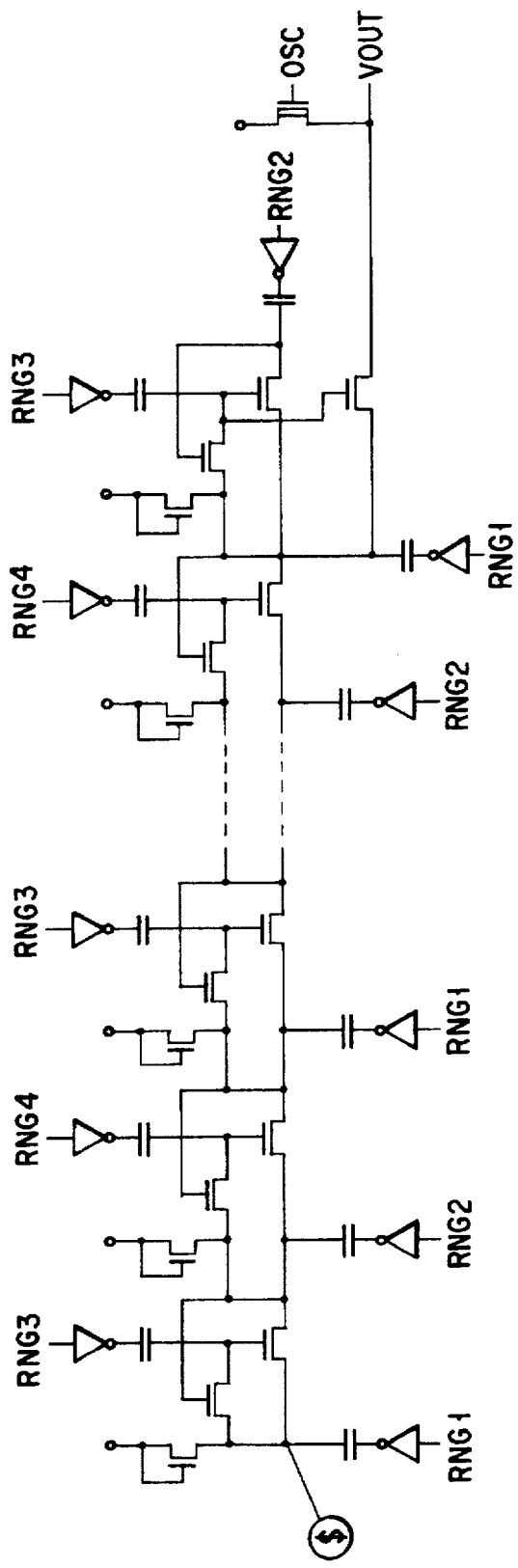
F I G. 31

FIG. 34E
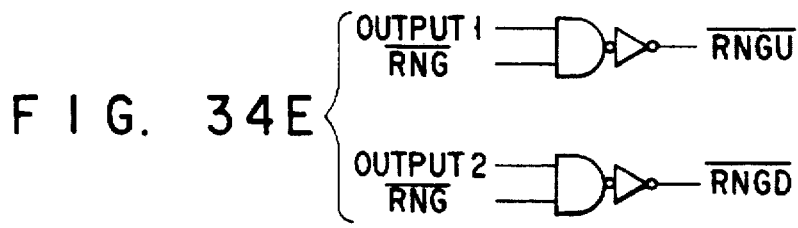
DURING VOUT1 OUTPUT OPERATION
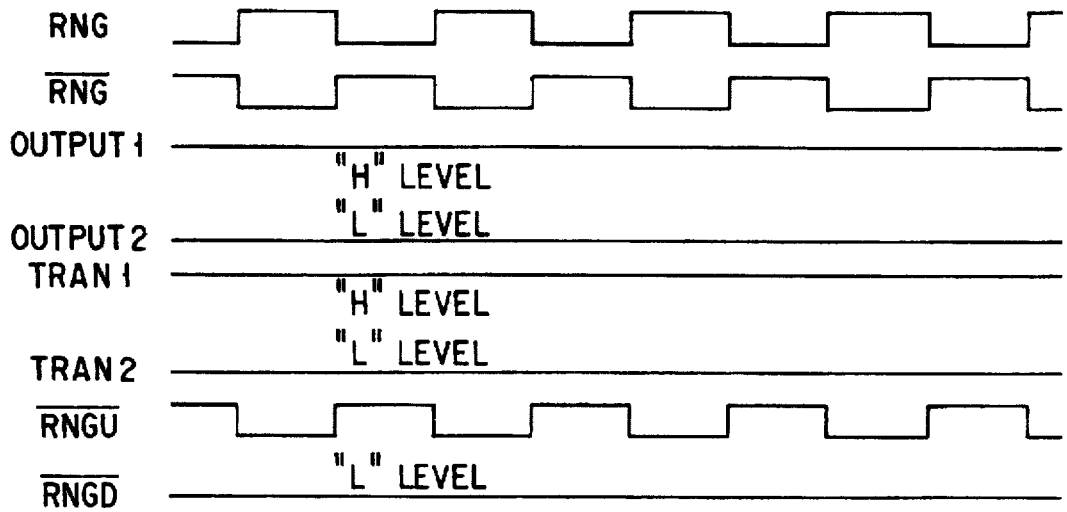
FIG. 34F
DURING VOUT2 OUTPUT OPERATION
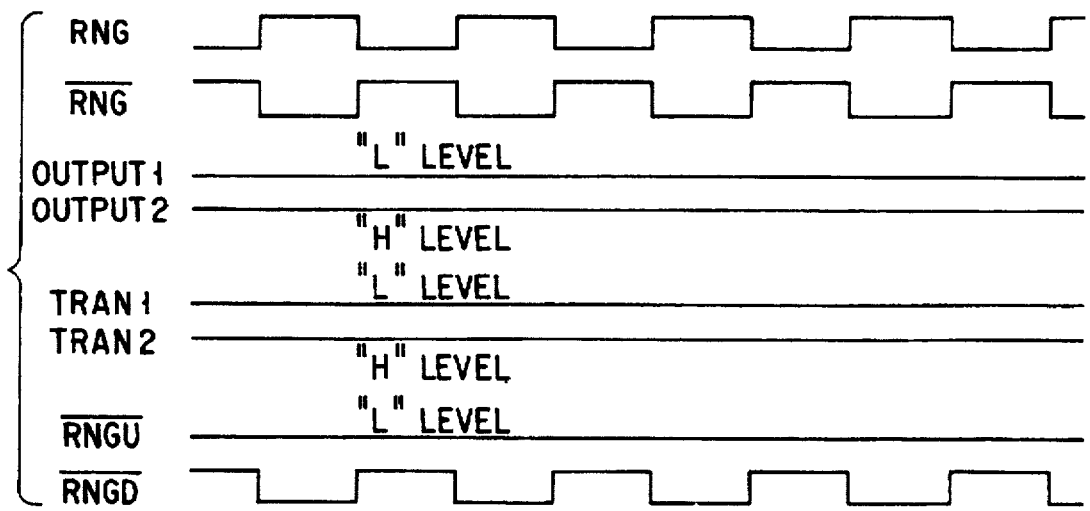
FIG. 34G

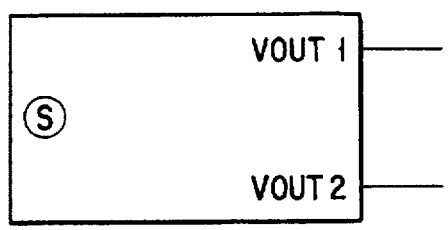
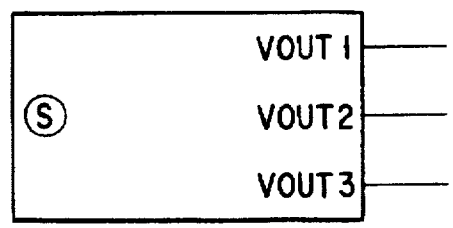
FIG. 36A        FIG. 36B
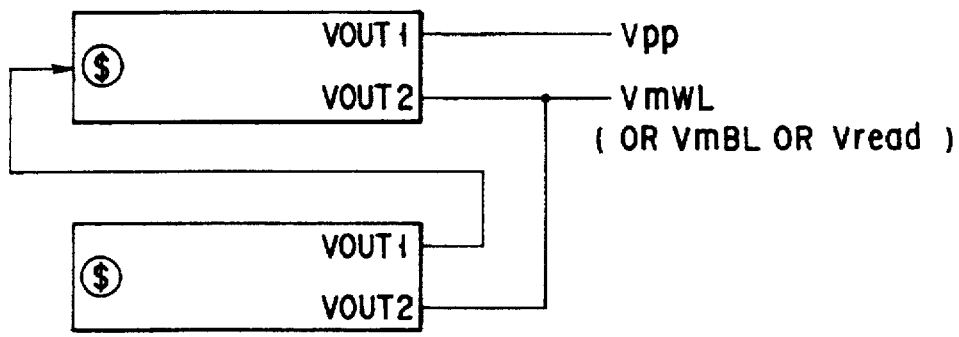
FIG. 37A
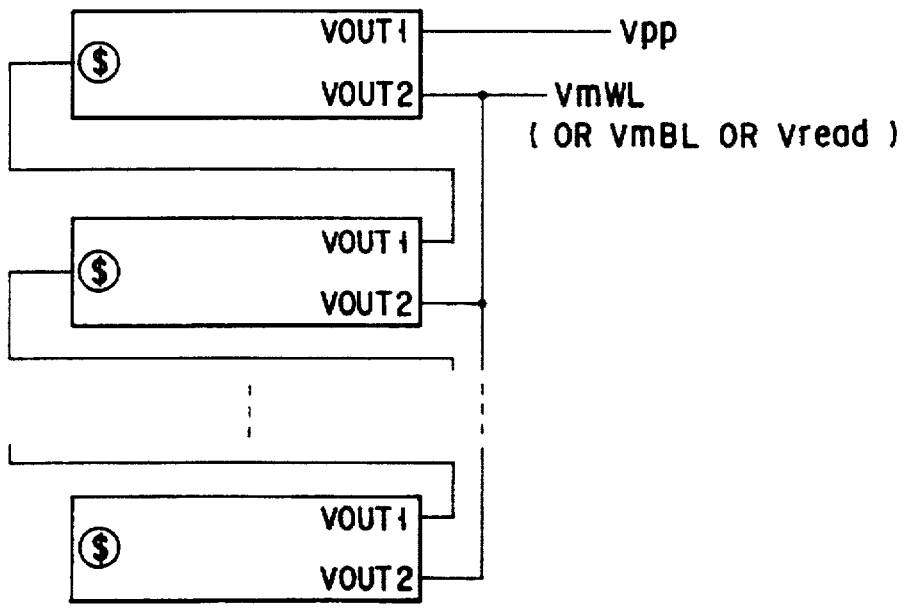
FIG. 37B

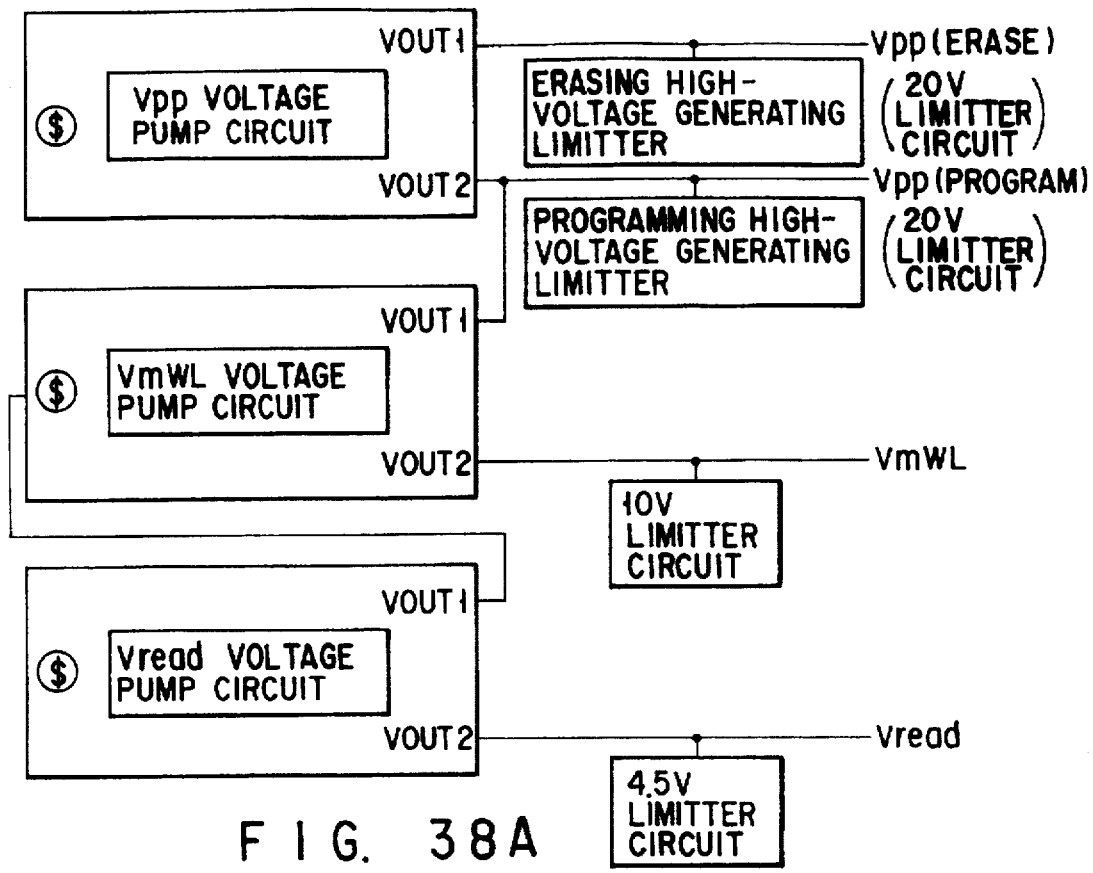
F I G. 38A
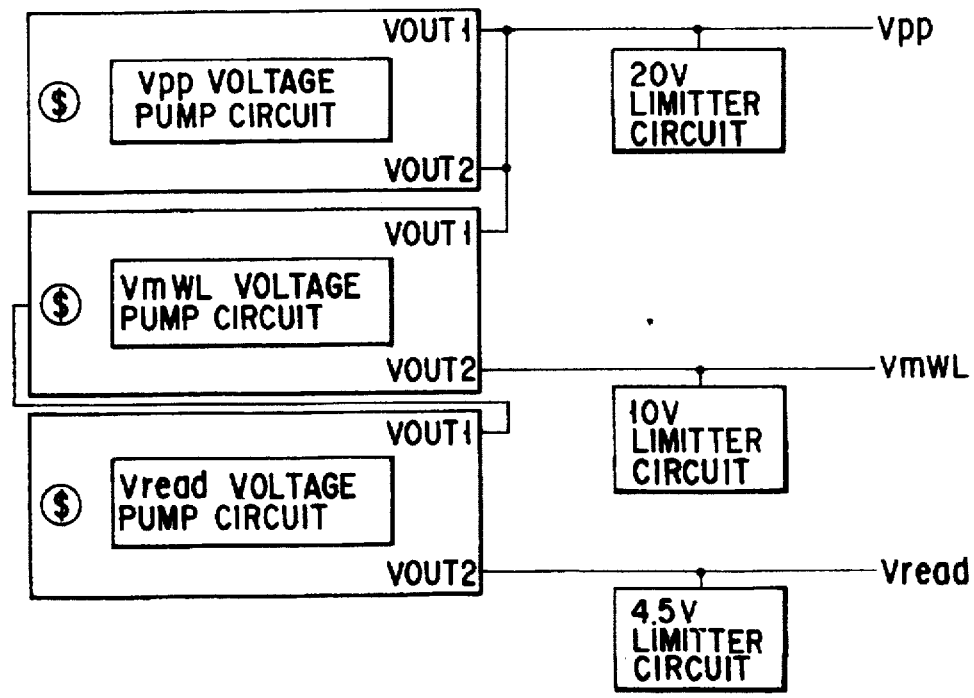
F I G. 38B

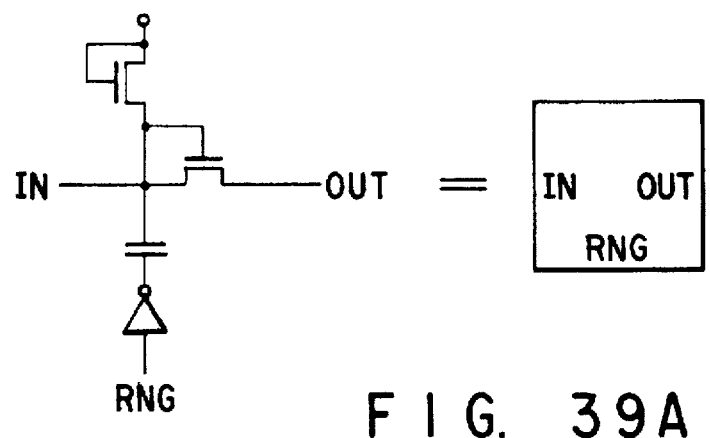
FIG. 39A
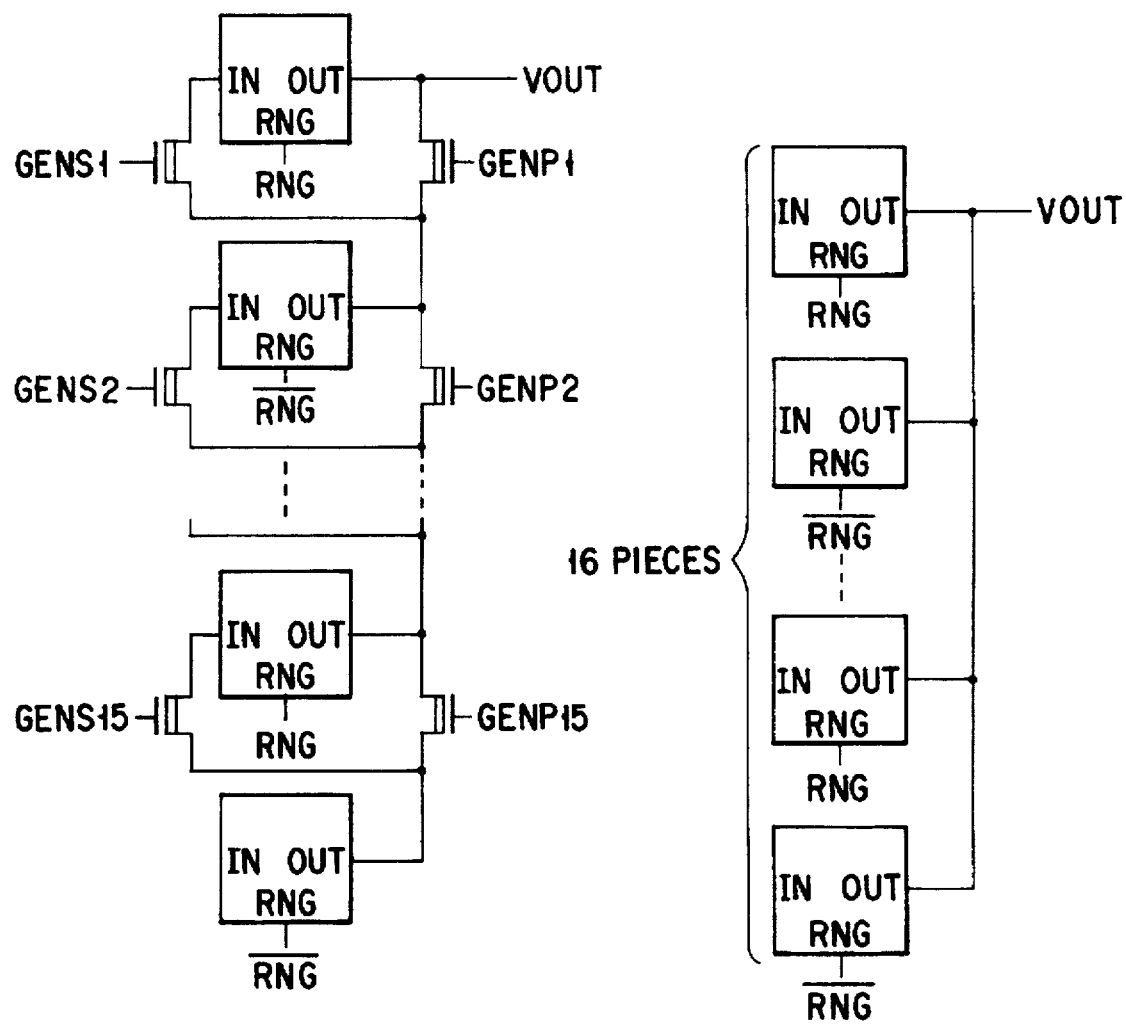
FIG. 39B
FIG. 39C

5,706,241

EEPROM SEMICONDUCTOR MEMORY DEVICE INCLUDING CIRCUIT FOR GENERATING A VOLTAGE HIGHER THAN A POWER SUPPLY VOLTAGE

BACKGROUND OF THE INVENTION

1. Field of the Invention

This invention relates to a electrically rewritable nonvolatile-semiconductor memory device (EEPROM) and, more particularly, it relates to an EEPROM improved for its circuit configuration in order to generate a voltage higher than the power supply voltage.

2. Description of the Related Art

NAND type EEPROMs adapted for a high degree of integration are known and provide a category of EEPROM. In an EEPROM of this type, a plurality of memory cells are connected in series, adjacently disposed ones sharing sources and drains, and connected to a bit line as a unit. The memory cells normally have a FET-MOS structure obtained by arranging a floating gate (charge storage layer) and a control gate in layers.

Memory cell arrays are formed in a p-type well produced in an p- or n-type substrate to produce a highly integrated device. The drain side of the NAND cell is connected to a bit line by way of a select gate while the source side is connected to a source line (reference potential wire) by way of a source line. The control gates of the memory cells are continuously arranged along the row direction to form a word line.

A NAND type EEPROM having such a configuration operates in a manner as described below.

Data are programmed into the memory cells, starting from the memory cell located most remotely from the bit line. A high voltage Vpp (=20V or so) is applied to the control gate of the selected memory cell and an intermediate voltage VmWL (=10 or so) is applied to the control gates and the select gates of the memory cells located closer to the bit line side than the memory cell while 0V or another intermediate voltage VmBL (=8V or so) is applied to the bit line depending on the data to be programmed.

If 0V is applied to the bit line, the voltage is conveyed to the drain of the selected memory cell to inject electrons from the drain into the floating gate. As a result, the threshold value of the selected memory cell is shifted in the positive direction. This state may be defined as "1". When the intermediate voltage VmBL is applied to the bit line, no electron injection takes place and, therefore, the threshold value is not changed and remain to be negative. This state is defined as "0".

For erasing data, the control gate connected to the memory cell storing the data to be erased is held to 0V and the bit and source lines are held to a floating state, while the high voltage Vpp is applied to the control gates of the memory cells storing the data that are not to be erased, all the select gates and the p-well as well as to the n-type substrate. Consequently, the electrons on the floating gate of the memory cell from which the data are erased are discharged into the p-type well to shift the threshold value in the negative direction.

For reading data, the control gate of the selected memory cell is held to 0V and the control gates and the select gates of all the other memory cells are held to the power supply voltage Vcc (=5V) to see if an electric current flows through the selected memory cell.

As may be obvious from the above description, there exist intermediate voltages VmWL and VmBL and a data programming high voltage Vpp having a potential higher than the potential Vcc generated within the chip during the data programming operation and there exists a data erasing high voltage Vpp having a potential higher than the potential Vcc generated within the chip during the data erasing operation. In other words, the chip has a data programming/erasing high voltage generation circuit and a data programming intermediate voltage generating circuit.

The high voltage (Vpp) generating circuit comprises a Vpp pump circuit 31 and a 20V limiter circuit 41, whereas the intermediate voltage (VmBL) generating circuit comprises a VmWL pump circuit 32 and an 8V limiter circuit 42 and the intermediate voltage (VmWL) generating circuit comprises a VmWL pump circuit 33 and a 10V limiter circuit 43. The generation and supply of the erasing high voltage for the erasing operation is carried out only by the programming/erasing high voltage generating circuit so that the intermediate voltage generating circuits are held inactive during the data erasing operation.

The above described arrangement is, however, accompanied by the following problems.

The time required for achieving the data erasing high voltage can be reduced to speed up the data erasing operation only by raising the current supplying capacity of the data erasing high voltage generating circuit. Then, a large area is required for the patter of the data programming/erasing high voltage generating circuit to significantly increase the chip size.

Additionally, for the above described conventional chip, a circuit having a configuration as shown in FIG. 2 is known for discharging the electrical charge of the nodes charged with the data erasing high voltage. However, with the circuit arrangement FIG. 2, Cell-Source node can show a voltage lower than that of Cell-p-well node when the voltage of the discharged nodes falls from 20V. Then, an electric current flows in the forward direction of pn-junction between the $n^+$ diffusion layer that is the Cell-Source node in the memory cell array and the Cell-p-well node so that consequently a current flows through the parasitic bipolar thyrister to give rise to a latch-up phenomenon.

As described above, with a conventional NAND type EEPROM, any attempt to raise the current supplying capacity of the data programming/erasing high voltage generating circuit to speed up the data erasing operation by turn gives rise to a large increase of the pattern area of the circuit and, therefore, a significant increase of the chip size. In addition, there exits a risk of giving rise to a latch-up phenomenon when discharging the node to which the data erasing high voltage has been applied for data erasure.

SUMMARY OF THE INVENTION

It is therefore an object of the present invention to provide a semiconductor memory device that can realize a reliable data erasing operation that requires only a very short charging time for the data erasing high voltage without practically increasing a chip size.

Another object of the present invention is to provide a semiconductor memory device that is free from the risk of giving rise to a latch-up phenomenon when discharging the node to which the data erasing high voltage is applied for a data erasing operation.

To achieve the above object, the present invention employs the following structure.

The semiconductor memory device according to the present invention comprises: a semiconductor substrate; a memory cell array having a plurality of memory cells formed on one of a semiconductor substrate and a first conductive well formed on the semiconductor substrate; a plurality of voltage generating circuits for applying the memory cells voltages that are higher than the power supply voltage and different from each other; and a switching circuit for connecting each of output nodes of the plurality of voltage generating circuits.

Preferable manners are as follows.

(1) Each of the plurality of voltage generating circuits has a pump circuit and a voltage limiter circuit and the operation of all the voltage limiter circuits is stopped except a single voltage limiter circuit when the nodes are connected by the switching circuit. The pump circuit has a plurality of capacitors connected to the plurality of nodes connected in series and in a plurality of stages. The pump circuit changes the number of stages depending on the operation.

(2) Each of the plurality of voltage generating circuit has a pump circuit and a voltage limiter circuit, and the pump circuit has a plurality of capacitors connected to the plurality of nodes connected in series and in a plurality of stages. The pump circuit changes the number of stages depending on the operation.

(3) The output nodes individually output different voltages in a case of a first operation which the plurality of output nodes are unconnected and output the same voltage in a case of a second operation which the plurality of output nodes are connected. The first voltage generating circuit comprises a first pump circuit and a first voltage limiter circuit, the second voltage generating circuit comprises a second pump circuit and a second voltage limiter circuit, and the operation of at least one of the first and second voltage limiter circuits is suspended when the first and second voltage generating circuits are connected in series by the exchange circuit. The first voltage generating circuit comprises a first pump circuit and a first voltage limiter circuit, the second voltage generating circuit comprises a second pump circuit and a second voltage limiter circuit, the third voltage generating circuit comprises a third pump circuit and a third voltage limiter circuit, operations of first and second voltage limiter circuits are suspended, first and second voltage generating circuits are connected in series by the exchange circuit, and the output nodes of the series circuit and third voltage generating circuit are connected. The second operation is an operation of data erase operation.

Another semiconductor memory device comprises: a memory cell array of a plurality of memory cells formed and arranged on a semiconductor substrate; a first voltage generating circuit for applying a first voltage $V_1$ higher than the power supply voltage to the memory cells; a second voltage generating circuit for applying a second voltage $V_2$ higher than the power supply voltage to the memory cells; a third voltage generating circuit for applying a third voltage $V_3$ higher than the power supply voltage to the memory cells; and a exchange circuit for connecting the second and third voltage generating circuits in series and the output of the series circuit to the output node of the first voltage generating circuit. The first voltage generating circuit comprises a first pump circuit and a first voltage limiter circuit, the second voltage generating circuit comprises a second pump circuit and a second voltage limiter circuit, the third voltage generating circuit comprises a third pump circuit and a third voltage limiter circuit, and the operation of at least one of the first and second voltage limiter circuits is suspended when the first and second voltage generating circuits are connected in series by the exchange circuit. The first voltage generating circuit comprises a first pump circuit and a first voltage limiter circuit, the second voltage generating circuit comprises a second pump circuit and a second voltage limiter circuit, the third voltage generating circuit comprises a third pump circuit and a third voltage limiter circuit, the operation of at least one of the second and third voltage limiter circuits is suspended when the second and third voltage generating circuits are connected in series by the exchange circuit, and operations of second and third voltage limiter circuits are suspended.

With a semiconductor memory device according to the invention, a plurality of voltage generating circuits can be independently driven or connected mutually and driven cooperatively by means of a switching circuit or an exchange circuit. Therefore, one or more than one voltage generating circuits that are not used in a given mode of operation can be connected to one or more than one voltage generating circuits that are selected used in that mode of operation to enhance the capacity of the selected voltage generating circuit or circuits in order to improve the operating efficiency of the circuits.

More specifically, in an EEPROM, for example, an intermediate voltage that generates and supply an intermediate voltage for data programming operation can cooperate with a data programming/erasing high voltage generating circuit for data erasing operation to generate and supply a data erasing high voltage so that the time required for charging to the data erasing high voltage can be reduced practically without increasing the chip size.

Thus, with a semiconductor memory device according to the first aspect of the invention, a data erasing operation that is faster and more reliable than ever can be realized without practically increasing the chip size.

With another semiconductor memory device according to the invention, a charge storage layer and control gates are formed on a semiconductor substrate in layers and the memory device comprises a memory cell array realized by arranging memory cells that are electrically rewritable by exchanging an electric charge between the charge storage layer and the substrate, bit lines, each being connected to a memory cell or an end of a memory cell unit formed by arranging a plurality of memory cells directly or by way of selection transistors, source lines, each being connected to a memory cell or the other end of a memory cell unit, first transistors for connecting the well or substrate carrying the memory cells and the source lines and second transistors for connecting the well or substrate and discharge nodes, characterized in that the source lines are discharged by way of the first and second transistors when the well or substrate and the source lines are discharged from a potential higher than the power supply voltage.

With this arrangement, a latch-up phenomenon can be prevented from taking place during the process of discharging the nodes to which a data erasing high voltage is applied for data erasing operation by controlling the potential of the Cell-Source node so as not to fall under the potential of the Cell-p-well node.

A still another semiconductor memory device according to the invention comprises: a memory cell array in which a plurality of memory cells are arranged on a semiconductor substrate; and a pump circuit having first and second output nodes for providing a predetermined voltage to the plurality of memory cells, wherein the pump circuit has at least first and second voltage generating circuits, each having first and second output terminals, the second output terminals of the first and second voltage generating circuits are connected respectively to the second output nodes, the first output terminal of the first voltage generating circuit is connected to the first output node, and the first output terminal of the second voltage generating circuit is connected to the input terminal of the first voltage generating circuit. The pump circuit has a plurality of voltage generating circuits, each having first and second output terminals, the second output terminals of the plurality of voltage generating circuits being connected respectively to the second output nodes, the first output terminals of the plurality of voltage generating circuits being connected respectively to the input terminals of the voltage generating circuits of the next stage, and the output terminals of the final stage of the plurality of voltage generating circuits being connected respectively first output nodes. The pump circuit further has third output node, and has a plurality of voltage generating circuits, each having first, second and third output terminals, the third output terminals of the plurality of voltage generating circuits is connected respectively to the third output nodes, the second output terminals of the plurality of voltage generating circuits is connected respectively to one of the second output nodes and the input terminals of the voltage generating circuit of the next stage, the first output terminals of the plurality of voltage generating circuits being connected respectively to the input terminals of the voltage generating circuits of the next stage, and the first output terminals of the final stage of the plurality of voltage generating circuits being connected respectively first output nodes.

A still another semiconductor memory device comprises: a memory cell array in which a plurality of memory cells are arranged in matrix on a semiconductor substrate; and a pump circuit having a plurality of output nodes and outputs a predetermined voltage to the plurality of memory cells, wherein the pump circuit has a different number of stages when a different node among the plurality of output nodes outputs a voltage.

With the above described arrangement, a semiconductor memory device having voltage generating circuits with a variable number of stages can be realized in a simple manner.

As described above, with a semiconductor memory device according to the invention, the potential of the p-type well (or the p-type substrate) where a memory cell array is formed is discharged while it is held to a potential not exceeding the potential of the source line in the memory cell array so that no latch-up phenomenon can take place. Thus, an EEPROM that operates faster and more reliably for erasing operation than any known EEPROMs can be realized.

Note that the present invention can be applied not only to an EEPROM but also to a semiconductor memory device of any other type such as a NOR cell type EEPROM, a DINOR cell type EEPROM, an AND cell type EEPROM or some other nonvolatile semiconductor memory device or to a volatile semiconductor memory device such as a DRAM or a SRAM.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a schematic block diagram of an embodiment of NAND type EEPROM according to the invention;

FIGS. 4A and 4B are a schematic plan view and an equivalent circuit of an embodiment of NAND type EEPROM according to the invention;

FIG. 6 is an equivalent circuit diagram of the memory cell array of an embodiment of the invention;

FIG. 9 is a block diagram of a conventional NAND type EEPROM;

FIG. 10 is a timing chart for the data erasing operation of a conventional memory device.

FIG. 12 is a circuit diagram of the data programming/ erasing high voltage generating circuit and the intermediate voltage generating circuit of an embodiment of the invention;

FIG. 13 is a circuit diagram of the signal TRAN generating circuit of an embodiment of the invention;

FIGS. 14A through 14I are schematic circuit diagrams of limiter circuits according to an embodiment of the invention;

FIGS. 15A and 15B are schematic circuit diagrams and plan views of limiter circuits according to an embodiment of the invention;

FIGS. 16A through 16C are circuit diagrams of different sets of a data programming/erasing high voltage generating circuit and an intermediate voltage generating circuit according to an embodiment of the invention;

FIG. 17 is a circuit diagram of the pump circuit of an embodiment of the invention;

FIG. 19 is a circuit diagram of still another pump circuit of still another embodiment of the invention;

FIG. 20 is a timing chart of the operation timing of a driving signal of a pump circuit;

FIG. 21 is a circuit diagram of the input signal generating circuit of a pump circuit;

FIGS. 22A through 22C are circuit diagrams of data erasing high voltage discharging circuits that can be used for the purpose of the invention;

FIGS. 23A and 23B are circuit diagrams of other data erasing high voltage generating circuits;

FIGS. 24A and 24B are circuit diagrams of limiter circuits that can be used for the high voltage generating circuits of FIGS. 23A and 23B;

FIG. 25 is a circuit diagram of a pump circuit using only an intermediate voltage VmWL for the data programming operation;

FIGS. 27A through 27E are block diagrams of other embodiments of NAND type EEPROM according to the invention;

FIGS. 28A through 28E are circuit diagrams of the high voltage generating circuit and the intermediate voltage generating circuits of the respective embodiments of FIGS. 27A through 27E;

FIG. 30 is a timing chart of pump circuit drive signals;

FIG. 31 is a circuit diagram of the pump circuit of still another embodiment;

FIGS. 34A through 34G are circuit diagrams of variable stage pump circuits and timing charts of their operations that can be used for the purpose of the invention;

FIG. 36A and 36B are block diagrams of a pump circuit having two and three output nodes, respectively;

FIGS. 37A to 37C are circuit diagrams of pump circuits capable of changing the number of stages;

FIGS. 38A through 38D are circuit diagrams of the high voltage generating circuit and the intermediate voltage generating circuits of different embodiments, illustrating their connections;

FIGS. 39A through 39G are circuit diagrams of pump circuits that can change the number of stages in a single operation mode;

Figure 1:
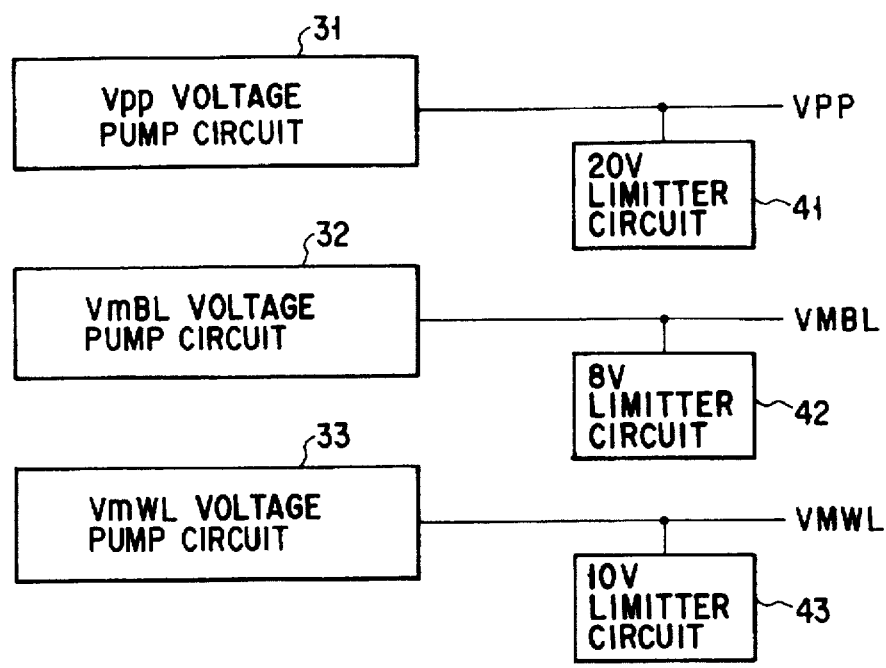
FIG. 1 is a circuit diagram of the data programming/ erasing high voltage generating circuit and the intermediate voltage generating circuit of a conventional semiconductor memory device.

DETAILED DESCRIPTION OF THE
PREFERRED EMBODIMENTS

Now, the present invention will be described in greater detail by referring to the accompanying drawings that illustrate preferred embodiments of the invention.

FIG. 3 is a schematic block diagram of an embodiment of NAND type EEPROM according to the invention. There is provided a bit line control circuit 2 for controlling the operations of data programming, data reading, data reloading, data programming/verifying/reading and data erasing/verifying/reading for memory cell array 1. The bit line control circuit 2 is connected to data input/output buffer 6 and receives the output of column decoder 3 as an input. Row decoder 5 is provided to control the control gates and the selection gates for the memory cell array 1. A substrate potential control circuit 7 is also provided to control the potential of the p-type substrate (or the p-type well), where the memory cell array 1 is formed.

Data programming/erasing high voltage generating circuit 8 generates and supplies a data programming/erasing high voltage to be applied to the memory cells during the data programming/erasing operation. Intermediary voltage generating circuit 9 generates and supplies an intermediate voltage (>Vcc) to be applied to the memory cells and the bit line during the data programming operation and also connected to the data programing/erasing high voltage generating circuit 8 to generate and supply a data erasing high voltage (or an intermediate voltage) with the data programming/erasing high voltage generating circuit 8. Data erasing high voltage discharge circuit 10 discharges the nodes (except the bit lines) of the memory device memory cell array charged to the data erasing high voltage during the data erasing operation to the level of Vcc.

Figure 5A:
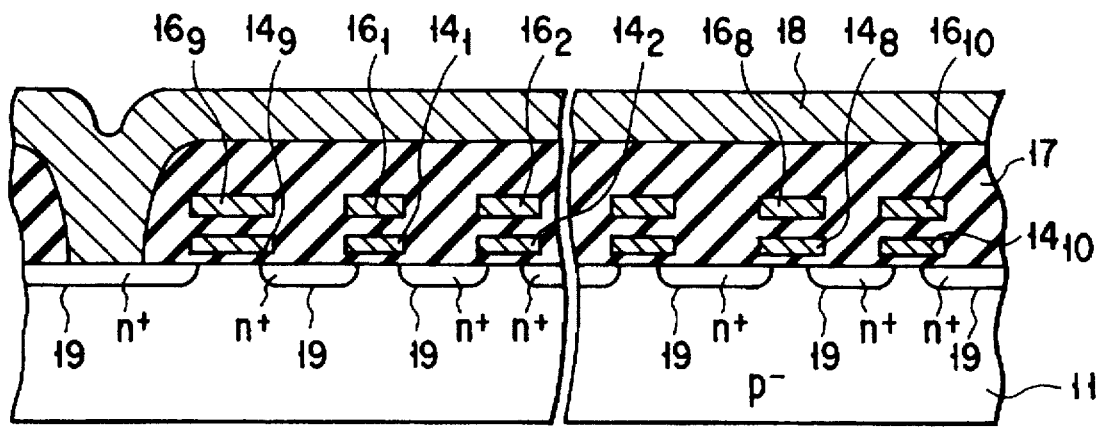
FIGS. 5A and 5B are sectional views taken respectively along line 5A—5A and line 5B—5B in FIG. 4A.
Figure 5B:
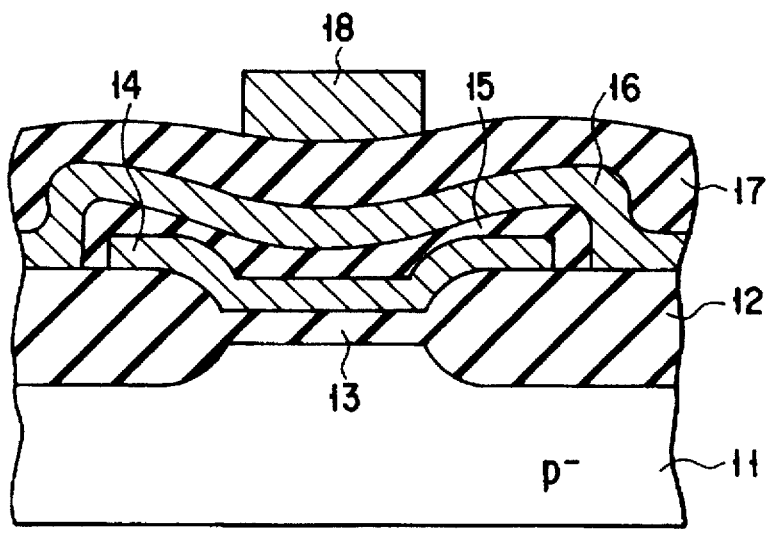

FIGS. 4A and 4B are a schematic plan view and an equivalent circuit of an embodiment of NAND type EEPROM according to the invention. FIGS. 5A and 5B are sectional views taken respectively along line 5A—5A and line 5B—5B in FIG. 4A. A memory cell array comprising a plurality of NAND cells is formed on a p-type silicon substrate (or a p-type well in an area surrounded by a device separation oxide film 12. In this embodiment, each of the NAND cells comprises eight memory cells M1 through M8 connected in series.

The memory cells are constituted respectively by floating gates $14$ ($14_1$, $14_2$, ..., $14_8$) arranged on a substrate 11 with a gate insulation film 13 disposed therebetween and control gates $16$ ($16_1$, $16_2$, ..., $16_8$) arranged thereon with another gate insulation film 15 disposed therebetween. N-type diffusion layer 19 operates as the sources and the drains of the memory cells and any adjacent memory cells are connected as they share a source and a drain so that consequently the memory cells are connected in series.

The NAND cells are provided on the drain side with selection gates $14_9$ and $16_9$ and on the source side with selection gates $14_{10}$ and $16_{10}$, which are formed with the floating gates and the control gates of the memory cells. The substrate carrying thereon a memory device is covered by a CVD oxide film 17 and a bit line 18 is arranged thereon. The bit line 18 is held in contact with a drain side diffusion layer 19 arranged at an end of the NAND cell. The control gates 14 of the NAND cells arranged along the row direction commonly arranged as control gate lines CG(1), CG(2), ..., CG(8). These control gate lines operate as word lines. Likewise, the selection gates $14_9$, $16_9$ and $14_{10}$, $16_{20}$ are also arranged as selection gate lines SG1, SG2 located in succession along the row direction.

The gate insulation film 13 between the selection gates $14_9$, $14_{10}$ and the substrate 11 may be made thicker than the gate insulation film of the memory cell section in order to improve its reliability.

FIG. 6 is an equivalent circuit diagram of the memory cell array realized by arranging NAND cells as described above into a matrix.

Figure 7:
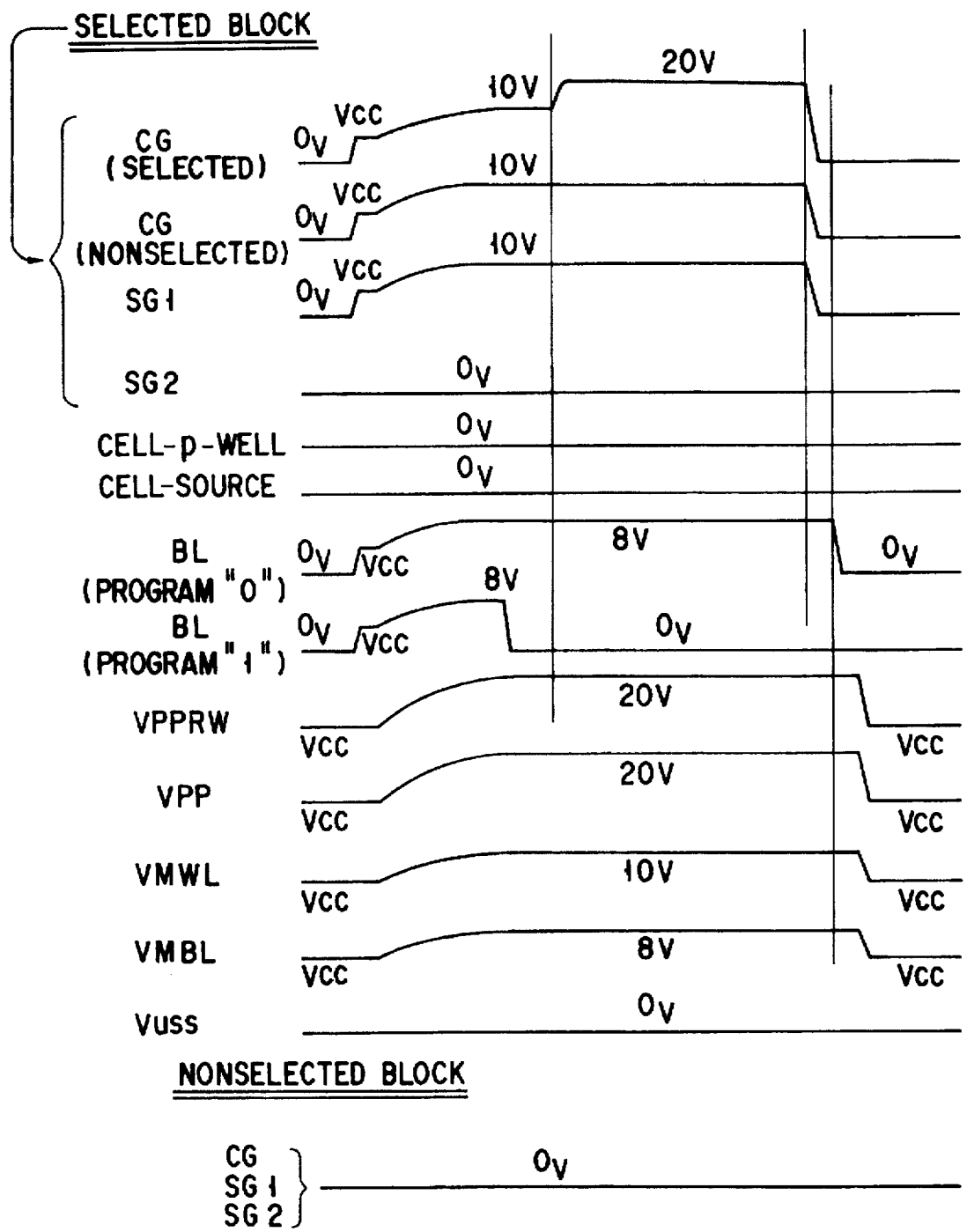
FIG. 7 is a timing chart for the data programming operation of an embodiment of the invention.
Figure 11:
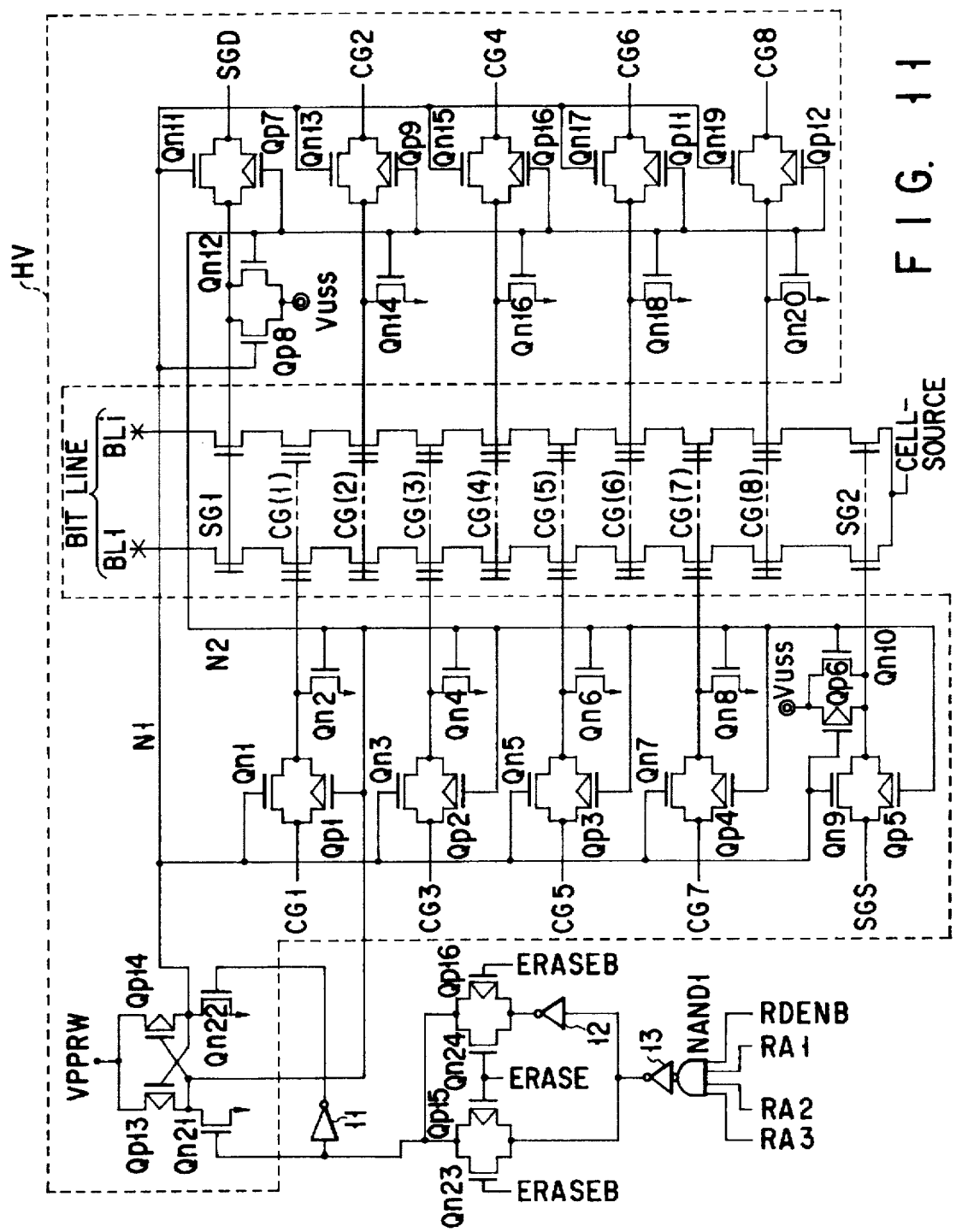
FIG. 11 is a schematic circuit diagram of the memory cell array and the row decoder of an embodiment of the invention.

FIG. 7 is a timing chart for the data programming operation of a memory device having such a NAND cell array. FIG. 11 should be referred to for Vuss. In FIG. 7, the (selected) CG is held to the gate (control gate) voltage of the memory cell into which data is programmed, whereas the remaining (unselected) CGs are held to the control gate voltage of the seven gates (control gates) except the gate (control gate) of the memory cell into which data is programmed. SG1 and SG2 denotes the selection gates of the contact side and the source line side in the NAND cell, respectively.

VPPRW is the node name of a row decoder. (See FIG. 11. This will be described in more detail hereinafter.) VPP denotes the output node (FIG. 12, which will be described in greater detail hereinafter) of a Vpp pump circuit for generating the data programming/erasing high voltage, whereas VMBL and VMWL respective denote the output node of a VmBL pump circuit and that of a VmWL pump circuit. (See FIG. 12. This will be described in more detail hereinafter.) During a data programming operation, the nodes VPP, VMBL and VMWL are held to respective voltages of 20V, 8V and 10V.

Now, the timing chart for the data programming operation of a memory device shown in FIG. 7 will be briefly described.

As the device starts a data programming operation, the bit line, the selected control gate (CG), the unselected control gates (CG) and SG1 are electrically charged to raise the potential they have from 0V to Vcc. Thereafter, it starts generating the data programming high voltage (up to 20V), the intermediate voltage to be applied to the bit line (up to 8V) and the intermediate voltage (up to 10V) to be applied to the unselected CGs in the selected block. At this time, the data programming high voltage is generated and supplied while maintaining the VPP node and the VPPRW node under a connected skate.

After the VMBL node and the bit line are charged up to 8V, the bit line of the memory cell where data "1" is programmed is discharged to become 0V from 8V. After this discharge is completed and the unselected CGs and the VPPRW node have been charged respectively to 10V and 20V, the control gate of the memory cell where data is programmed is charged up to 20V. At this time, since the capacitance of the VPPRW node is much larger than that of a single control gate (as will be described hereinafter by referring to FIG. 11), the time required for the control gate of the memory cell where data is programmed to be charged up to 20V is much shorter than the time required for the VPPRW node to be charged up to 20V.

For some time thereafter, the nodes are held to the respective potential and, subsequently, the potential of all the control gates in the selected block and that of the bit line contact side gate in the selected block are made to fall to 0V by discharging. Then, the potential of the bit line of the memory cell where data "0" is programmed is made to fall to 0V from 8V by discharging. The programming operation ends when the potentials of the VPPRW node, the VPP node, the VMBL node and the VMWL node fall to Vcc.

In the programming operation, since a data programming high voltage and two different intermediate voltages are needed, the output node of the intermediate voltage generating circuit for bit lines (=VmBL pump circuit+8V limiter circuit (FIG. 12)) and that of the intermediate voltage generating circuit for unselected CGs (=VmWL pump circuit+10V limiter circuit (FIG. 12)) are required to show respective different potentials.

Figure 8:
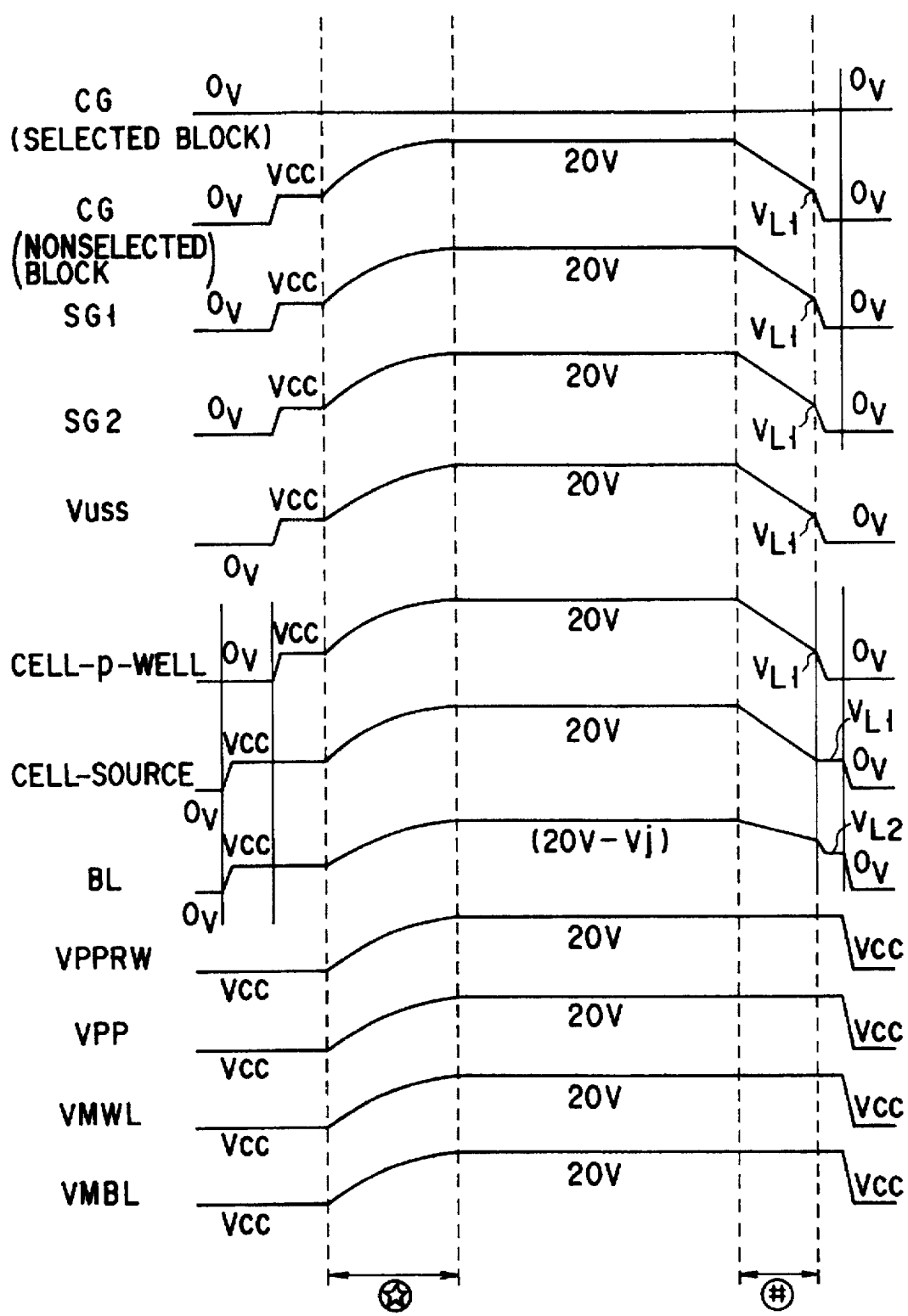
FIG. 8 is a timing chart for the data erasing operation of an embodiment of the invention.

FIG. 8 is a timing chart for the data erasing operation of the embodiment. (See FIG. 11 for Vuss in FIG. 8.) For the purpose of comparison, a circuit diagram of a comparable conventional EEPROM is shown in FIG. 9. FIG. 10 is a timing chart of the conventional EEPROM of FIG. 9.

Referring to FIG. 8, as the device starts a data erasing operation, the source line (Cell-Source node in FIG. 8) and the bit line of the memory cell array are charged to show a potential of Vcc. After the charging is completed, the p-type well (or the p-type substrate) where the memory cells are arranged (Cell-p-well node in FIG. 8 which corresponds to the node 11 in FIGS. 5A and 5B) is charged to show a potential of Vcc.

If the operation of charging the Cell-p-well up to Vcc is conducted faster than or as fast as that of charging the bit line and the Cell-Source, the potential of the Cell-p-well node and that of the bit line can become higher than that of the Cell-Source. Then, an electric current can flow between the Cell-p-well node and the bit line or the Cell-Source node in the forward direction of pn-junction, giving rise to a risk of generating a latch-up phenomenon in the parasitic bipolar thyristor.

Therefore, the occurrence of such a phenomenon is avoided by conducting the operation of electrically charging the bit line and the Cell-Source prior to that of charging the Cell-p-well as shown in the timing chart of FIG. 8. The CGs in the unselected blocks and SG1 and SG2 of all the blocks are charged to a potential of Vcc.

Subsequently, the CGs in the unselected blocks and SG1 and SG2 of all the block are charged to a data erasing high voltage along with the Cell-p-well, the Cell-Source and the VPPRW node. At this time, the bit line is floating but is electrically charged to a potential of (20V−Vj), where Vj is the diffusion potential of the pn-junction formed by the $n^+$ diffusion layer of the bit line contact and the Cell-p-well) by the electric current flowing in the forward direction of pn-junction between the $n^+$ diffusion area of the bit line contact (FIG. 5) and the Cell-p-well node when the Cell-p-well is charged to the data erasing high voltage.

While an electric current flows in the forward direction of pn-junction between the $n^+$ diffusion area of the bit line contact and the Cell-p-well node as described above under this condition, the capacity of the chip of supplying an data erasing high voltage in the inside is by far smaller than the capacity of the power supply voltage pad of supplying an electric current and, therefore, the charging rate is low. Therefore, a latch-up phenomenon that might take place when the Cell-p-well and the Cell-Source are charged to the power supply voltage of Vcc would not be observed during the operation of electrically charging up to a data erasing high voltage with a low electric current supplying capacity in view of the fact that a large electric current is required for a latch-up phenomenon to take place and a large potential difference never occurs at the pn-junction because of the low charging rate.

For the operation of FIG. 8, the data erasing high voltage is generated and supplied not only by the data programming/erasing high voltage circuit 8 but also by the intermediate voltage generating circuit 9 that is used for generating an intermediate voltage for the data programming operation. With this arrangement of generating and supplying the data erasing high voltage not only by the data programming/erasing high voltage generating circuit 8 but also by the intermediate voltage generating circuit 9, the current supplying capacity for the data erasing high voltage can be remarkably enhanced if compared with the (conventional) case where the data erasing high voltage is generated and supplied only by the data programming/erasing high voltage generating circuit 8 and the time required for charging up to the data erasing high voltage can be remarkable reduced (as indicated by (☆) in FIG. 8).

After the nodes other than the control gate of the selected block in FIG. 8 is held to 20V or (20V−Vj) for some time, the control gates of the unselected blocks, SG1 and SG2 of all the blocks the Cell-p-well and the Cell-Source are discharged from 20V to the LV1 potential (around Vcc). Thereafter, the control gate of the selected block, SG1 and SG2 of all the block, the Cell-p-well and the Cell-Source are discharged to show a voltage of 0V. Note that the bit line is floating from the time of (☆) in FIG. 8 but its potential falls to VL2 in accordance with the potential fall of the control gate of the selected block, SG1 and SG2 of all the block, the Cell-p-well and the Cell-Source.

Subsequently, the node of the Cell-p-well and the bit line are discharged to come to 0V. For this operation, the discharge operation of the node of the Cell-Source and the bit line is conducted after that of the Cell-p-well in order to prevent the node of the Cell-Source and the bit line from rising to a voltage higher than that of the Cell-p-well or an electric current from running to the parasitic bipolar thyristor to give rise to a latch-up phenomenon as a result of an electric current flowing in the forward direction of pn-junction between the node of the Cell-p-well and the bit line or the node of the Cell-Source. The data erasing operation is terminated after the nodes of VPPRW, VPP, VMBL and VMWL fall to the potential of Vcc.

With any conventional techniques the operation of generating and supplying a data erasing high voltage is performed only by means of a data programming/erasing high voltage generating circuit and the intermediate voltage generating circuit 9 does not participate in the operation of voltage raising. Therefore, conventionally, the time required for charging up to the data erasing high voltage is inevitably long. To reduce the time required for charging up to the data erasing high voltage, the electric supplying capacity of the data erasing high voltage generating circuit has to be raised to consequently increase the patterned surface area of the Vpp pump circuit and hence that of the chip.

Contrary to this, with the above described embodiment of the invention by referring to FIG. 8, the operation of generating and supplying a data erasing high voltage for a data erasing operation is performed not only by the data programming/erasing high voltage generating circuit 8 but also by the intermediate voltage generating circuit 9 so that the time required for charging up to the data erasing high voltage is reduced to realize a fast data erasing operation substantially without increasing the chip size.

FIG. 11 is a schematic circuit diagram of the memory cell array 1 and the row decoder 5 of FIG. 9. Referring to FIG. 11, signal RDENB is a start signal for block selection and all the signals RA1, RA2, RA3 are at level "H" in the selected block, whereas at least one of them is at level "L" in the unselected blocks. Signal ERASE is at level "H" at the time of data erasing operation and at level "L" at the time other than data erasing operation, whereas signal ERASEB is at level "L" at the time of data erasing operation and at level "H" at the time other than data erasing operation.

At the time of data programming operation, the nodes N1, N2 in the selected block are respectively at potentials VPPRW and 0V and the potentials of SGD, CG1 through CG8 and SGS are transferred to SG1, CG(1) through CG(8) and SG2 to start the operation of programming data in the selected memory cell. At the time of data programming operation, the Vuss node is at 0V. Thus, since the nodes N1, N2 are respectively at potentials 0V and VPPRW in the unselected blocks, all the potentials of SG1, CG(1) through CG(8) and SG2 are brought down to 0V so that no data will be programmed into memory cells.

For data erasing operation, since the nodes N1, N2 are respectively at potentials 0V and VPPRW in the selected block, all the potentials of CG(1) through CG(8) are brought down to 0V and the p-type well (or p-type substrate) carrying the memory cells is charged to 20V, all the memory cell data in the selected block will be erased. At this time, since Vuss is charged to 20V, both SG1 and SG2 are also charged to 20V. In the unselected blocks, the node N1, N2 are respectively at VPPRW and 0V and, therefore, SG1, CG(1) through CG(8) and SG2 are charged to 20V. Additionally, since the p-type well (or p-type substrate) is charged to 20V, the data in the memory cell of the unselected blocks will not change.

Of the transistors of the row decoder 5 provided for the above operation, the p-channel transistors located in HV (defined by a broken line) in FIG. 11 are arranged in the n-type well and either the node N1 or the node N2 is held at the potential of VPPRW without fail. Since circuits, each having the configuration of FIG. 11, are arranged as many as the number of the blocks (typically several hundreds to several thousands) in a memory device, the total capacity of all the nodes held to the potential of VPPRW is very large (typically several hundred to several thousand pF), which is by far greater than the capacity of a control gate.

FIG. 12 is a circuit diagram of the data programming/erasing high voltage generating circuit 8 and the intermediate voltage generating circuit 9. The data programming/erasing high voltage generating circuit 8 has a Vpp pump circuit 31 and a 20V limiter circuit 41 for setting the output voltage level of the pump circuit 31 to 20V. The intermediate voltage generating circuit 9 has a VmBL pump circuit 32 and an 8V limiter circuit 42 along with a VmWL pump circuit 33 and a 10V limiter circuit 43. The output node VPP of the Vpp pump circuit 31 and the output node VMBL of the VmBL pump circuit 32 are connected by way of a D-type n-channel MOS transistor Qd1. Similarly, the output node VPP of the Vpp pump circuit 31 and the output node VMWL of the VmWL pump circuit 33 are connected by way of a D-type n-channel MOS transistor Qd2.

Since Signal TRAN is at level "L" at the time of data programming operation (to hold Qd1, Qd2 at an off-state), both the transistors Qd1, Qd2 are at an off-state and the 20V, 8V and 10V limiter circuits 41 through 43 are active so that the VPP, VMBL and VMWL nodes produces different voltages (limited respectively by the limiter circuits). Since signal TRAN is at level "H" for the data erasing operation (a potential level allowing both Qd1, Qd2 to transfer 20V), all the VPP, VMBL and VMWL nodes are in a connected state and, therefore, short-circuit the voltages of the Vpp, VmBL and VmWL pump circuits 31 through 33 and produces the resultant voltage as a data erasing high voltage. At the time of this data erasing operation, since the 8V limiter circuit 42 and the 10V limiter circuit 43 are inactivated and only the 20V limiter circuit 41 connected to the VPP node remains active, all the VPP, VMBL and VMWL nodes are held to 20V.

FIG. 13 shows a circuit diagram of a signal TRAN generating circuit. Signal ERASE in FIG. 13 is at level "H" for the data erasing operation and otherwise it is at level "L".

FIGS. 14A through 14C are schematic circuit diagrams of different limiter circuits of the invention. In FIGS. 14A through 14C, D1 is a device (e.g., Zener diode) that can abruptly allow a large current to flow when the potential difference between the terminals gets to 20V. Because of the provision of this device, the highest potential of the VPP node is limited to 20V. In FIG. 14A, signal /OS is at level "L" when the Vpp pump circuit 31 is ready for producing a voltage higher than Vcc and at level "H" when it is not ready. So, the 20V limiter circuit 41 can be made to operate only in the ready state. FIGS. 14B and 14C shows alternative circuits that can be used for the 20V limiter circuit.

FIGS. 14D and 14E are circuit diagrams of 8V limiter circuits that can be used for the purpose of the invention. (See FIG. 13 for signals TRAN, /TRAN.) D2 is a device that can abruptly allow a large current to flow when the potential difference between the terminals gets to 8V. Because of the provision of this device, the highest potential of the VMBL node is limited to 8V in the data programming operation. Referring to FIGS. 14D and 14E, the transistors Qd4, Qd20 are put into an on-state during the data programming operation by signal TRAN or /TRAN to limit the VMBL node to equal to 8V or less. However, in the data erasing operation, the transistors Qd4, Qd20 are in an off-state to inactivate the transistors Qd4, Qd20 so that no limit is imposed on the potential of the VMBL node. In any of the conventional comparable devices, since the output node of the pump circuit is not connected (FIG. 1) in the data erasing operation, an 8V limiter circuit having a configuration as shown in FIG. 14F can be used. On the other hand, for a device according to the invention, means such as transistors Qd4 and Qd20 has to be provided in order to bring the 8V limiter circuit into an off-state (inactivated) during the data erasing operation.

FIGS. 14G and 14H are schematic circuit diagrams of 10V limiter circuits that can be used for the purpose of the invention. (See FIG. 13 for signals TRAN, /TRAN.) D3 is a device that can abruptly allow a large current to flow when the potential difference between the terminals gets to 10V. Because of the provision of this device, the highest potential of the VMWL node is limited to 10V in the data programming operation. Referring to FIGS. 14G and 14H, the transistors Qd5, Qd21 are put into an on-state during the data programming operation by signal TRAN or /TRAN to limit the VMWL node to equal to 10V or less. However, in the data erasing operation, the transistors Qd5, Qd21 are in an off-state to inactivate the transistors Qd5, Qd21 so that no limit is imposed on the potential of the VMWL node. In any of the conventional comparable devices, since the output node of the pump circuit is not connected (FIG. 1) in the data erasing operation, a 10V limiter circuit having a configuration as shown in FIG. 14I can be used. On the other hand, for a device according to the invention, means such as transistors Qd5 and Qd21 has to be provided in order to bring the 10V limiter circuit into an off-state (inactivated) during the data erasing operation.

FIGS. 15A and 15B are schematic circuit diagrams of devices D1 through D3. These devices have a pn-junction that gives rise to a break down state when the limiting voltage (20V, 8V and 10V respectively for D1, D2 and D2) of the backwardly directed voltage ((A node potential)—(B node potential)). A limiter circuit can be realized for limiting the output node of a pump circuit to a limit voltage by connecting the A node to the output node side and B node to the ground potential side of the pump circuit.

FIG. 16A shows an alternative circuit diagram of the pump circuits, illustrating another possible connection of the output nodes thereof. In this way, the output nodes of the pump circuits can be connected in different ways. FIGS. 16B and 16C show still other alternative connections. In FIG. 16B, Qd6 is inserted between the output node of the VmWL pump circuit 33 and the output node of the Vpp pump circuit 31 and Qd7 is inserted between the input node of the VmWL pump circuit 33 and the output node of the VmBL pump circuit 32. Thus, the VmWL pump circuit 33 and the VmBL pump circuit 32 are connected in series and then connected in parallel to the pump circuit 31 by TRAN. It is particularly advantageous that the number of stages of series-connected circuit of the VmWL pump circuit 33 and the VmBL pump circuit 32 is substantially equal to that of Vpp pump circuit 31 (optimal number of stages to generate 20V). (This will be described in more detail hereinafter.) The circuit arrangement of FIG. 16C is obtained by switching the VmWL pump circuit 33 and the VmBL pump circuit 32 and operates similar to that of FIG. 16B.

Figure 18:
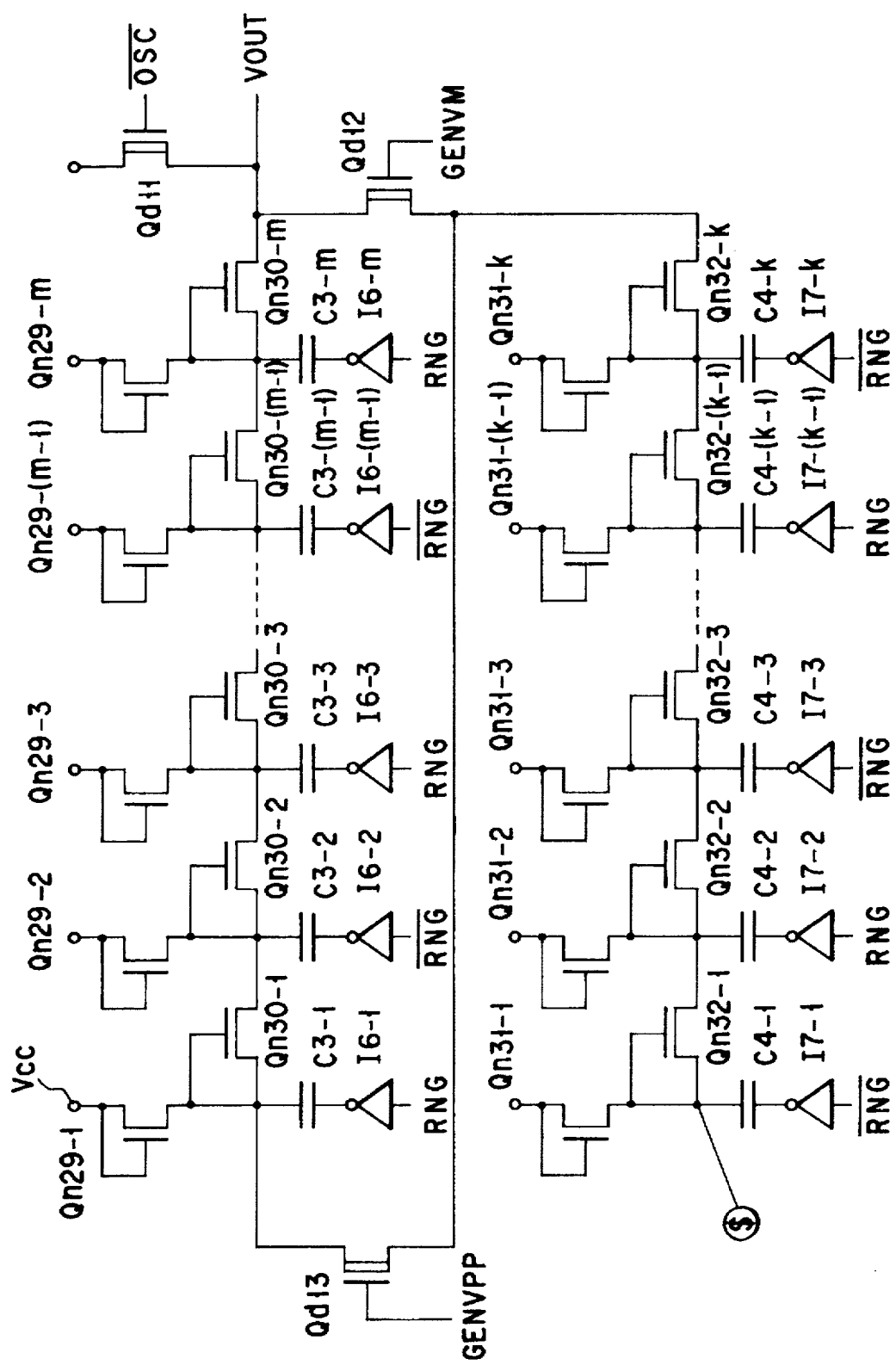
FIG. 18 is circuit diagram of another pump circuit of another embodiment of the invention.

FIGS. 17 through 19 illustrate different circuit configurations that can be used for the pump circuits of FIG. 12. Each of the circuits of FIGS. 17 through 19 comprises a plurality of transistors and capacitors and is designed to generate and supply a voltage higher than Vcc as input signals RNG, /RNG operate at the timings of FIG. 20.

The pump circuit of FIG. 17 comprises a total of n nodes connected in series, to which capacitors are connected, so that it is generally referred to as an n-stage pump circuit. Potential pump circuits are mostly occupied by the pattern of capacitors and the pattern of the remaining devices are much smaller. The optimal number of stages (that minimizes the time required for charging from the power supply voltage to the limiting voltage if the total area of the pattern of the pump circuit or that of the capacitor is given) of this pump circuit varies depending on the limiting voltage and, generally speaking, the higher the limiting voltage, the optimal number of stages increase.

Thus, the optimal number of stages of each of the Vpp, VmBL and VmWL pump circuits (for the limiting voltages of 20V, 8V and 10V respectively) are selected to minimize the time required for charging the related node to the specified voltage or the time required for the data programming operation. The optimal number of stages for Vpp, VmBL, and VmWL may typically be 12, 5 and 6.

However, since the VmBL and VmWL pump circuits according to the invention produces 8V and 10V respectively for the data programming operation and 20V for the data erasing operation, the optimal number of stages differs for each circuit for the data programming operation and for the data erasing operation. Particularly, in the above cited optimal numbers (12, 5 and 6 stages for Vpp, VmBL and VmWL respectively) if FIG. 12 is used, a large number can become more than twice as large as a small number between the intermediate voltage and the high voltage for data erasing.

However, if compared with the conventional technique of using only the data programming/erasing high voltage generating circuit 8 for generating a data erasing high voltage, the time required for charging up to the data erasing high voltage can be remarkably reduced by combining the intermediate voltage generating circuit 9 (the optimal number of stages for generating the intermediate voltage being 5 to 6) and the data programming/erasing high voltage generating circuit 8 (the optimal number of stages for generating 20V being 12) if the optimal number of stages of the intermediate voltage generating circuit 9 is less than half of the optimal number for generating the high voltage as shown in FIG. 12.

So much for the configuration of FIGS. 12 and 17 for the pump circuit for generating an intermediate voltage. Note that the transistor Qd10 is used to set the output node of the pump circuit to Vcc when the pump circuit does not generate a pumping potential and OSC is at level "L" and level "H" respectively when a pumping potential is generated and when it is not generated.

The pump circuit of FIG. 18 with the circuit connection of FIG. 12 can further reduce the time required for charging up to the data erasing high voltage. With the pump circuit of FIG. 18, the number of stages of the pump circuit can be changed depending on operation.

If used with the circuit of FIGS. 12 and 21 (signal ERASE is at level "H" for the data erasing operation and at level "L" otherwise), the number of stages of the pump circuit of FIG. 18 will be (m+k) stages for the data erasing operation because the transistor Qd12 is in an off-state and the transistor Qd13 is in an on-state but m stages and k stages will be arranged in parallel for any other operations because, conversely, the transistor Qd12 is in an on-state and the transistor Qd13 is in an off-state. For example, if m=k=6 for the VmWL pump circuit and m=k=5 for the VmBL pump circuit, the VmWL and VmBL pump circuits will respectively have a two 6-stage parallel pump circuit configuration and a two 5-stage parallel pump circuit configuration to maintain the optimal numbers of stages, while the time required for charging up to the intermediate voltages for the data programming operation is minimized.

For the data erasing operation, on the other hand, the VmWL and VmBL pump circuits respectively becomes to show 12 stages and 10 stages respectively. Note that the number of stages of the VmWL pump circuit is optimal for generating 20V, whereas that of the VmBL pump circuit is 10 or only slightly less than the optimal number of 12 for generating 20V. Thus, if compared with the arrangement of FIG. 17 for the intermediate voltage generating circuit 9, the data programming high voltage can be generated and supplied with a number of stages close to the optimal number of stages for generating 20V with the arrangement of FIG. 18 so that the current supplying capacity of the intermediate voltage generating circuit 9 for the data erasing high voltage charging operation is remarkably increased to reduce the time required for that operation.

While m=k=6 and m=k=5 are assumed respectively for the VmWL pump circuit and the VmBL pump circuit in the above description, the use of other values for the VmWL and VmBL pump circuits such as m=5 and k=5 can also reduce the time required for intermediate voltage and high voltage charging by changing the number of stages of the pump circuits for the data programming operation. Note that the D-type n-channel MOS transistors Qd12 and Qd13 of FIG. 18 are replaced by E-type p-channel MOS transistors Qd26 and Qd27 in FIG. 19, although the circuit of FIG. 19 operates similarly as that of FIG. 18.

As described above, if compared with the case of the conventional technique of generating a data erasing high voltage only by means of a data programming/erasing high voltage generating circuit 8, the additional use of an intermediate voltage generating circuit 8 (with the number of stages of 5 to 6 optimally selected for the generation of an intermediate voltage) in combination with a data programming/erasing high voltage generating circuit 8 (with the number of stages of 12 optimally selected fro the generation of 20V) as shown in FIG. 12 can remarkably reduce the time required for the generation of a data erasing high voltage, even if the number of stages of the former is less than half of that of the latter. Since the circuit of FIG. 17 has an advantage of being capable of omitting the D-type n-channel transistors Qd12 and Qd13 and the circuit of FIG. 21 if compared with the circuit of FIG. 18, the circuit of FIG. 17 may effectively be used depending on the application.

While a high speed data erasing operation is made possible by a device according to the invention, it is accompanied by a disadvantage of an increased number of components including transistors such as Qd1, Qd2 in FIG. 12 and circuits such as the one shown in FIG. 13. However, the net increase in the pattern area due to such additional components is very small relative to the pattern area of the pump circuits for the intermediate voltages and the data programming/erasing high voltage. In other words, if compared with the case of striving for a high speed data erasing operation or a reduction in the time required for data erasing high voltage charging comparable to the level of achievement of the present invention by using a convention memory device, the net increase of the pattern area for the purpose of the present invention is negligible.

FIGS. 16B and 16C show circuit arrangements for changing the number of stages that are different from those of FIGS. 12, 18 and 19. With the arrangements of FIGS. 16B and 16C, where the VmBL and VmWL pump circuits 32 and 33 respectively have 5 and 6 stages, the VmWL pump circuit 33 and the VmBL pump circuit 32 are connected in series only for the data erasing operation. The output node of either one of the VmWL pump circuit 33 and the VmBL pump circuit 32 is connected to the input node of the other circuit (e.g., the one indicated by ($) in FIGS. 16B, 16C, 17, 18 and 19). If a structure of FIG. 17 is used in place of FIGS. 16A and 16B, the pump circuits respectively having 6 and 5 stages and hence produces different voltages for the data programming operation are connected in series for the data programming operation to provide a pump circuit having 11 stages for generating and supplying a data programming high voltage.

With this technique again, the combined pump circuit having 11 stages obviously has a current supplying capacity for the data programming high voltage close to a circuit with 12 stages that is optimal for generating 20V for the data erasing operation and hence can reduce the time required for the data erasing high voltage if compared with the use of the VmWL pump circuit having 6 stages and the VmBL pump circuit 32 having 5 stages without connecting in series for the intermediate voltage generating circuit 9. It may be needless to say, with this arrangement, the 8V and 10V limiter circuits 42, 43 are inactivated for data erasing high voltage charging.

Now, the operation of the section in FIG. 8 indicated by (#) will be described. FIG. 22A shows a data erasing high voltage discharge circuit 10 for operating the section indicated by (#). Note that the nodes Cell-Source and Cell-p-well in FIG. 22A are also shown in FIGS. 7 and 8 and the nodes CG1 through CG8, SGD, SGS and Vuss in FIG. 22A are also shown in FIG. 11. With this arrangement, CG1 through CG8 are connected to all the control gates of the unselected blocks (=all control gates charged to 20V during the data erasing operation) and SGD and SGS are commonly connected to all the selection gates of the unselected blocks, while Vuss is connected to a pair of selection gates of the selected block.

As for the operation of the section indicated by (#) in FIG. 8, the node to which the data erasing high voltage 20V is applied in the data erasing operation is discharged and, all the nodes showing a voltage close to 20V are discharged in order to avoid erroneous and destructive accidents due to differences in the electric potential among the nodes (except the bit line, which is not discharged because it is in a floating state but its potential falls as a result of capacitive coupling with nodes close to the bit line when the potential of many nodes in the memory cells falls from 20V).

When the above described electric discharge takes place in the circuit of FIG. 22A, signal ERCVH goes to 20V and signal ERCV goes to Vcc for discharging. Signal ERCV is brought not to 20V but to Vcc in order to make the transistor Qn51 show a large resistance so that the potential differences among the nodes may be minimized and the node N3 may be electrically discharged slowly in the discharging period.

Thus, during this operation, if the E-type n-channel MOS transistors Qn39 through Qn49 operate as triodes, the nodes CG1 through CG8, SGD, SGS, Cell-p-well and Cell-Source do not substantially show any potential difference relative to the intermediate node N3 that is electrically being discharged.

If the E-type n-channel MOS transistors Qn39 through Qn49 has a threshold voltage of 5V, the node CG1, for example, and the node N3 that is electrically being discharged do not get to a same potential because signal ERCVH is at 20V and the transistor Qn39 is operating as a pentode until the voltage of the node CG1 falls from 20V to 15V (as the inversion layer extending from the source side diffusion layer to the channel surface does not get to the drain side diffusion layer).

The above statement also applies to the nodes CG2 through CG8, SGD, SGS and Cell-p-well and, therefore, a potential difference of about up to 5V (or the potential difference when the node with the fastest electric discharge and the one with the slowest electric discharge are at 20V and 15V respectively) that can become apparent among the nodes CG1 through CG8, SGD, SGS and Cell-p-well would not give rise to any problem.

Figure 2:
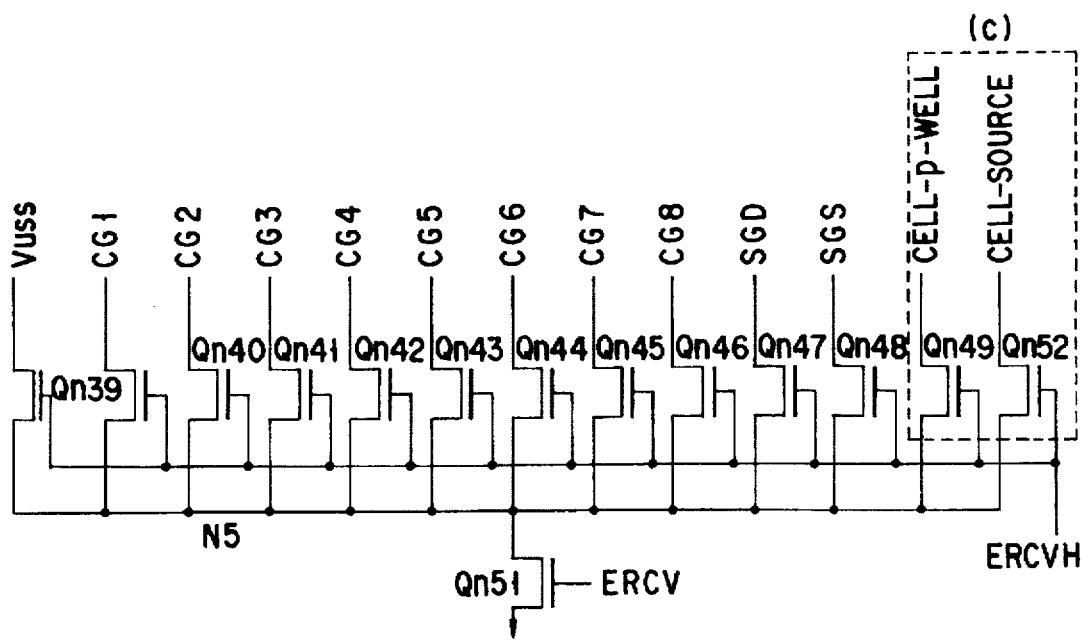
FIG. 2 is a circuit diagram of a conventional data erasing high voltage discharging circuit.

If, on the other hand, the discharge circuit of FIG. 2 is used, the node Cell-p-well is connected to a node that is electrically being discharged (node N5 in FIG. 2) by way of a single transistor as shown in section (c) of FIG. 2, a potential difference of 5V can appear between the node Cell-Source and the node Cell-p-well. Particularly, when the nodes Cell-Source and Cell-p-well have high potentials, an electric current flows along the forward direction of pn-junction between the n$^+$ diffusion layer that operates as the node of the source line of the memory cell and the node Cell-p-well. Then, an electric current can flow into the parasitic bipolar thyristor due to the electric current flowing along the forward direction of pn-junction to give rise to a latch-up phenomenon as described earlier by referring to the timing chart of FIG. 8 and the operation of electrically charging the nodes Cell-Source and Cell-p-well to Vcc.

In order to avoid this risk, the node Cell-Source is connected to the Cell-p-well by way of a transistor Qn50 in the circuit of (a) in FIG. 22A. With this arrangement, the potential of the node Cell-Source never falls under that of the Cell-p-well even if the node Cell-p-well is electrically discharged at a low rate and, therefore, the occurrence of a latch-up phenomenon can be prevented to make the data erasing operation more reliable.

The circuit of FIG. 22A can be modified in various ways. For example, the circuit of FIG. 22B can also be used to prevent the potential of the node Cell-Source goes under that of the node Cell-p-well during the operation of discharging the data erasing high voltage. Still alternatively, the circuit of FIG. 22C can be used in place of that of (b) of FIG. 22A or of FIG. 22B. Note that signal /ERCV goes to level "L" during the operation of discharging the data erasing high voltage. It will be understood that other modifications are also possible.

While two different intermediate voltages of 10V and 8V are used for the data programming operation in the above embodiment, the principle of the present invention can be applied to cases where only one intermediate voltage is used for the data programming operation. By combining a intermediate voltage generating circuit and a data programming/erasing high voltage generating circuit, the time required for charging the data programming high voltage can be reduced more than any conventional comparable devices without increasing the surface area of the chip. FIG. 25 shows an embodiment having a single intermediate potential of VmWL for the data programming operation.

As described earlier, the potential of the nodes, or VL1, after the electric discharge brought forth by the (#) section of the circuit of FIG. 8 is substantially equal to Vcc in the above described embodiment. However, a higher voltage may alternatively be used so long as it does not entail any erroneous programming nor erasing (e.g., 10V or less).

In the circuits of FIGS. 12 and 16A through 16C, only 8V and 10V limiter circuits are respectively connected to the nodes VMBL and VMWL. However, if a 20V limiter circuit is additionally connected to either or both of the nodes VMBL and VMWL in FIGS. 12 and 16A and if a 20V limiter circuit is additionally connected to the node VMWL in FIG. 16B and if a 20V limiter circuit is additionally connected to the node VMBL in FIG. 16C and the added 20V limiter circuit (as indicated by ·X· in FIG. 23A, and a structure is shown in FIGS. 24A and 24B) is arranged only to participate the data erasing operation, these circuits operate in a manner as described above.

FIG. 23A illustrates a circuit realized by adding 20V limiter circuits to the circuit of FIG. 12. This modified circuit has the following advantage. Since the circuit of FIG. 12 has a single 20V limiter circuit, it has to be used for the data programming and data erasing operations where the current supply rates for the data programming/erasing high voltage differ. With the circuit of FIG. 23A, to the contrary, where an additional 20V limiter circuit is used only for the data erasing operation, the voltage limiting ability of the limiter circuits can be enhanced for the data erasing operation and they can be adapted to any increase in the current supply rate for the data erasing operation. In other words, the circuit of FIG. 23A is provided with an optimal voltage limiting ability with regard to the current supplying capacity of the pump circuit to produce voltages that are appropriately limited on a stable basis.

The supply of stably limited voltages can be realized also by a circuit realized by adding a second 20V limiter circuit that functions only for the data erasing operation (the 20V limiter circuit indicated by ·X· in FIG. 23B, and a structure is shown in FIGS. 24A and 24B) to the node VPP in addition to the 20V limiter circuit that functions for both data programming and data erasing operations (corresponds to the 20V limiter circuit in FIGS. 12 and 16A through 16C).

FIG. 23B shows such a circuit realized by using an additional 20V limiter circuit to the circuit of FIG. 12. FIGS. 24A and 24B shows circuit diagrams of the 20V limiter circuits used respectively in the circuits of FIGS. 23A and 23B (indicated by ·X·). Note the signals shown in FIGS. 23A and 23B are same as those in FIGS. 12 and 13.

The present invention is not limited to a pump circuit that generates a potential higher than Vcc and can be effectively used for circuit arrangements where a plurality of negative voltage generating circuits are arranged by replacing the n-channel MOS transistors of FIGS. 17 through 19 are replaced by p-channel MOS transistors so that the outputs of the different negative voltage generating circuits can be switched for connection and disconnection with a plurality of switching actions or the number of stages for generating voltages can be switched with a plurality of switching actions.

While the present invention is described in terms of shifting the output nodes of and changing the configuration of the intermediate voltage generating circuits in the data programming operation in the above embodiment, the above embodiment can be modified in many more different ways. For instance, if there is a pump circuit for generating a voltage higher than Vcc in the operation of reading data from memory cells, the connection between the output node of the data reading high voltage generating circuit and any of those of the intermediate voltage generating circuits and data programming/erasing high voltage generating circuits and the configuration of the data reading high voltage generating circuit can be changed. If the circuit is combined with an intermediate voltage generating circuit, the capacity of generating an intermediate voltage and supplying an electric current can be improved for the data programming operation to reduce the time required for intermediate voltage charging. If it is combined with a data programming/erasing high voltage generating circuit, the time required for high voltage charging for the purpose of data erasing can be further reduced in the data programming/erasing operation. In this way, a high speed data programming/erasing operation can be realized by using a data reading high voltage generating circuit.

Now, embodiments adapted to the existence of a pump circuit for generating a voltage higher than Vcc for the data reading will be described.

Figure 26:
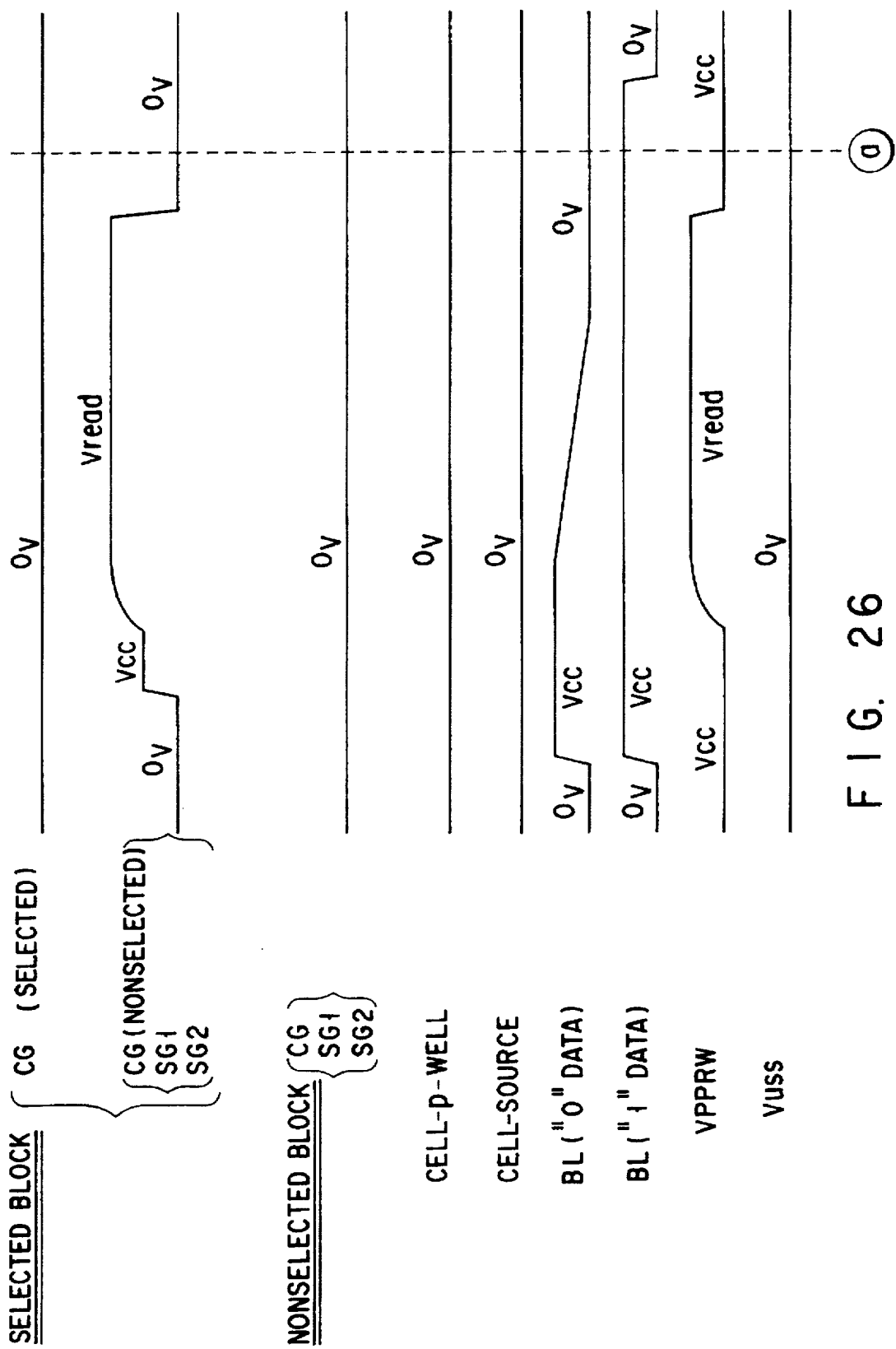
FIG. 26 is a timing chart of the data reading operation of an embodiment of the invention.

FIG. 26 is a timing chart for data reading operation. Note that the use of the row decoder circuit of FIG. 11 is assumed for the timing chart of FIG. 26 to generate a voltage Vread (=4.5V) which is higher than Vcc in the chip. It is also assumed that the chip comprises a data reading high voltage (Vread) pump circuit, a data programming/erasing high voltage (Vread) generating circuit and a data programming intermediate voltage (Vmw1) generating circuit.

FIGS. 27A through 27E show block diagrams of still another embodiment having an NAND cell EEPROM system configuration. These embodiments are different from that of FIG. 3 in that the data programming/erasing high voltage generating circuit 8 and/or the intermediate voltage generating circuit 9 of the embodiment of FIG. 3 are modified.

In the embodiment of FIG. 27A, the data programming/erasing high voltage generating circuit 9 of the embodiment of FIG. 3 is replaced by a data programming/erasing high voltage generating circuit 44 and the arrow directed from the intermediate voltage generating circuit 9 to the high voltage generating circuit in FIG. 3 is removed. The data programming/erasing high voltage generating circuit 44 is designed to generate and supply a data programming/erasing voltage (Vpp=20V) to be applied to memory cells in order to write data into and erase data from the memory cells for a data programming/erasing operation and also to generate and supply a data reading high voltage (Vread=4.5V) to be applied to memory cells in order to read data from the memory cells for a data reading operation. The intermediate voltage generating circuit 9 generate and supply an intermediate voltage (Vmwl=10V) to be applied to memory cells and bit lines for a data programming operation.

Figure 27B:
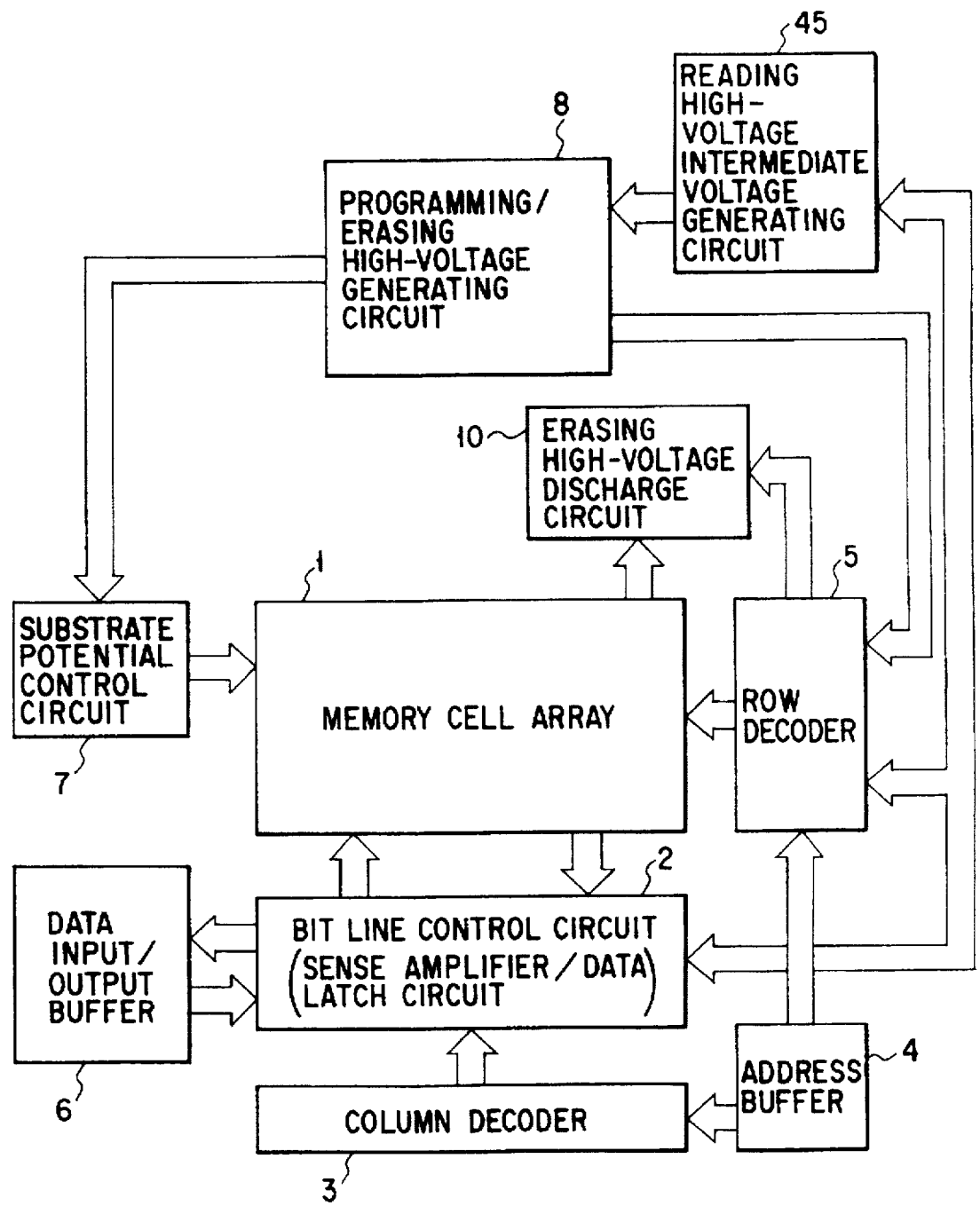

In the embodiment of FIG. 27B, the intermediate voltage generating circuit 9 of FIG. 3 is replaced by a data reading high voltage/intermediate voltage generating circuit 45. This data reading high voltage/intermediate voltage generating circuit 45 is designed to generate and supply an intermediate voltage (Vmwl=10V) to be applied to memory cells and bit lines and also to generate and supply a data reading high voltage (Vread=4.5V) to be applied to memory cells in order to read data from the memory cells for a data reading operation. It is also connected to the data programming/erasing high voltage generating circuit 8 to generate and supply a data erasing high voltage with the data programming/erasing high voltage generating circuit for a data erasing operation.

Figure 27C:
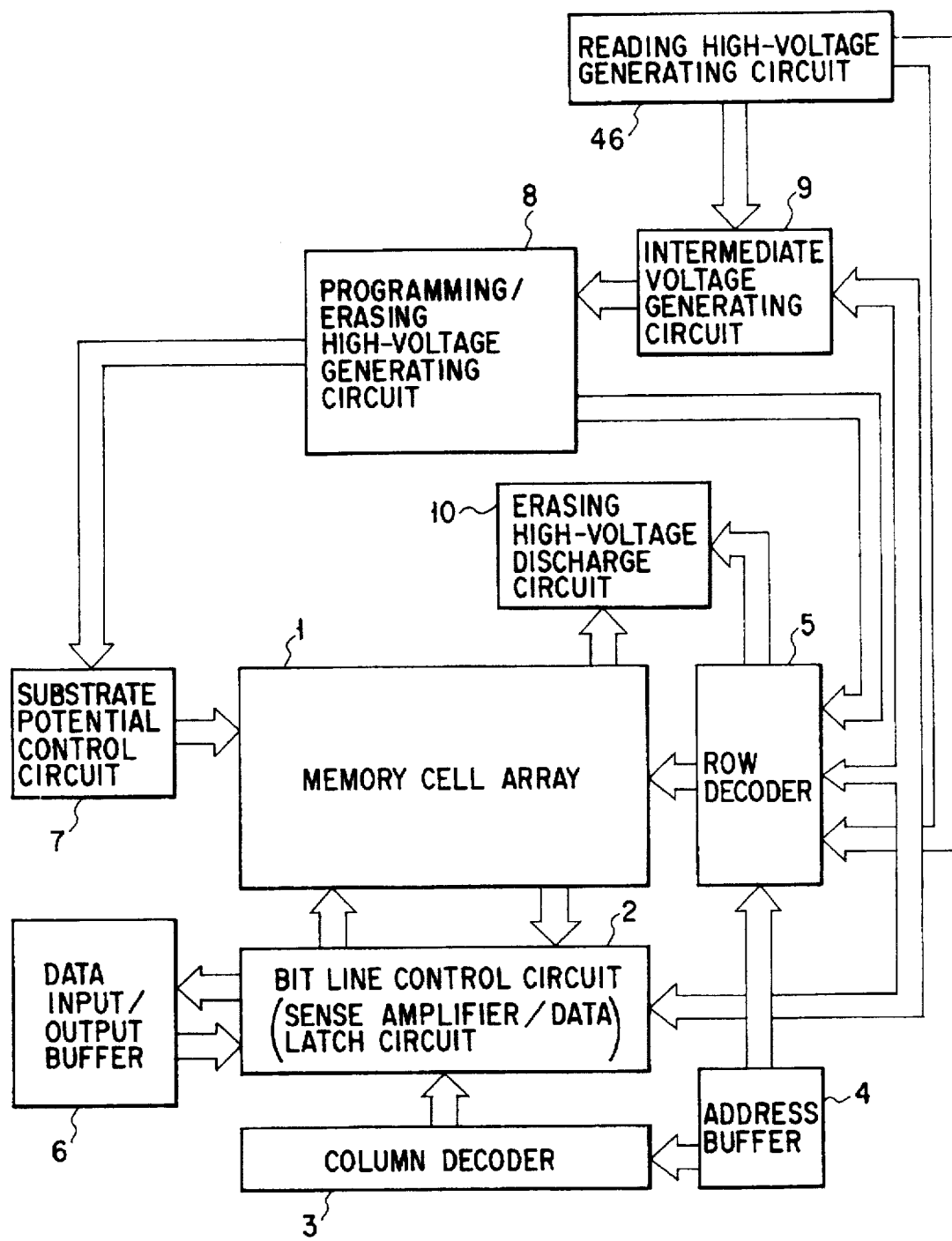
Figure 27D:
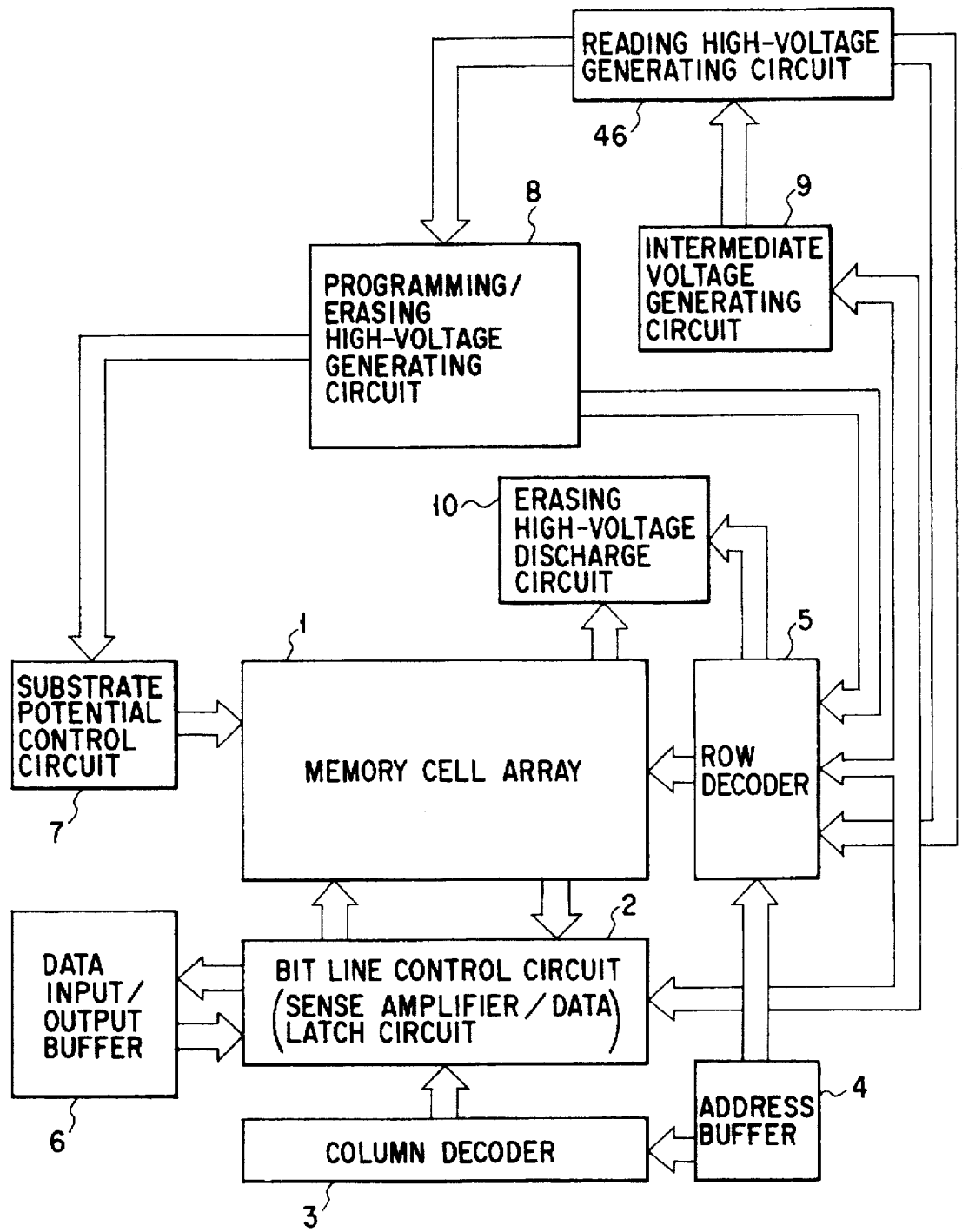

The embodiments of FIGS. 27C, 27D and 27E are realized by adding a data reading high voltage generating circuit to that of FIG. 3. This data reading high voltage generating circuit 46 is designed to generate and supply a data reading high voltage (Vread=4.5V) to be applied to memory cells in order to read data from the memory cells for a data reading operation and also to be connected to the intermediate voltage high voltage generating circuit 9 and the data programming/erasing high voltage generating circuit 8 in order to generate and supply a data erasing high voltage for a data erasing operation.

FIGS. 28A through 28E are circuit diagrams that can be used for connecting the high voltage and intermediate voltage generating circuits of the embodiments of FIGS. 27A through 27E respectively. Note that the signals, the transistors and the limiter circuits of FIGS. 28A through 28E operates same as their counterparts of FIGS. 12, 16A through 16C and 23.

Figure 33:
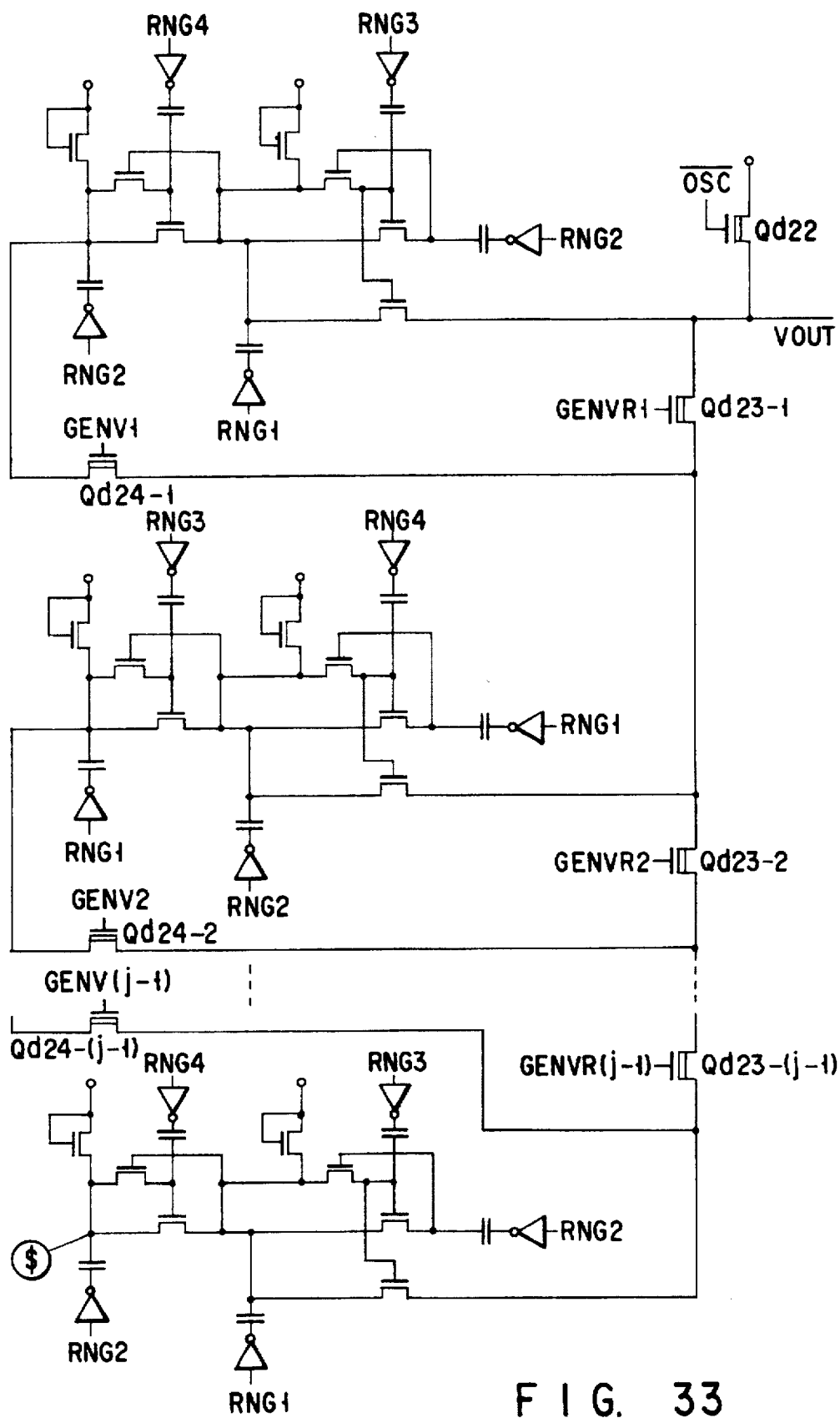
FIG. 33 is a circuit diagram of still another pump circuit of still another embodiment.

The circuit of FIG. 28A is designed to generate a 4.5V and a 20V by means of a same pump circuit and therefore a 4.5V limiter circuit that operates for the data reading operation and a 20V limiter circuit that operates for the data erasing operation are connected to the output node of the pump circuit 47. The pump circuit 47 may have a circuit configuration as shown in FIG. 17 and, if such is the case, a number of stages suited for generating a 20V is preferably used for the circuit. Alternatively, the pump circuit 47 may have a circuit configuration with a variable number of stages (capable of providing two different numbers of stages) as shown in FIGS. 18 or 19 or that of FIG. 29 (capable of providing three different numbers of stages). For example, two stages may be used for the data reading-in operation and twelve stages may be used for the data reading-out operation to make the circuit optimally adapted to the output voltage. Note that, with the pump circuit of FIG. 29, two stages may be selected as minimal number of stages by controlling signals GENV1 through GENV(j−1) and signals GENVR1 through GENVR(j−1) (wherein signals GENV1 through GENV(j−1) are made equal to 0V and signals GENVR1 through GENVR(j−1) are made equal to VOUT) and (2×j) stages may be selected as maximal number of stages, all of which are connected in series (wherein signals GENV1 through GENV(j−1) are made equal to VOUT and signals GENVR1 through GENVR(j−1) are made equal to 0V) also by controlling the signals. Alternatively, different numbers of stages may be selected for the pump circuit of FIG. 29 by appropriately selecting values for signals GENV1 through GENV(j−1) and signals GENVR1 through GENVR(j−1). While two is used as minimal number of stages in FIG. 29 and in FIG. 33 which will be described hereinafter, the present invention is not limited thereto and one or three or more than three may alternatively be used as minimal number of stages.

The circuit of FIG. 28B is designed to generate a 4.5V and a 10V by means of a same pump circuit and therefore a 4.5V limiter circuit that operates for the data reading operation and a 10V limiter circuit that operates for the data programming operation are connected to the output node of the pump circuit 49. The pump circuit 49 may have a circuit configuration of FIG. 17 or that of FIGS. 18, 19 or 29 having a variable number of stages. In the case of the latter, an optimal number of stages can always be used depending on the output voltage.

Figure 29:
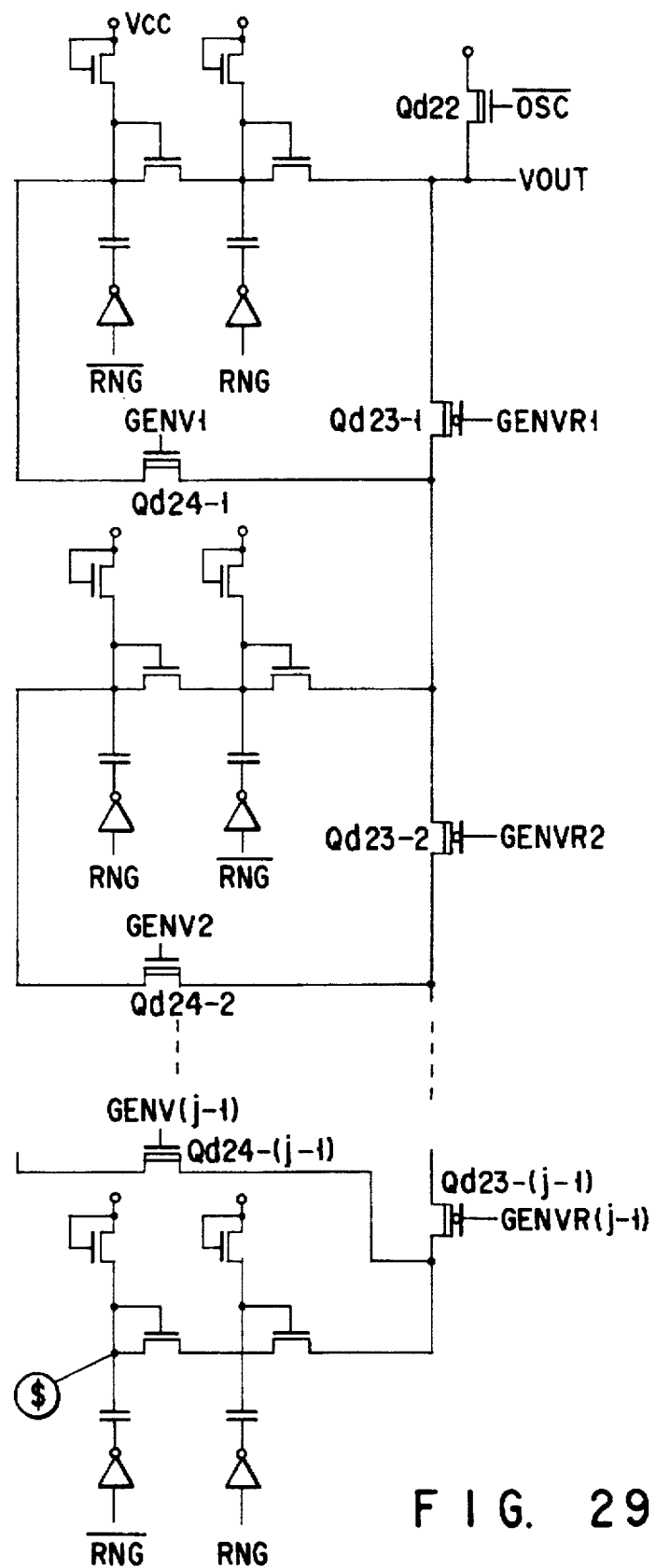
FIG. 29 is a circuit diagram of the pump circuit of still another embodiment.

In the circuits of FIGS. 28C and 28D, the Vread pump circuit and Vmwl pump circuit are connected in series for the data erasing operation to generate a data erasing high voltage with the Vpp pump circuit. The circuit arrangements of these circuits are similar to those of FIGS. 16B and 16C respectively. Here again, the arrangement of pump circuits 33 and 50 of FIG. 17 may be replaced by that of FIGS. 18, 19 or 29 (variable number of stages). If the circuit of FIGS. 18, 19 or 29 is used, the number of stages of the pump circuits connected in series (the sum of the number of stages of the pump circuit 33 and that of the pump circuit 50) can be finely regulated to realize a number of stages optimally adapted to the output voltage. For example, by varying a number of stages of Vread, VmWL pump circuit in a series-connection and in a nonseries-connection such that the number of stages of Vread pump circuit is two stages in a nonseries-connection and is four stages in a series-connection, a fine adjustment of the number of stages can be preformed.

The circuit of FIG. 28E is similar to that of floating gate 12, where a high speed data erasing high voltage charging can be realized by connecting the output nodes of three different pump circuits for the data erasing operation. Here again, the arrangement of pump circuits 33 and 50 of FIG. 17 may be replaced by that of FIGS. 18, 19 or 29 (variable number of stages). If the circuit of FIGS. 18, 19 or 29 is used, the number of stages can be optimally adapted to the output voltage.

Figure 32:
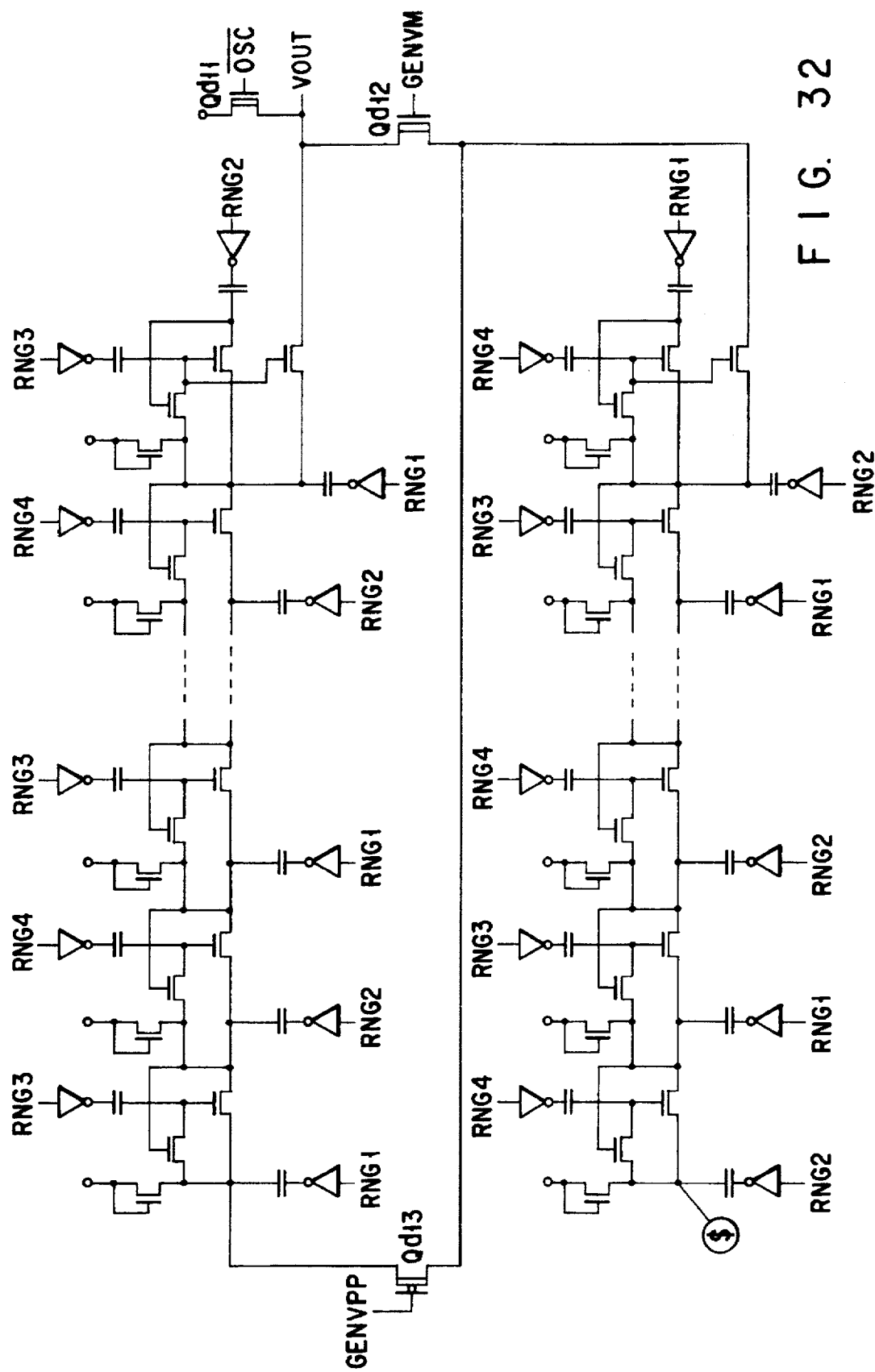
FIG. 32 is a circuit diagram of another pump circuit of still another embodiment.

While the arrangement of pump circuits according to the invention is described by referring to examples where the circuits are controlled by two pump circuit drive signals RING, /RING (See the timing chart of FIG. 20) as shown in FIGS. 17, 18, 19 and 29, the present invention is not limited thereto and various different arrangements are possible for the purpose of the invention. For example, the pump circuit (2-phase signal drive type pump circuit) shown in FIG. 20 and controlled by two pump circuit drive signals can be replaced by a pump circuit (4-phase signal drive type pump circuit) shown in FIG. 30 and controlled by four different pump circuit drive signals RING1 through RING4 for the purpose of the invention. When a 4-phase signal drive type pump circuit is used, the circuit configuration of the pump circuit shown in FIGS. 17, 18 and 29 will be replaced by those shown in FIGS. 31, 32 and 33 respectively.

In a pump circuit with a variable number of stages as illustrated in FIGS. 18, 19, 20, 32 or 33, D-type transistors and/or p-channel transistors are used to change the circuit configuration of the pump circuit or, more specifically, to change the number of stages in the single pump circuit. They are Qd12 and Qd13 in FIGS. 12 and 13, Qp26 and Qp27 in FIG. 19 and Qd12-1 through Qd23(j−1) and Qd24-1 through Qd24-(j−1) in FIGS. 29 and 33. The number of stages of the pump circuit is changed by controlling the gate voltages of these transistors by means of a control circuit as shown in FIG. 17. However, the present invention is not limited to the above described arrangements, which may be modified in various ways. Additionally, the circuits as shown in FIGS. 34A through 34E, 35A and 35B can also be effectively used as the above described ones in order to realize a variable number of stages.

While any of the above described pump circuits has a single output node, a pump circuit according to the invention may alternatively have two or more than two output nodes. The pump circuits shown in FIGS. 34A, 34B and 35A have two output nodes.

Figure 34A:
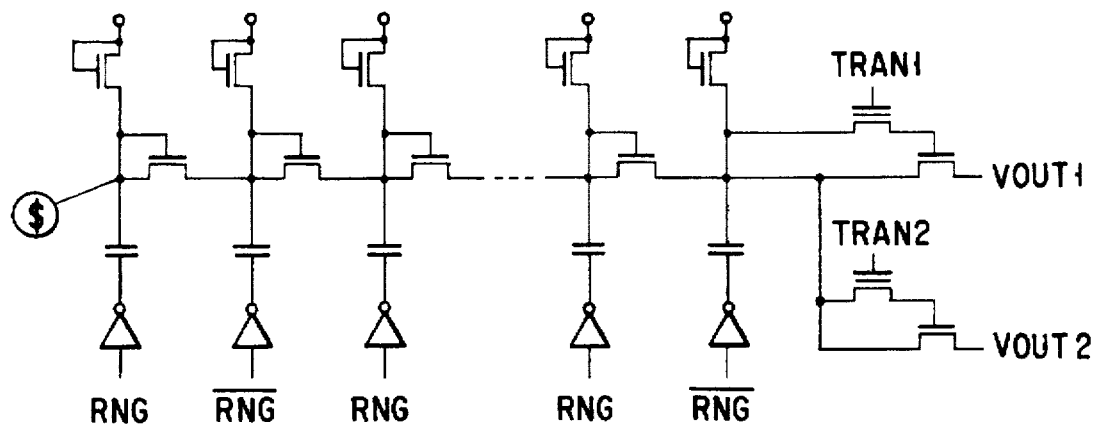
Figure 34B:
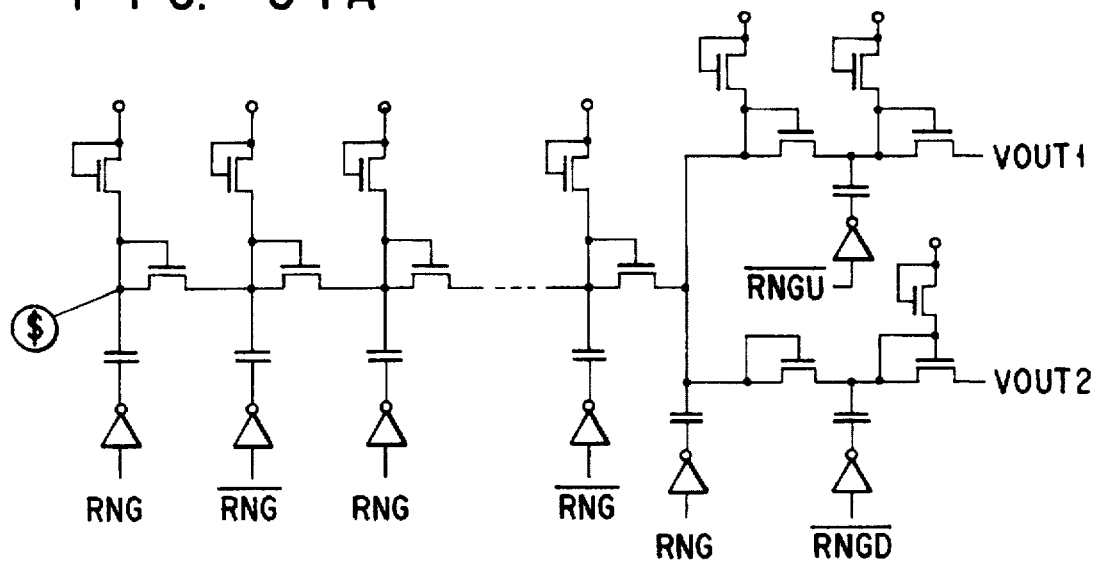
Figures 34C, 34D:
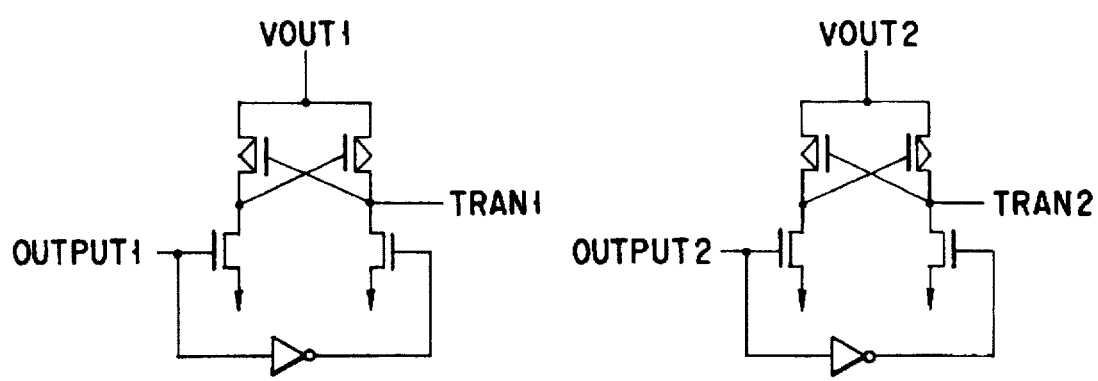

FIGS. 34A and 34B show a 2-phase signal drive type pump circuit. In FIG. 34A, one of VOUT1 and VOUT2 is selected as the output node for producing a voltage by bringing one of signals TRAN1 and TRAN2 given to the gate electrode of a D-type transistor to level "H". In FIG. 34B, one of VOUT1 and VOUT2 is selected as the output node for producing a voltage by making one of signals /RUNGU and /RUNGD active. FIGS. 34C and 34D show control circuits that can be used for signals TRNA1 and TRAN2 of the circuit of FIG. 34A. FIG. 34E shows control circuit for signals /RUNGU and /RUNGD of FIG. 34B. If VOUT1 is selected as the output node, signals output1 and output2 are brought respectively to "H" and "L". If, on the other hand, VOUT2 is selected as the output node, signals output1 and output2 are brought respectively to "L" and "H". The timing chart of FIG. 34F applies to the output node of VOUT1 and that of FIG. 34G applies to the output node of VOUT2 so that, as will be seen, the selection of output node is carried out properly.

Figure 35A:
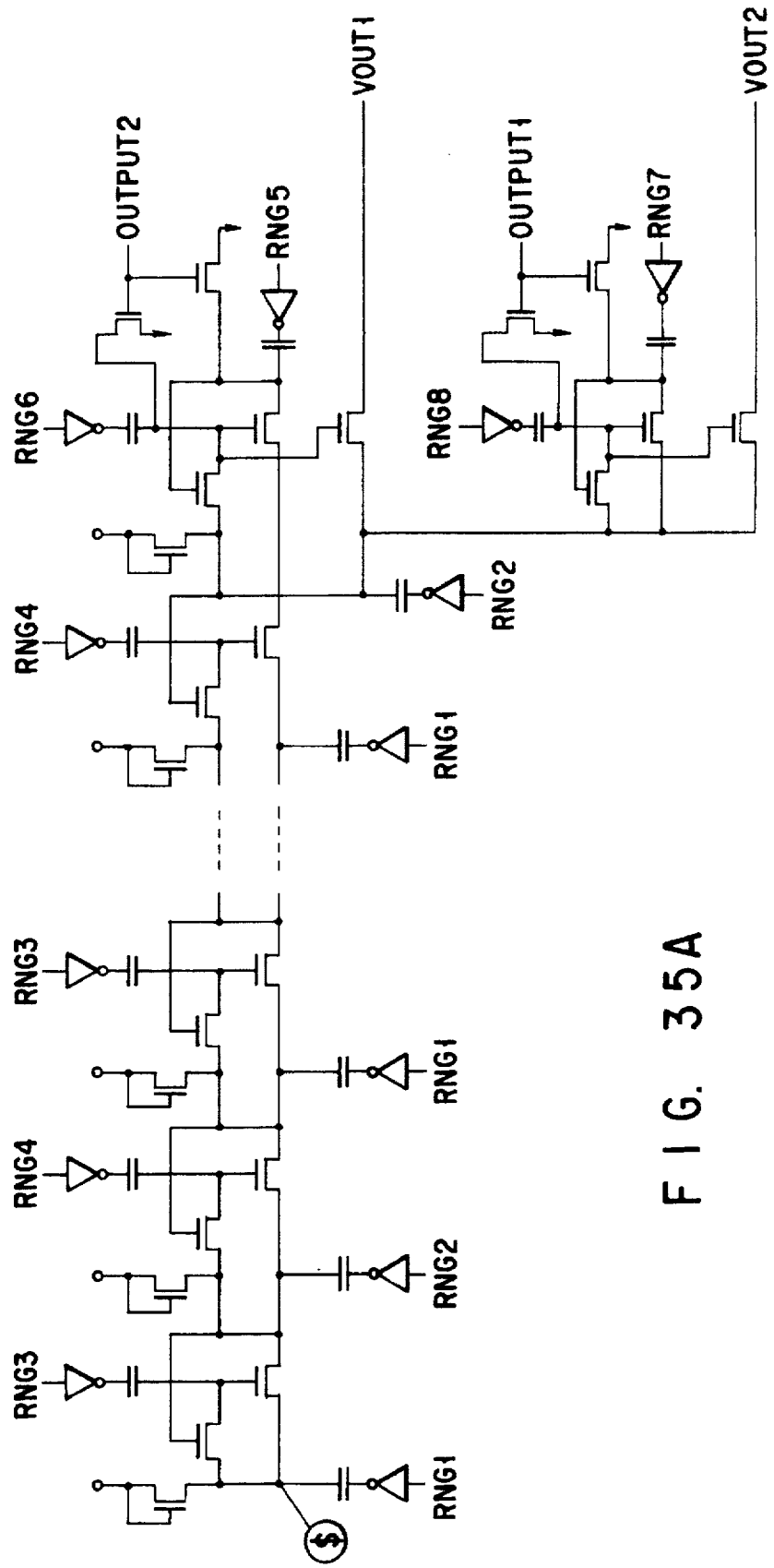
FIGS. 35A through 35D are circuit diagrams of other variable stage pump circuits and timing charts of their operations that can be used for the purpose of the invention.
Figure 35B:
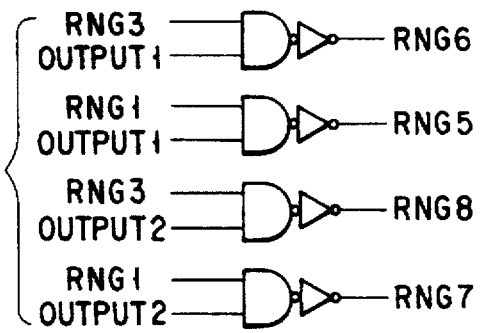
Figure 35C:
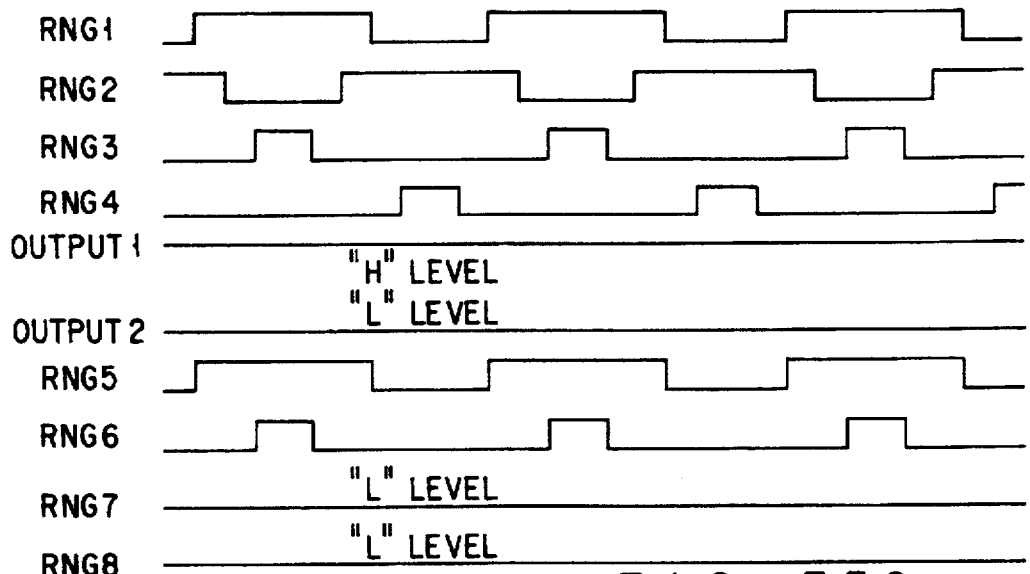
Figure 35D:
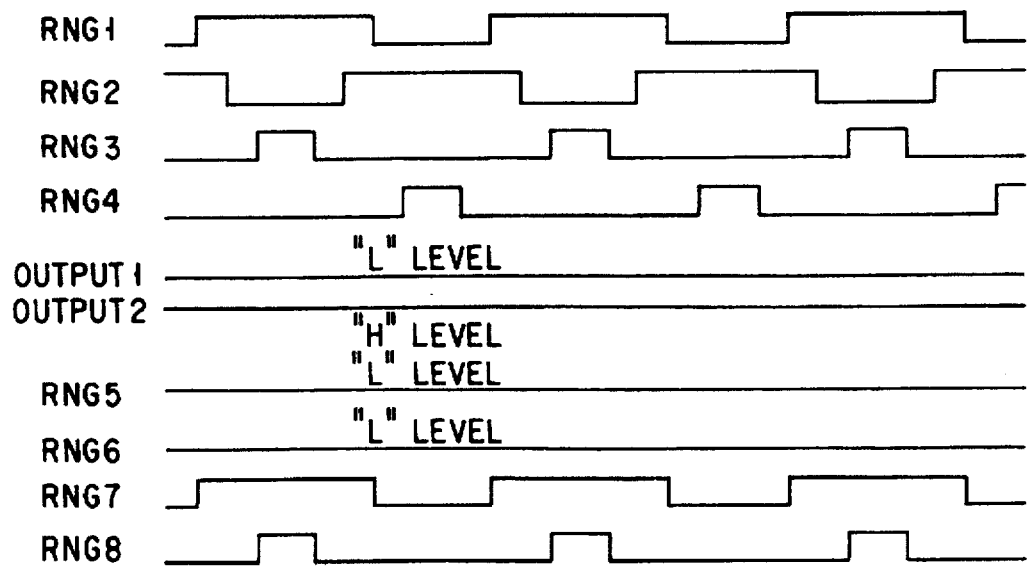

FIG. 35A shows a 4-phase signal drive type pump circuit. With this circuit, one of VOUT1 and VOUT2 is selected as the output node for producing a controlled voltage by means of signals output1, output2, RNG5, RNG6, RNG7 and RNG8. Note that, if the output node of VOUT1 is selected, signals output1 and output2 are brought respectively to "H" and "L" and, if the output node of VOUT2 is selected, signals output1 and output2 are brought respectively to "L" and "H". The timing chart of FIG. 35C applies to the output node of VOUT1 and that of FIG. 35D applies to the output node of VOUT2 so that, as will be seen, the selection of output node is carried out properly.

A pump circuit having two output nodes as shown in FIGS. 34A, 34B and 35A will be indicated by a symbol of FIG. 36. Similarly, a pump circuit having three output node is indicated by a symbol shown in FIG. 36B. Note that ($), VOUT1 and VOUT2 in FIG. 36A are same as those in FIGS. 34A, 34B and 35A.

Figure 37C:
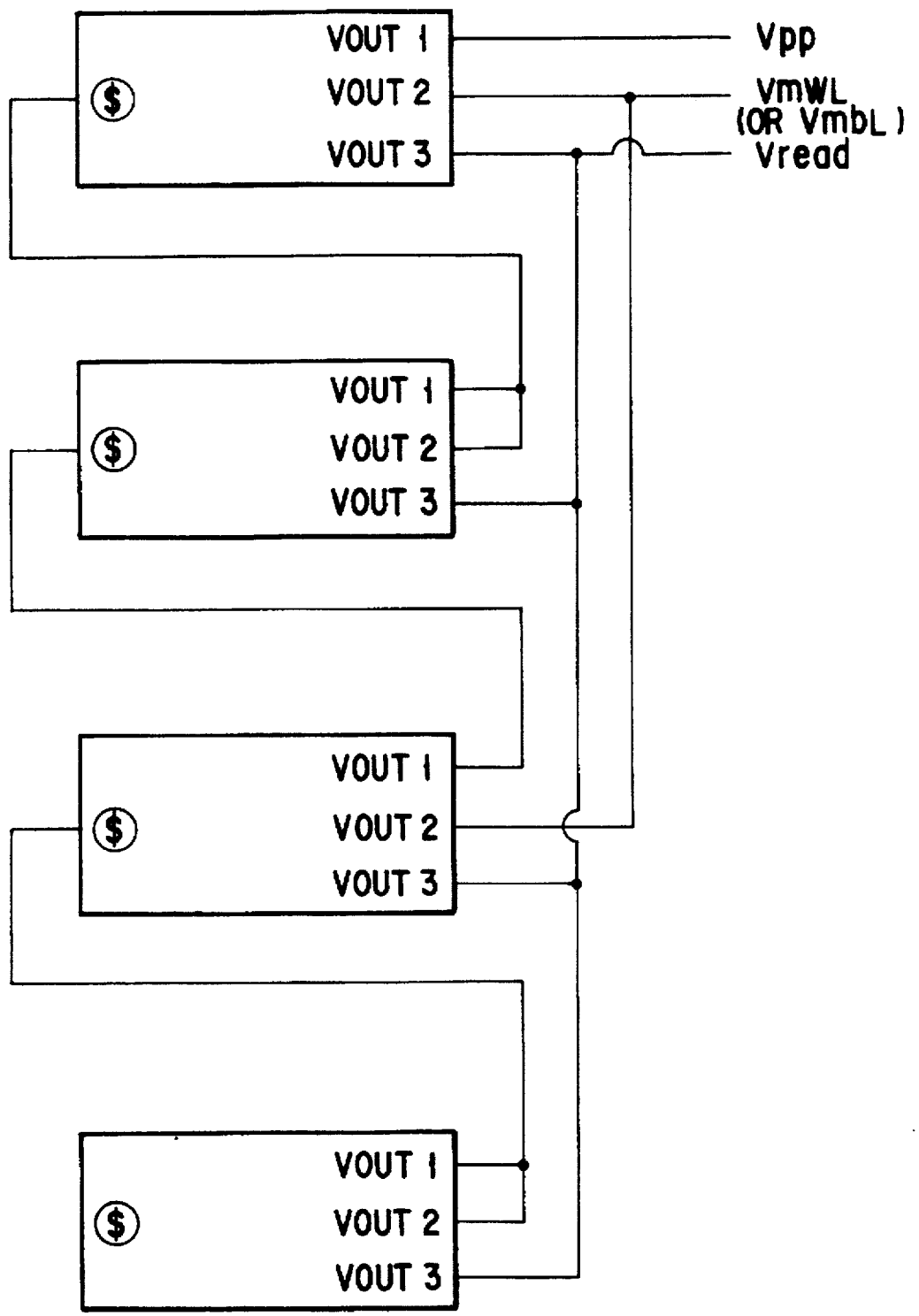

A pump circuit having selectable numbers of stages as shown in FIGS. 18 and 29 can be realized by using a pump circuit having two output nodes. The circuit of FIG. 37A applies to FIG. 18, whereas that of FIG. 37B applied to FIG. 29. Pump circuits as shown in FIGS. 37A and 37B are characterized in that the number of stages of the pump circuit varies depending on if the voltage output node of VOUT1 is selected (to produce potential Vpp) or that of VOUT2 is selected (to produce potential Vmwl, Vmbl or Vread). For example, the number of stages will be twelve if VOUT1 is selected, whereas it will be six if VOUT2 is selected (two 6-stage circuits being connected in series). Similarly, by using a pump circuit having three output nodes as shown in FIG. 37C, for example, three stages at Vread output operation, six stages at VmWL output operation and twelve stages at Vpp output operation can be realized. Thus, a pump circuit with a variable number of stages can be realized by using a pump circuit having two or more than two output nodes.

Figure 38C:
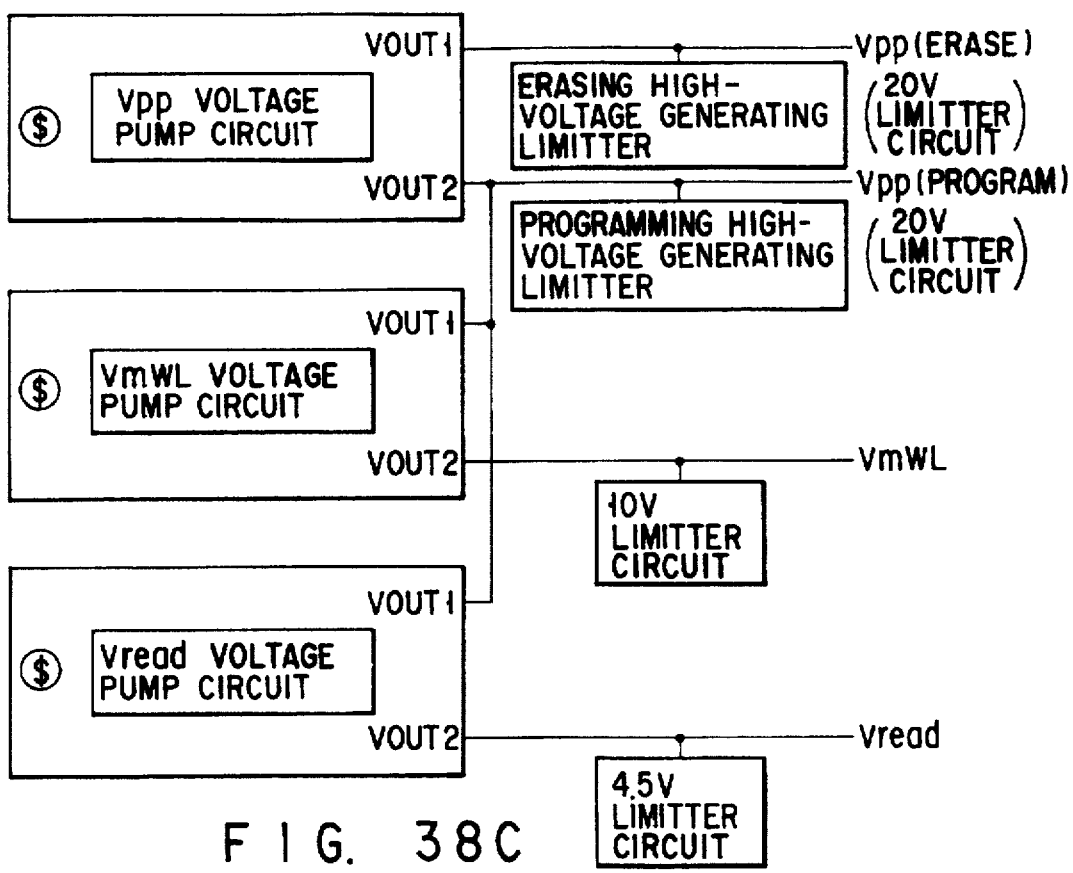
Figure 38D:
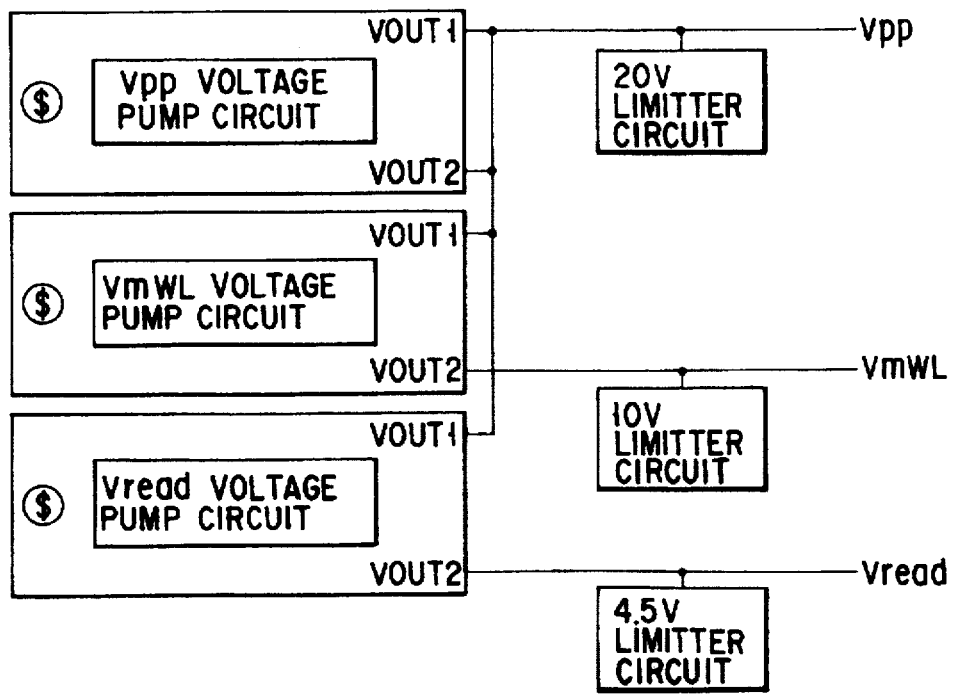
Figure 39D:
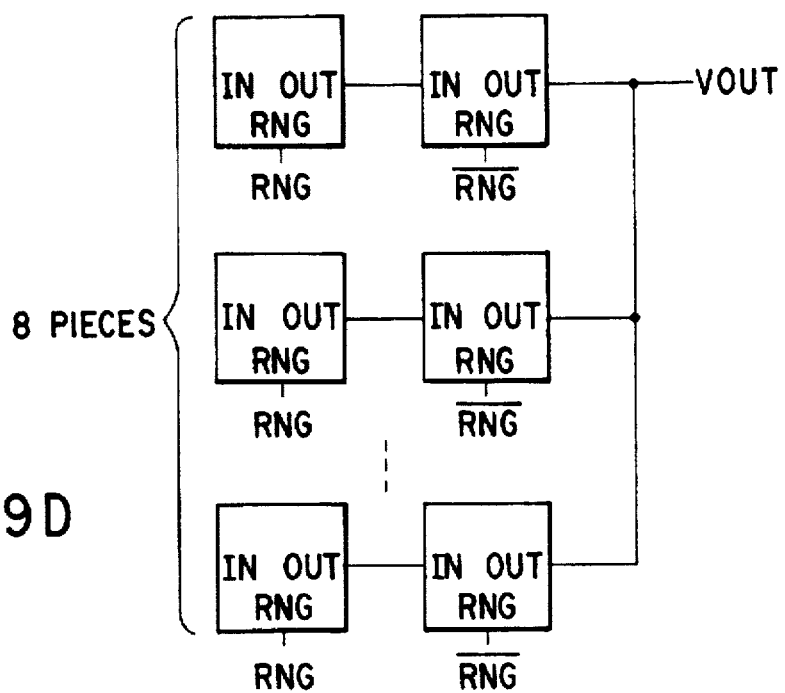
Figure 39E:
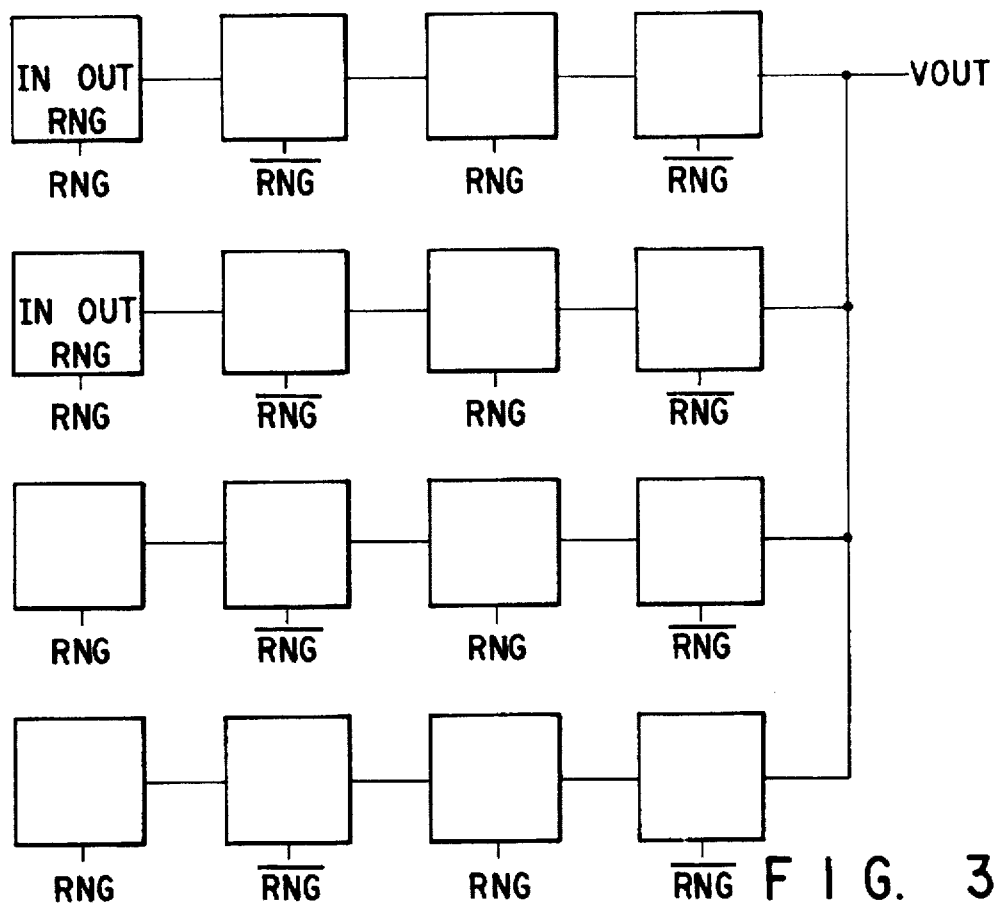
Figure 39F:
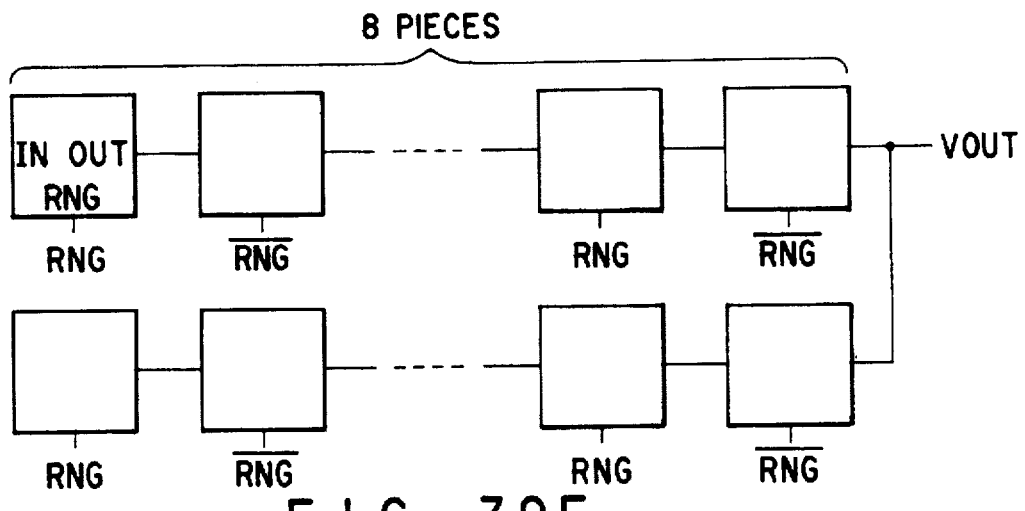
Figure 39G:
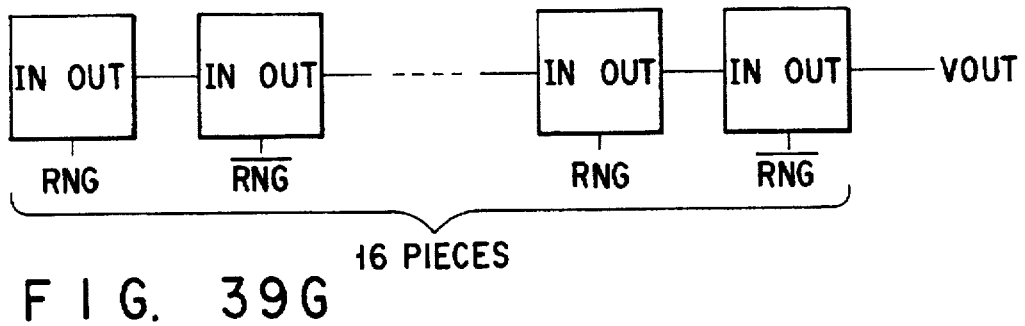

The connection equivalent to that of the pump circuit of FIGS. 28C or 28E can be realized by using a pump circuit having two output nodes as described above. Note that FIGS. 38A and 38B apply to FIG. 28C, whereas FIGS. 38C and 38D apply to FIG. 28E. In the circuit of FIGS. 38A or 38C, different out nodes are used for the data programming high voltage and the data erasing high voltage so that a data programming limiter circuit and a data erasing limiter circuit are provided there. So far, both the data programming high voltage and the data erasing high voltage are described to be equal to 20V but they may be different in actual applications. If they are different, the arrangement of a data programming limiter circuit and a data erasing limiter circuit as shown in FIGS. 38A or 38C becomes necessary. Generally speaking, since the pattern area of a pump circuit is far greater than that of a limiter circuit, the provision of an additional limiter circuit would not give rise to any problem for the total pattern area. The use of a single high voltage limiter circuit (20V limiter circuit) can accommodate two output nodes by shortcircuiting the output nodes of VOUT1 and VOUT2 of a Vpp pump circuit as shown in FIGS. 38B and 38D.

A circuit that shows a variable number of stages and different output voltages of the pump circuit it comprises depending on the selection of output node (VOUT1 or VOUT2) has the following features. One is that the easiness with which the limiter circuits can be controlled. For the use of a circuit shown in FIGS. 12, 16 or 28, the 10V, 8V and 4.5V limiter circuits have to be inactivated for the generation and output of a data erasing high voltage because the output node is selected simultaneously with the generation of 10V, 8V and 4.5V. However, with the circuit of any of FIGS. 37A to 37C and 38A through 38D, unwanted limiter circuits do not have to be inactivated because different voltages are produced from different output nodes and the 10V and 4.5V limiter circuits are not connected to the node for the data erasing high voltage and, therefore, the logic of the circuit can be significantly simplified. Additionally, since two different limiter circuits have to be provided for the data programming limiter circuit and the data erasing limiter circuit if the data programming high voltage has a level different from that of the data erasing high voltage, these two limiter circuits have to be controlled for ON/OFF operations if the circuit of FIGS. 16 or 28 is used. However, if the circuit of any of FIGS. 37A to 37C and 38A through 38D are used, these two limiter circuits do not have to be controlled for ON/OFF operations because different output nodes are provided for the data programming high voltage and the data erasing high voltage. Another feature is that, while the circuit of FIGS. 16 or 28 has only one output node and the voltage charging path has to be switched depending on the target of charging located beyond the output node in order to select the charging node of 10V, 4.5V or 20V, with the circuit of any of FIGS. 37A to 37B and 38A through 38D, the voltage charging path is already switched in the pump circuit because different output nodes are used depending on the voltage and no switching operation is necessary for switching the voltage charging path.

While the configuration and the connection of the pump circuits are not changed in a same operation mode but they changed in different modes of operation in the above description, such assumptions are not necessarily required for the purpose of the invention. For instance, the present invention can be effectively applied to situations where the number of stages of a pump circuit changes in a single mode of operation. The circuits shown in FIGS. 38A through 39G are adapted to such situations. The circuit of FIG. 39B can be used to change the number of stages of a pump circuit by using signals GENS1 through GENS15 and GENP1 through GENP15. The circuit of FIG. 39B has a configuration similar to that of the circuit of FIG. 29 but the minimal number of stages are 1 and 2 respectively. With the circuit of FIG. 39B, the number of stages of the pump circuit can be changed as follows during a voltage generation/charging cycle so that an optimal number of stages can be selected depending on the output voltage level: 1-stage 16-parallel (0V→5V)→2-stage 8-parallel (5V→9V)→4-stage 4-parallel (9V →13V) →8-stage 2-parallel (13V→17V)→16-stage 1-parallel (17V→20V). This system can be effectively combined with the present invention and the present invention can be applied to such combination if the connection of pump circuits changes depending on the mode of operation.

Figure 40:
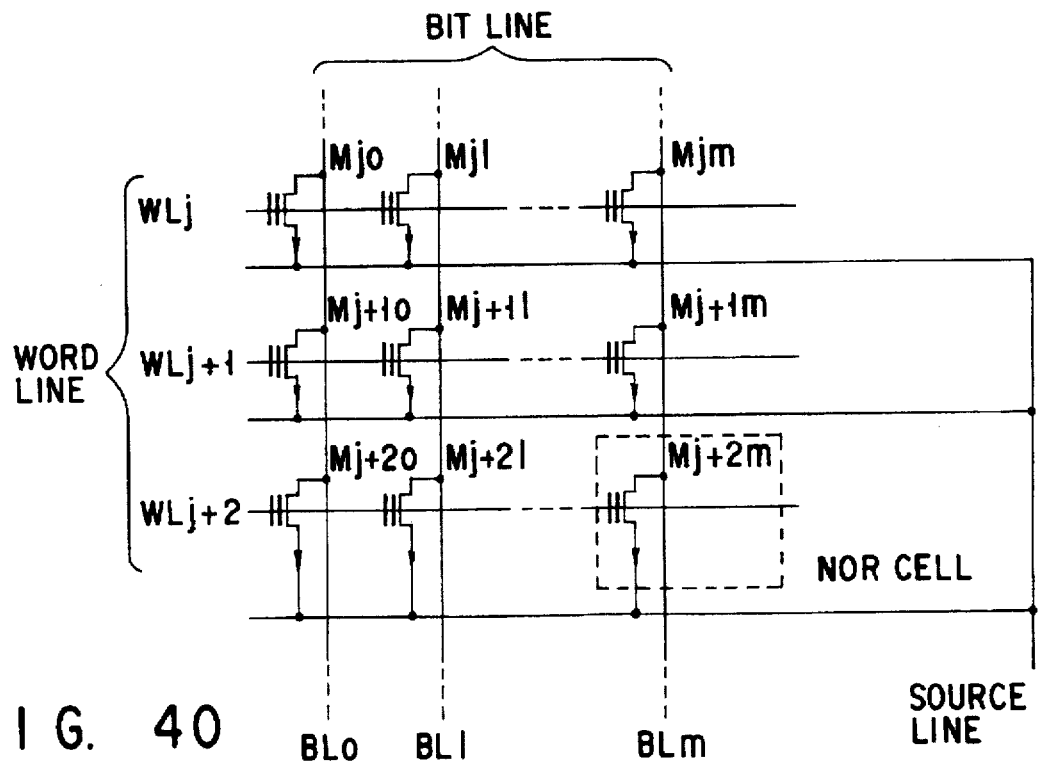
FIG. 40 is an equivalent circuit diagram of the memory cell array of a NOR cell type EEPROM.
Figure 41:
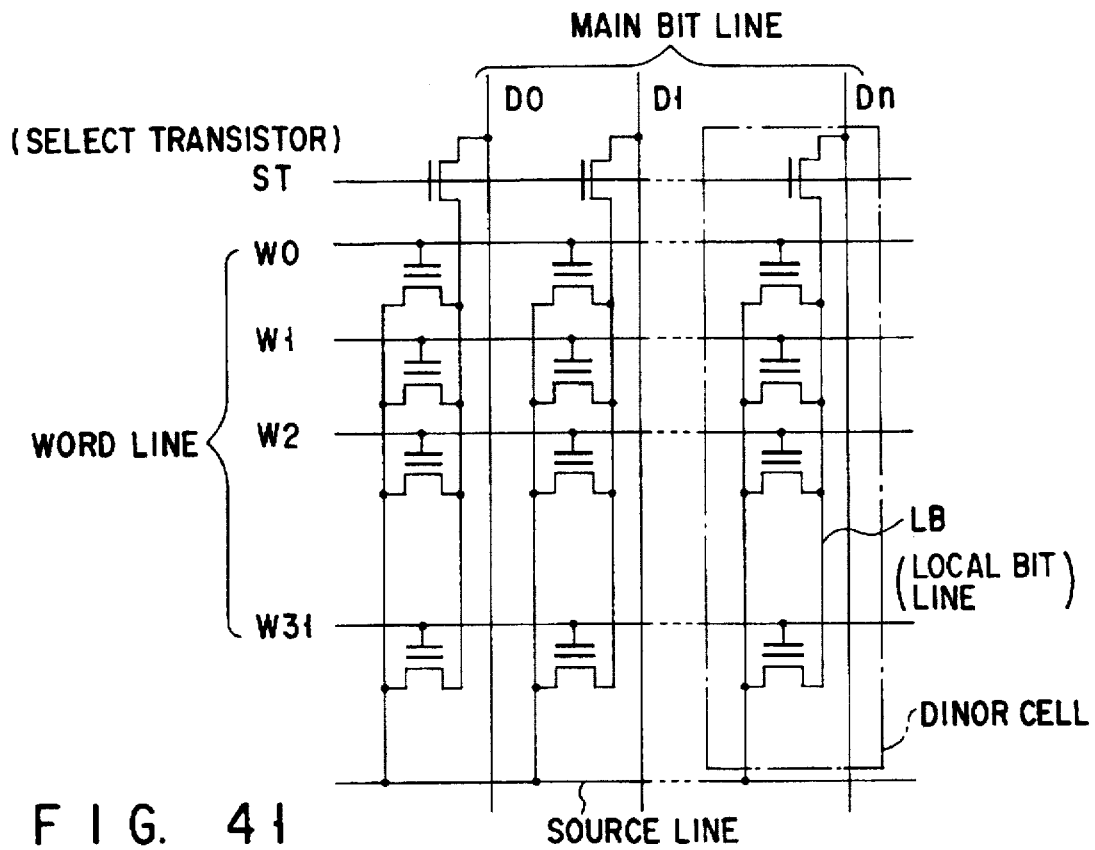
FIG. 41 is an equivalent circuit diagram of the memory cell array of a DINOR cell type EEPROM.
Figure 42:
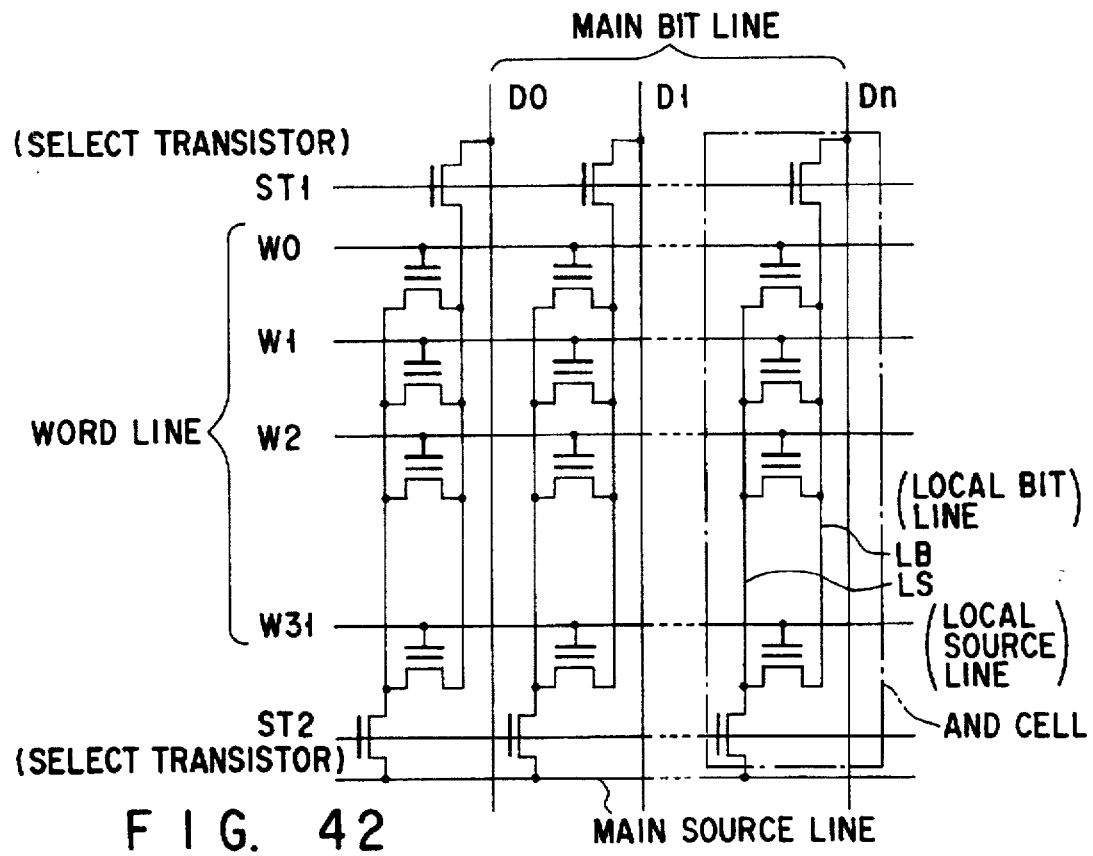
FIG. 42 is an equivalent circuit diagram of the memory cell array of a AND cell type EEPROM.

FIG. 40 is an equivalent circuit diagram of a memory cell array of a NOR cell type EEPROM. FIG. 41 is an equivalent circuit diagram of a memory cell array of a DINOR cell type EEPROM. DINOR cell type EEPROMs are described in detail, for example, in H. Honda et al. "IEDM Tech. Digest", 1992, pp. 599–602. FIG. 42 is an equivalent circuit diagram of a memory cell array of an AND cell type EEPROM. AND cell type EEPROMs are described in detail, for example, in H. Kume et al. "IEDM Tech. Digest", 1992, pp.991–993.

The above description is focused on a pump circuit having two output nodes. However, it should be noted that the present invention is suitably adapted to a pump circuit having three or more than three output nodes. While both the data programming high voltage and the data erasing high voltage mostly have identical 20V in the above description, the present invention is suitably adapted to circuits where the data programming high voltage and the data erasing high voltage are different from each other, 19V and 22V for example. If such is the case, however, a technique of selecting different values for the limiting voltage of the 20V limiter circuit in the data programming operation and in the data erasing operation will be necessary. (The 20V limiter circuit may have to be replaced by a data programming high voltage limiter circuit and a data erasing high voltage limiter circuit.)

While the present invention is described in terms of the use of a data reading high voltage generating circuit and/or a data reading intermediate voltage generating circuit in order to enhance the current supply capacity for a data erasing high voltage, the present invention is not limited thereto. For example, the data reading high voltage generating circuit may be effectively connected to the data programming high voltage generating circuit for the data programming operation in order to increase the charging rate for the data programming high voltage. A reading high voltage generating circuit may also effectively connected to a programming intermediate voltage generating circuit during the programming operation to be faster the charging speed of the programming intermediate voltage. Similarly, if a data programming high voltage generating circuit and a data erasing high voltage generating circuit are provided separately, these two high voltage generating circuits may be effectively connected for the data erasing operation. Still similarly, the data erasing high voltage generating circuit and the data programming intermediate voltage generating circuit may be effectively connected for the data programming operation in order to increase the charging rate for the data programming intermediate voltage. A still another generating circuit may be connected for the data reading operation in order to increase the charging rate for the data reading high voltage. Thus, various modifications are possible in the connection of circuits for the purpose of the invention.

The above described embodiments may be, changed, altered or modified without departing the spirit and the scope of the invention.

While the NAND type EEPROM is mainly described in the above description, the present invention may be applicable to any devices comprising a plurality of pump circuits for different operations. For instance, the present invention is applicable to nonvolatile semiconductor memory devices such as NOR cell type EEPROMs, DINOR cell type EEPROMs and AND cell type EEPROMs as well as to volatile semiconductor memory devices such as DRAMs and SRAMs.

The present invention is also subject to various other modification.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a semiconductor substrate;

a memory cell array having a plurality of memory cells formed on one of said semiconductor substrate and a first conductive well formed on said semiconductor substrate;

a plurality of voltage generating circuits for applying voltages to said plurality of memory cells, said voltages being higher than a power supply voltage and different from each other; and a switching circuit for connecting each of output nodes of said plurality of voltage generating circuits to said plurality of memory cells.

2. A semiconductor memory device according to claim 1, wherein each of said plurality of voltage generating circuits has a pump circuit and a voltage limiter circuit and the operation of all the voltage limiter circuits is stopped except a single voltage limiter circuit when the nodes are connected by said switching circuit.

3. A semiconductor memory device according to claim 2, wherein said pump circuit has a plurality of capacitors connected to the plurality of nodes connected in series and in a plurality of stages.

4. A semiconductor memory device according to claim 3, wherein said pump circuit changes the number of stages depending on the operation.

5. A semiconductor memory device according to claim 1, wherein each of said plurality of voltage generating circuit has a pump circuit and a voltage limiter circuit, and said pump circuit has a plurality of capacitors connected to the plurality of nodes connected in series and in a plurality of stages.

6. A semiconductor memory device according to claim 5, wherein said pump circuit changes the number of stages depending on the operation.

7. A semiconductor memory device according to claim 1, wherein said output nodes individually output different voltages in a case of a first operation which said plurality of output nodes are unconnected and output the same voltage in a case of a second operation which said plurality of output nodes are connected.

8. A semiconductor memory device according to claim 7, wherein each of said plurality of voltage generating circuits has a pump circuit and a voltage limiter circuit and the operation of all the voltage limiter circuits is stopped except a single voltage limiter circuit when the nodes are connected by said switching circuit.

9. A semiconductor memory device according to claim 8, wherein said pump circuit has a plurality of capacitors connected to the plurality of nodes connected in series and in a plurality of stages.

10. A semiconductor memory device according to claim 9, wherein said pump circuit changes the number of stages depending on the operation.

11. A semiconductor memory device according to claim 7, wherein said first voltage generating circuit comprises a first pump circuit and a first voltage limiter circuit, said second voltage generating circuit comprises a second pump circuit and a second voltage limiter circuit, and the operation of at least one of the first and second voltage limiter circuits is suspended when the first and second voltage generating circuits are connected in series by said exchange circuit.

12. A semiconductor memory device according to claim 7, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, operations of first and second voltage limiter circuits are suspended, first and second voltage generating circuits are connected in series by said exchange circuit, and the output nodes of the series circuit and third voltage generating circuit are connected.

13. A semiconductor memory device according to claim 7, wherein said second operation is an operation of data erase operation.

14. A semiconductor memory device comprising:

a memory cell array of a plurality of memory cells formed and arranged on a semiconductor substrate;

a first voltage generating circuit for applying a first voltage $V_1$ higher than the power supply voltage to said memory cells;

a second voltage generating circuit for applying a second voltage $V_2$ higher than the power supply voltage to said memory cells;

a third voltage generating circuit for applying a third voltage $V_3$ higher than the power supply voltage to said memory cells; and a exchange circuit for connecting said first and second voltage generating circuits in series and the output of said series circuit to the output node of said third voltage generating circuit.

15. A semiconductor memory device according to claim 14, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, and the operation of at least one of the first and second voltage limiter circuits is suspended when the first and second voltage generating circuits are connected in series by said exchange circuit.

16. A semiconductor memory device according to claim 14, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, the operation of at least one of the first and second voltage limiter circuits is suspended when the first and second voltage generating circuits are connected in series by said exchange circuit, and operations of first and second voltage limiter circuits are suspended.

17. A semiconductor memory device according to claim 16, wherein each of said plurality of voltage generating circuits has a pump circuit and a voltage limiter circuit and the operation of all the voltage limiter circuits is stopped except a single voltage limiter circuit when the nodes are connected by said switching circuit.

18. A semiconductor memory device according to claim 17, wherein said pump circuit has a plurality of capacitors connected to the plurality of nodes connected in series and in a plurality of stages.

19. A semiconductor memory device according to claim 18, wherein said pump circuit changes the number of stages depending on the operation.

20. A semiconductor memory device according to claim 14, wherein said output nodes individually output different voltages in a case of a first operation which said plurality of output nodes are unconnected and output the same voltage in a case of a second operation which said plurality of output nodes are connected.

21. A semiconductor memory device according to claim 20, wherein each of said plurality of voltage generating circuits has a pump circuit and a voltage limiter circuit and the operation of all the voltage limiter circuits is stopped except a single voltage limiter circuit when the nodes are connected by said switching circuit.

22. A semiconductor memory device according to claim 21, wherein said pump circuit has a plurality of capacitors connected to the plurality of nodes connected in series and in a plurality of stages.

23. A semiconductor memory device according to claim 22, wherein said pump circuit changes the number of stages depending on the operation.

24. A semiconductor memory device according to claim 20, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, and the operation of at least one of the first and second voltage limiter circuits is suspended when the first and second voltage generating circuits are connected in series by said exchange circuit.

25. A semiconductor memory device according to claim 20, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, the operation of at least one of the first and second voltage limiter circuits is suspended when the first and second voltage generating circuits are connected in series by said exchange circuit, and operations of first and second voltage limiter circuits are suspended.

26. A semiconductor memory device according to claim 20, wherein said second operation is an operation of data erase operation.

27. A semiconductor memory device according to claim 1, wherein in a case of one of connecting and unconnecting said output nodes of said plurality of voltage generating circuit, at least one of said plurality of voltage generating circuit changes in structure.

28. A semiconductor memory device according to claim 27, wherein each of said plurality of voltage generating circuits has a pump circuit and a voltage limiter circuit and the operation of all the voltage limiter circuits is stopped except a single voltage limiter circuit when the nodes are connected by said switching circuit.

29. A semiconductor memory device according to claim 28, wherein said pump circuit has a plurality of capacitors connected to the plurality of nodes connected in series and in a plurality of stages.

30. A semiconductor memory device according to claim 29, wherein said pump circuit changes the number of stages depending on the operation.

31. A semiconductor memory device according to claim 27, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, and the operation of at least one of the first and second voltage limiter circuits is suspended when the first and second voltage generating circuits are connected in series by said exchange circuit.

32. A semiconductor memory device according to claim 27, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, the operation of at least one of the first and second voltage limiter circuits is suspended when the first and second voltage generating circuits are connected in series by said exchange circuit, and operations of first and second voltage limiter circuits are suspended.

33. A semiconductor memory device according to claim 27, wherein said output nodes individually output different voltages in a case of a first operation which said plurality of output nodes are unconnected and output the same voltage in a case of a second operation which said plurality of output nodes are connected.

34. A semiconductor memory device according to claim 32, wherein said output nodes individually output different voltages in a case of a first operation which said plurality of output nodes are unconnected and output the same voltage in a case of a second operation which said plurality of output nodes are connected.

35. A semiconductor memory device according to claim 33, wherein said second operation is an operation of data erase operation.

36. A semiconductor memory device according to claim 27, wherein said change of circuit structure is an change of the number of stages.

37. A semiconductor memory device comprising:

a memory cell array in which a plurality of memory cells are arranged on a semiconductor substrate; and a pump circuit having first and second output nodes for providing a predetermined voltage to said plurality of memory cells, wherein said pump circuit has at least first and second voltage generating circuits, each having first and second output terminals, the second output terminals of said first and second voltage generating circuits are connected respectively to said second output nodes, the first output terminal of said first voltage generating circuit is connected to said first output node, and the first output terminal of said second voltage generating circuit is connected to the input terminal of said first voltage generating circuit.

38. A semiconductor memory device according to claim 37, wherein said pump circuit has a plurality of voltage generating circuits, each having first and second output terminals, the second output terminals of said plurality of voltage generating circuits being connected respectively to said second output nodes, the first output terminals of said plurality of voltage generating circuits being connected respectively to the input terminals of the voltage generating circuits of the next stage, and the output terminals of the final stage of said plurality of voltage generating circuits being connected respectively first output nodes.

39. A semiconductor memory device according to claim 37, wherein said pump circuit further has third output node, and has a plurality of voltage generating circuits, each having first, second and third output terminals, the third output terminals of said plurality of voltage generating circuits is connected respectively to said third output nodes, the second output terminals of said plurality of voltage generating circuits is connected respectively to one of said second output nodes and the input terminals of the voltage generating circuit of the next stage, the first output terminals of said plurality of voltage generating circuits being connected respectively to the input terminals of the voltage generating circuits of the next stage, and the first output terminals of the final stage of said plurality of voltage generating circuits being connected respectively first output nodes.

40. A semiconductor memory device according to claim 37, wherein each of said plurality of voltage generating circuits has a pump circuit and a voltage limiter circuit and the operation of all the voltage limiter circuits is stopped except a single voltage limiter circuit.

41. A semiconductor memory device according to claim 40, wherein said pump circuit has a plurality of capacitors connected to the plurality of nodes connected in series and in a plurality of stages.

42. A semiconductor memory device according to claim 41, wherein said pump circuit changes the number of stages depending on the operation.

43. A semiconductor memory device comprising:

a memory cell array in which a plurality of memory cells are arranged in matrix on a semiconductor substrate; and a pump circuit having a plurality of output nodes and outputs a predetermined voltage to said plurality of memory cells, wherein said pump circuit has a different structure when a different node among said plurality of output nodes outputs a voltage.

44. A semiconductor memory device according to claim 43, wherein each of said plurality of voltage generating circuits has a pump circuit and a voltage limiter circuit and the operation of all the voltage limiter circuits is stopped except a single voltage limiter circuit.

45. A semiconductor memory device according to claim 44, wherein said pump circuit has a plurality of capacitors connected to the plurality of nodes connected in series and in a plurality of stages.

46. A semiconductor memory device according to claim 45, wherein said pump circuit changes the number of stages depending on the operation.

47. A semiconductor memory device comprising:

a memory cell array in which a plurality of memory cells are arranged in matrix on a semiconductor substrate; and a pump circuit having a plurality of output nodes and outputs a predetermined voltage to said plurality of memory cells, wherein said pump circuit has a different number of stages when a different node among said plurality of output nodes outputs a voltage.

48. A semiconductor memory device according to claim 47, wherein each of said plurality of voltage generating circuits has a pump circuit and a voltage limiter circuit and the operation of all the voltage limiter circuits is stopped except a single voltage limiter circuit when the nodes are connected by said switching circuit.

49. A semiconductor memory device according to claim 48, wherein said pump circuit has a plurality of capacitors connected to the plurality of nodes connected in series and in a plurality of stages.

50. A semiconductor memory device according to claim 49, wherein said pump circuit changes the number of stages depending on the operation.

51. A semiconductor memory device according to claim 14, wherein in a case of one of connecting and unconnecting output nodes of series-connceted circuit to output nodes of said third voltage generating circuit, at least one of said first, second and third voltage generating circuit changes in structure.

52. A semiconductor memory device according to claim 51, wherein each of said plurality of voltage generating circuits has a pump circuit and a voltage limiter circuit and the operation of all the voltage limiter circuits is stopped except a single voltage limiter circuit when the nodes are connected by said exchange circuit.

53. A semiconductor memory device according to claim 52, wherein said pump circuit has a plurality of capacitors connected to the plurality of nodes connected in series and in a plurality of stages.

54. A semiconductor memory device according to claim 53, wherein said pump circuit changes the number of stages depending on the operation.

55. A semiconductor memory device according to claim 51, wherein said first voltage generating circuit comprises a first pump circuit and a first voltage limiter circuit, said second voltage generating circuit comprises a second pump circuit and a second voltage limiter circuit, said third voltage generating circuit comprises a third pump circuit and a third voltage limiter circuit, and the operation of at least one of the first and second voltage limiter circuits is suspended when the first and second voltage generating circuits are connected in series by said exchange circuit.

56. A semiconductor memory device according to claim 51, wherein
said first voltage generating circuit comprises a first pump circuit and a first voltage limiter circuit,
said second voltage generating circuit comprises a second pump circuit and a second voltage limiter circuit,
said third voltage generating circuit comprises a third pump circuit and a third voltage limiter circuit,
the operation of at least one of the first and second voltage limiter circuits is suspended when the first and second voltage generating circuits are connected in series by said exchange circuit, and
operations of first and second voltage limiter circuits are suspended.

57. A semiconductor memory device according to claim 51, wherein said output nodes individually output different voltages in a case of a first operation which said plurality of output nodes are unconnected and output the same voltage in a case of a second operation which said plurality of output nodes are connected.

58. A semiconductor memory device according to claim 56, wherein said output nodes individually output different voltages in a case of a first operation which said plurality of output nodes are unconnected and output the same voltage in a case of a second operation which said plurality of output nodes are connected.

59. A semiconductor memory device according to claim 57, wherein said second operation is an operation of data erase operation.

60. A semiconductor memory device according to claim 51, wherein said change of circuit structure is an change of the number of stages.

61. A semiconductor memory device according to claim 51, wherein at least one of said first and second voltage generating circuit changes in structure.

62. A semiconductor memory device according to claim 61, wherein each of said plurality of voltage generating circuits has a pump circuit and a voltage limiter circuit and the operation of all the voltage limiter circuits is stopped except a single voltage limiter circuit when the nodes are connected by said exchange circuit.

63. A semiconductor memory device according to claim 62, wherein said pump circuit has a plurality of capacitors connected to the plurality of nodes connected in series and in a plurality of stages.

64. A semiconductor memory device according to claim 63, wherein said pump circuit changes the number of stages depending on the operation.

65. A semiconductor memory device according to claim 61, wherein
said first voltage generating circuit comprises a first pump circuit and a first voltage limiter circuit,
said second voltage generating circuit comprises a second pump circuit and a second voltage limiter circuit,
said third voltage generating circuit comprises a third pump circuit and a third voltage limiter circuit, and
the operation of at least one of the first and second voltage limiter circuits is suspended when the first and second voltage generating circuits are connected in series by said exchange circuit.

66. A semiconductor memory device according to claim 61, wherein
said first voltage generating circuit comprises a first pump circuit and a first voltage limiter circuit,
said second voltage generating circuit comprises a second pump circuit and a second voltage limiter circuit,
said third voltage generating circuit comprises a third pump circuit and a third voltage limiter circuit,
the operation of at least one of the first and second voltage limiter circuits is suspended when the first and second voltage generating circuits are connected in series by said exchange circuit, and
operations of first and second voltage limiter circuits are suspended.

67. A semiconductor memory device according to claim 61, wherein said output nodes individually output different voltages in a case of a first operation which said plurality of output nodes are unconnected and output the same voltage in a case of a second operation which said plurality of output nodes are connected.

68. A semiconductor memory device according to claim 61, wherein said output nodes individually output different voltages in a case of a first operation which said plurality of output nodes are unconnected and output the same voltage in a case of a second operation which said plurality of output nodes are connected.

69. A semiconductor memory device according to claim 61, wherein said second operation is an operation of data erase operation.

70. A semiconductor memory device according to claim 61, wherein said change of circuit structure is an change of the number of stages.

* * * * *